(12) United States Patent
Yamazaki

(10) Patent No.: US 11,075,075 B2
(45) Date of Patent: Jul. 27, 2021

(54) SEMICONDUCTOR DEVICE INCLUDING METAL OXIDE WITH MULTIPLE REGIONS

(71) Applicant: SEMICONDUCTOR ENERGY LABORATORY CO., LTD., Atsugi (JP)

(72) Inventor: Shunpei Yamazaki, Tokyo (JP)

(73) Assignee: Semiconductor Energy Laboratory Co., Ltd., Atsugi (JP)

( * ) Notice: Subject to any disclaimer, the term of this patent is extended or adjusted under 35 U.S.C. 154(b) by 0 days.

(21) Appl. No.: 16/348,290

(22) PCT Filed: Nov. 21, 2017

(86) PCT No.: PCT/IB2017/057268
§ 371 (c)(1),
(2) Date: May 8, 2019

(87) PCT Pub. No.: WO2018/100465
PCT Pub. Date: Jun. 7, 2018

(65) Prior Publication Data
US 2019/0318924 A1   Oct. 17, 2019

(30) Foreign Application Priority Data
Dec. 2, 2016  (JP) .............................. JP2016-234804

(51) Int. Cl.
*H01L 21/02* (2006.01)
*G02F 1/1362* (2006.01)
(Continued)

(52) U.S. Cl.
CPC .. *H01L 21/02172* (2013.01); *G02F 1/136277* (2013.01); *H01L 21/0214* (2013.01);
(Continued)

(58) Field of Classification Search
CPC ..................................... H01L 29/41725–41791
See application file for complete search history.

(56) References Cited

U.S. PATENT DOCUMENTS 8,319,218 B2   11/2012   Yamazaki et al.
8,860,108 B2   10/2014   Yamazaki et al.
(Continued)

FOREIGN PATENT DOCUMENTS

CN   102484139 A   5/2012
CN   102498553 A   6/2012
(Continued)

OTHER PUBLICATIONS

Wager.J, "Oxide TFTs: A Progress Report", Information Display, 2016, vol. 32, No. 1, pp. 16-21.
(Continued)

*Primary Examiner* — Allen L Parker
*Assistant Examiner* — Wasiul Haider
(74) *Attorney, Agent, or Firm* — Fish & Richardson P.C.

(57) ABSTRACT

Favorable electrical characteristics are provided to a semiconductor device, or a semiconductor device with high reliability is provided.
A semiconductor device including a bottom-gate transistor with a metal oxide in a semiconductor layer includes a source region, a drain region, a first region, a second region, and a third region. The first region, the second region, and the third region are each sandwiched between the source region and the drain region along the channel length direction. The second region is sandwiched between the first region and the third region along the channel width direction, the first region and the third region each include the end portion of the metal oxide, and the length of the second region along the channel length direction is shorter than the
(Continued)

length of the first region or the length of the third region along the channel length direction.

8 Claims, 24 Drawing Sheets

(51) Int. Cl.
  *H01L 21/8234* (2006.01)
  *H01L 27/15* (2006.01)
  *H01L 27/32* (2006.01)

(52) U.S. Cl.
  CPC .... *H01L 21/823412* (2013.01); *H01L 27/156* (2013.01); *H01L 27/3241* (2013.01)

(56) References Cited

U.S. PATENT DOCUMENTS

| | | | |
|---|---|---|---|
| 9,142,679 B2 | 9/2015 | Yamazaki et al. | |
| 9,306,072 B2 | 4/2016 | Yamazaki et al. | |
| 9,472,656 B2 | 10/2016 | Yamazaki et al. | |
| 9,935,202 B2 | 4/2018 | Yamazaki et al. | |
| 2007/0072439 A1 | 3/2007 | Akimoto et al. | |
| 2010/0244020 A1* | 9/2010 | Sakata | H01L 29/78618 257/43 |
| 2010/0283054 A1* | 11/2010 | Hirano | H01L 29/78603 257/57 |
| 2011/0062436 A1 | 3/2011 | Yamazaki et al. | |
| 2011/0084264 A1 | 4/2011 | Yamazaki et al. | |
| 2013/0140554 A1 | 6/2013 | Yamazaki et al. | |
| 2015/0079729 A1* | 3/2015 | Yamazaki | H01L 21/0262 438/104 |
| 2017/0236844 A1 | 8/2017 | Yamazaki et al. | |
| 2018/0114855 A1 | 4/2018 | Yamazaki | |
| 2018/0226510 A1 | 8/2018 | Yamazaki et al. | |

FOREIGN PATENT DOCUMENTS

| | | | |
|---|---|---|---|
| EP | 2544237 A | 1/2013 | |
| EP | 3217435 A | 9/2017 | |
| EP | 3249698 A | 11/2017 | |
| JP | 2011-086923 A | 4/2011 | |
| JP | 2011-100979 A | 5/2011 | |
| JP | 2011-119674 A | 6/2011 | |
| JP | 5118810 | 1/2013 | |
| JP | 2013-153140 A | 8/2013 | |
| JP | 2016-201543 A | 12/2016 | |
| JP | 6188977 | 8/2017 | |
| KR | 2012-0056870 A | 6/2012 | |
| KR | 2012-0090982 A | 8/2012 | |
| KR | 2014-0101817 A | 8/2014 | |
| SG | 178056 | 3/2012 | |
| TW | 201131776 | 9/2011 | |
| TW | 201207997 | 2/2012 | |
| TW | 201330273 | 7/2013 | |
| WO | WO-2011/033936 | 3/2011 | |
| WO | WO-2011/043176 | 4/2011 | |
| WO | WO-2013/080900 | 6/2013 | |
| WO | WO-2017/137869 | 8/2017 | |
| WO | WO-2018/073656 | 4/2018 | |

OTHER PUBLICATIONS

International Search Report (Application No. PCT/IB2017/057268) dated Feb. 20, 2018.
Written Opinion (Application No. PCT/IB2017/057268) dated Feb. 20, 2018.

* cited by examiner

FIG. 20A1
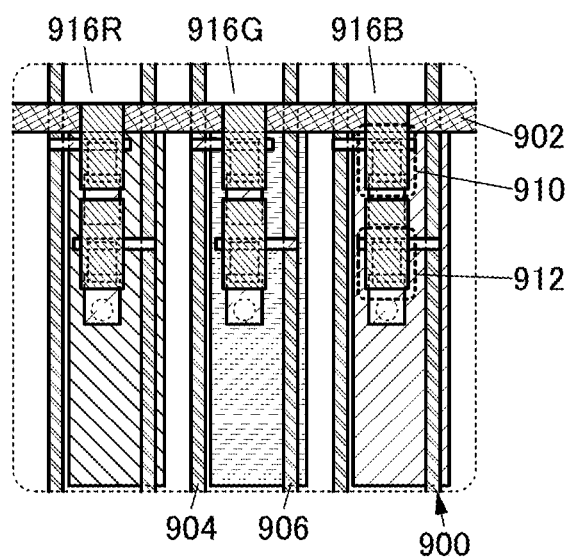
FIG. 20A2
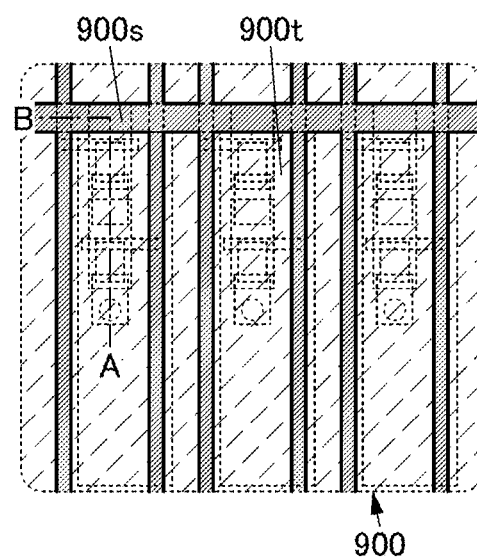
FIG. 20B
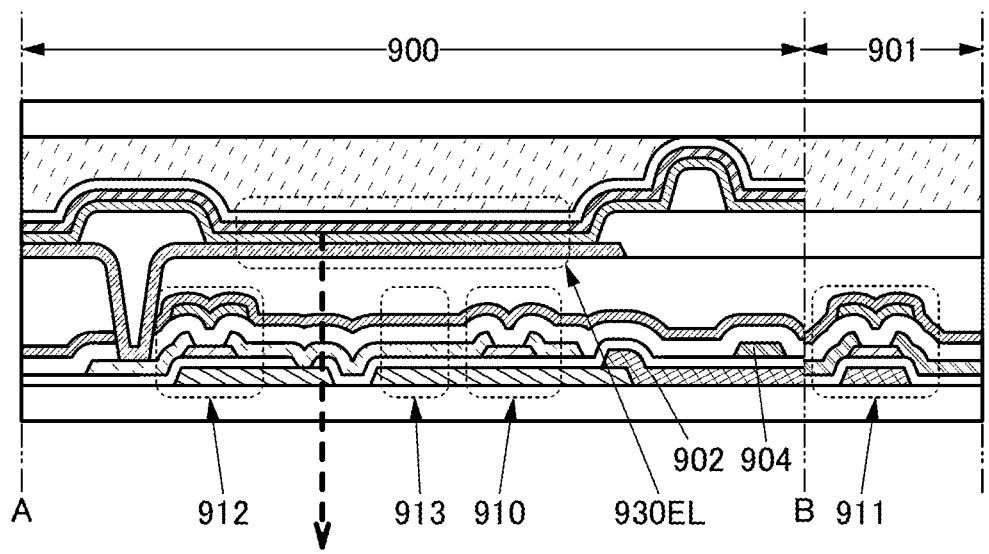

FIG. 21A1
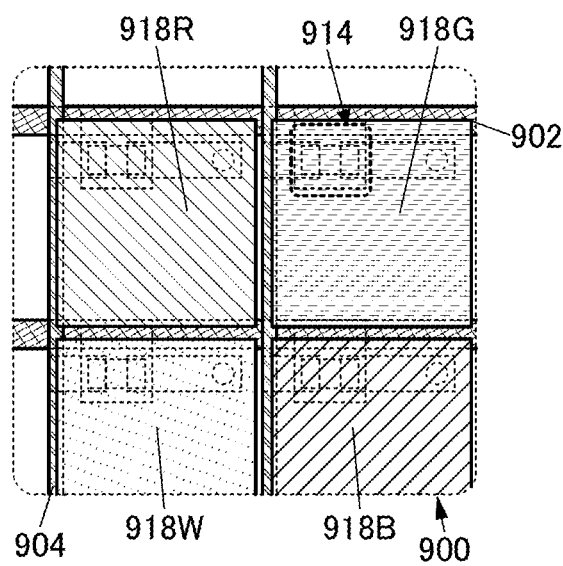
FIG. 21A2
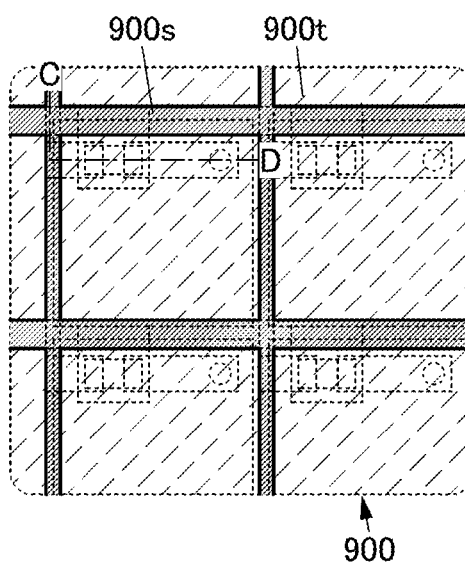
FIG. 21B
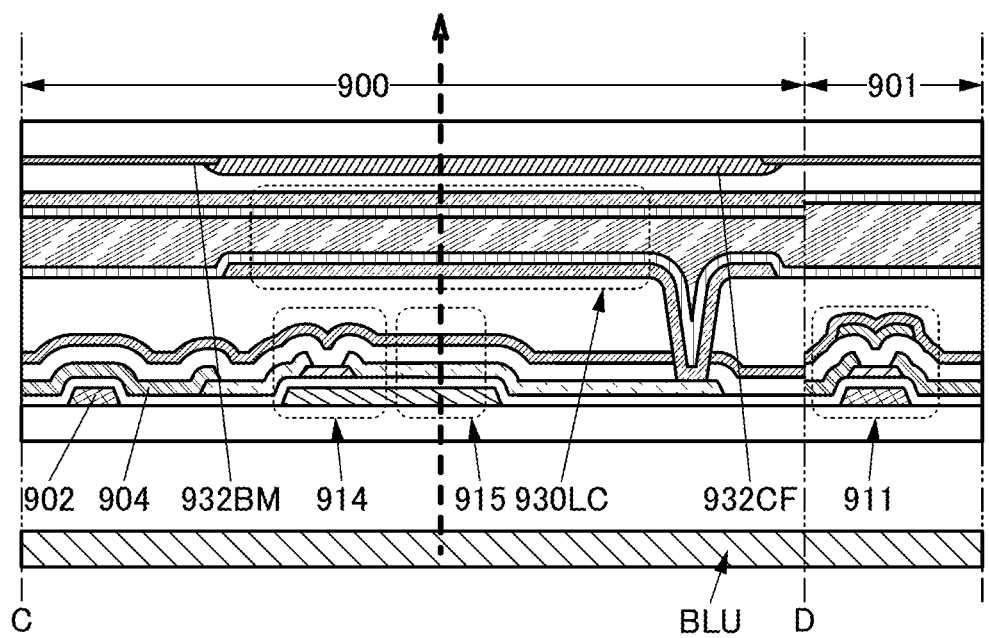

SEMICONDUCTOR DEVICE INCLUDING METAL OXIDE WITH MULTIPLE REGIONS

CROSS REFERENCE TO RELATED APPLICATIONS

This application is a U.S. National Phase Application under 35 U.S.C. § 371 of International Application PCT/IB2017/057268, filed on Nov. 21, 2017, which claims the benefit of a foreign priority application filed in Japan as Application No. 2016-234804 on Dec. 2, 2016, both of which are incorporated by reference.

TECHNICAL FIELD

One embodiment of the present invention relates to a semiconductor device containing a metal oxide.

Note that one embodiment of the present invention is not limited to the above technical field. The technical field of one embodiment of the invention disclosed in this specification and the like relates to an object, a method, or a manufacturing method. Alternatively, one embodiment of the present invention relates to a process, a machine, manufacture, or a composition of matter. In particular, one embodiment of the present invention relates to a semiconductor device, a display device, a light-emitting device, a power storage device, a memory device, a driving method thereof, or a manufacturing method thereof.

Note that in this specification and the like, a semiconductor device generally means a device that can function by utilizing semiconductor characteristics. A semiconductor element such as a transistor, a semiconductor circuit, an arithmetic device, and a memory device are each an embodiment of a semiconductor device. An imaging device, a display device, a liquid crystal display device, a light-emitting device, an electro-optical device, a power generation device (including a thin film solar cell, an organic thin film solar cell, and the like), and an electronic device may each include a semiconductor device.

BACKGROUND ART

As a semiconductor material that can be used in a transistor, an oxide has been attracting attention. For example, Patent Document 1 discloses a field-effect transistor containing an amorphous oxide which is any of an In—Zn—Ga—O-based oxide, an In—Zn—Ga—Mg—O-based oxide, an In—Zn—O-based oxide, an In—Sn—O-based oxide, an In—O-based oxide, an In—Ga—O-based oxide, and a Sn—In—Zn—O-based oxide.

In addition, a structure containing a metal oxide with two stacked layers of an In—Zn—O-based oxide and an In—Ga—Zn—O-based oxide as an active layer of a transistor is discussed in Non-Patent Document 1.

Furthermore, in recent years, a technique for manufacturing an integrated circuit for a memory device using a transistor containing a metal oxide has been disclosed (see Patent Document 2). Furthermore, not only memory devices but also arithmetic devices and the like are manufactured using transistors containing metal oxides.

PRIOR ART DOCUMENT

Patent Document

[Patent Document 1] Japanese Patent No. 5118810
[Patent Document 2] Japanese Published Patent Application No. 2011-119674

Non-Patent Document

[Non-Patent Document 1] John F. Wager, "Oxide TFTs: A Progress Report", Information Display 1/16, SID 2016, January/February 2016, Vol. 32, No. 1, p. 16-21

SUMMARY OF THE INVENTION

Problems to be Solved by the Invention

In the case where backplanes of an integrated circuit of a memory device, an arithmetic device, and a high-definition display device are manufactured using a transistor, it is important that the transistor has high field-effect mobility. Furthermore, a transistor with a minute structure is required to have intended favorable electrical characteristics. Furthermore, a metal oxide can be used as a semiconductor layer of a transistor.

Meanwhile, a metal oxide film is exposed to an oxidation atmosphere or a reducing atmosphere during the transistor manufacturing process. For example, the oxidation atmosphere is an atmosphere which easily causes diffusion of oxygen atoms into a metal oxide film.

Although the transistor characteristics are little influenced as long as the metal oxide film is exposed to the oxidation atmosphere, the resistance may be decreased (also referred to as becoming n-type) in the case where the metal oxide film is exposed to a reducing atmosphere. In the case where any portion of the metal oxide film becomes n-type, the n-type portion may function as a parasitic channel, causing an increase in variation in the transistor characteristics and change in the transistor characteristics in long-term use. In the case where a transistor has an n-type portion, the switching characteristics may change from normally-off to normally-on; thus, it should be highly noted. Particularly in a minute island-shaped metal oxide film, when a same size portion becomes n-type, the influence on the transistor characteristics is significant.

In view of the above problems, an object of one embodiment of the present invention is to provide a semiconductor device using a metal oxide, which has the transistor characteristics with little variation.

Another object is to provide a semiconductor device using a metal oxide with excellent normally-off switching characteristics.

Another object is to provide a semiconductor device using a metal oxide with high field-effect mobility.

Another object is to provide a semiconductor device which is formed using a minute island-shaped pattern formed from a metal oxide material.

Another object is to provide a method for manufacturing the semiconductor device according to any one of the above objects.

Another object of one embodiment of the present invention is to give favorable electrical characteristics to a semiconductor device. Another object of one embodiment of the present invention is to provide a highly reliable semiconductor device. Another object of one embodiment of the present invention is to provide a semiconductor device having a novel structure. Another object of one embodiment of the present invention is to provide a method for manufacturing a semiconductor device having a novel structure.

Note that the descriptions of these objects do not disturb the existence of other objects. In one embodiment of the present invention, there is no need to achieve all the objects. Objects other than these will be apparent from and can be derived from the descriptions of the specification, the drawings, the claims, and the like.

Means for Solving the Problems

In the case where a metal oxide film has an island-shaped pattern, an end portion is likely to have characteristics different from those of the center portion since an element may be diffused from the layer in contact with the end portion or the end portion may have an unstable bond. There is no problem if the end portion of the transistor is sufficiently exposed to an oxidation atmosphere in the transistor manufacturing process, but a portion extending for a predetermined distance from the end portion (end region) may become n-type and have a higher conductivity σ in the case where the end portion is exposed to a reducing atmosphere. Alternatively, a trap state that has an influence on the transistor characteristics might be formed in the vicinity of the end portion.

In particular, in the case where the metal oxide between a source electrode and a drain electrode has the end region, and the end region becomes n-type, the end region functions as a parasitic channel, which leads to an increase in variation in transistor characteristics and a change in transistor characteristics in long-term use. In the case where the above-predetermined distance is the same, the end region occupies larger area and the influence on transistor characteristics is significant especially in a minute island-shaped metal oxide.

Thus, in order to increase the resistance of the end portion, the distance between a source electrode and a drain electrode in the end region is set longer than that in a channel formation region. Thus, although the end region may become n-type, the resistance between a source electrode and a drain electrode in the end region is increased and the influence on the transistor characteristics can be decreased.

A semiconductor device of one embodiment of the present invention contains a metal oxide. The semiconductor device includes a gate electrode, a first insulating film over the gate electrode, the metal oxide over the first insulating film, a pair of electrodes over the metal oxide, and a second insulating film over the metal oxide. The metal oxide includes a source region, a drain region, a first region, a second region, and a third region. The source region is in contact with one of the pair of electrodes and the drain region is in contact with the other of the pair of electrodes; the first region, the second region, and the third region are each sandwiched between the source region and the drain region along a channel length direction. The second region is sandwiched between the first region and the third region along a channel width direction, the first region and the third region each include an end portion of the metal oxide, and the length of the second region along the channel length direction is shorter than the length of the first region or the length of the third region along the channel length direction.

In the above structure, the length of the second region along the channel length direction is greater than 0 μm and less than 4 μm, and the length of the first region or the length of the third region along the channel length direction is greater than three times the length of the second region along the channel length direction and less than the length of the metal oxide along the channel length direction.

In each of the above structures, the shortest path from the source region to the drain region is preferably included in the second region.

In each of the above structures, the metal oxide contains a first metal oxide and a second metal oxide in contact with a top surface of the first metal oxide, the first metal oxide and the second metal oxide each contain In, an element M (M is gallium, aluminum, silicon, boron, yttrium, tin, copper, vanadium, beryllium, titanium, iron, nickel, germanium, zirconium, molybdenum, lanthanum, cerium, neodymium, hafnium, tantalum, tungsten, or magnesium), and Zn, and it is preferable that the first metal oxide include a region having lower crystallinity than the second metal oxide.

In each of the above structures, it is preferable that the first metal oxide and the second metal oxide each include a region where an In content is greater than or equal to 40% and less than or equal to 50% of the total number of In, M, and Zn atoms, and a region where an M content is greater than or equal to 5% and less than or equal to 30% of the total number of In, M, and Zn atoms.

In each of the above structures, it is preferable that in each of the first metal oxide and the second metal oxide, the atomic ratio of M be greater than or equal to 1.5 and less than or equal to 2.5, and the atomic ratio of Zn be greater than or equal to 2 and less than or equal to 4 in the case where the atomic ratio of In is 4.

In each of the above structures, it is preferable that in each of the first metal oxide and the second metal oxide, the atomic ratio of M be greater than or equal to 0.5 and less than or equal to 1.5, and the atomic ratio of Zn be greater than or equal to 5 and less than or equal to 7 in the case where the atomic ratio of In is 5.

In each of the above structures, it is preferable that a peak at around 2θ=31° be not observed in the first metal oxide and a peak at around 2θ=31° be observed in the second metal oxide in the case where the metal oxide is measured by XRD analysis.

Effect of the Invention

According to one embodiment of the present invention, a semiconductor device can be provided with favorable electrical characteristics. Alternatively, according to one embodiment of the present invention, a highly reliable semiconductor device can be provided. Alternatively, according to one embodiment of the present invention, a semiconductor device having a novel structure can be provided. Alternatively, according to one embodiment of the present invention, a method for manufacturing a semiconductor device having a novel structure can be provided.

Note that the descriptions of these effects do not disturb the existence of other effects. One embodiment of the present invention does not necessarily achieve all the effects. Effects other than these will be apparent from and can be derived from the descriptions of the specification, the drawings, the claims, and the like.

BRIEF DESCRIPTION OF DRAWINGS

FIGS. 20A1, 20A2, and 20B are top views and a cross-sectional view illustrating an example of a pixel.

FIGS. 21A1, 21A2, and 21B are top views and a cross-sectional view illustrating an example of a pixel.

MODE FOR CARRYING OUT THE INVENTION

Figure 1A:
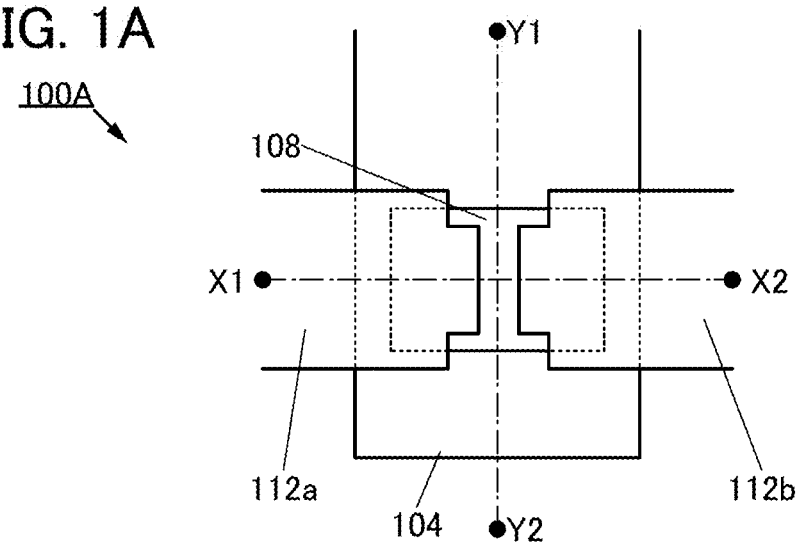
FIGS. 1A-1C are a top view and cross-sectional views illustrating a semiconductor device.

Hereinafter, embodiments will be described with reference to drawings. However, the embodiments can be implemented in many different modes, and it will be readily appreciated by those skilled in the art that modes and details thereof can be changed in various ways without departing from the spirit and scope. Thus, the present invention should not be interpreted as being limited to the following descriptions of the embodiments.

In the drawings, the size, the layer thickness, or the region is exaggerated for clarity in some cases. Therefore, the size, the layer thickness, or the region is not limited to the illustrated scale. Note that the drawings are schematic views showing ideal examples, and embodiments of the present invention are not limited to shapes or values shown in the drawings.

In this specification, ordinal numbers such as "first", "second", and "third" are used in order to avoid confusion among components, and the terms do not limit the components numerically.

In this specification, terms for describing arrangement, such as "over" and "under", are used for convenience in describing a positional relation between components with reference to drawings. Furthermore, the positional relation between components is changed as appropriate in accordance with a direction in which each component is described. Thus, the terms are not limited to those used in this specification, and descriptions can be changed appropriately depending on the situation.

In this specification and the like, a transistor is an element having at least three terminals of a gate, a drain, and a source. The transistor includes a channel formation region between the drain (a drain terminal, a drain region, or a drain electrode) and the source (a source terminal, a source region, or a source electrode), and current can flow between the source and the drain through the channel formation region. Note that in this specification and the like, a channel formation region refers to a region through which current mainly flows.

Functions of a source and a drain might be switched when transistors having different polarities are employed or a direction of current flow is changed in circuit operation. Therefore, the terms "source" and "drain" can be switched in this specification and the like.

In this specification and the like, "electrically connected" includes the case where components are connected through an "object having any electric function". An "object having any electric function" is not limited in particular as long as electric signals can be transmitted and received between the connected components. Examples of an "object having any electric function" include a switching element such as a transistor, a resistor, an inductor, a capacitor, and an element with a variety of functions as well as an electrode and a wiring.

In this specification and the like, "parallel" indicates that the angle formed between two straight lines is greater than or equal to −10° and less than or equal to 10°. Thus, the case where the angle is greater than or equal to −5° and less than or equal to 5° is also included. Moreover, "perpendicular" indicates that the angle formed between two straight lines is greater than or equal to 80° and less than or equal to 100°. Thus, the case where the angle is greater than or equal to 85° and less than or equal to 95° is also included.

Moreover, in this specification and the like, the terms "film" and "layer" can be interchanged with each other. For example, the term "conductive layer" can be changed into the term "conductive film" in some cases. For another example, the term "insulating film" can be changed into the term "insulating layer" in some cases.

Unless otherwise specified, off-state current in this specification and the like refers to drain current of a transistor in an off state (also referred to as a non-conducting state and a cutoff state). Unless otherwise specified, the off state of an n-channel transistor refers to a state where the voltage $V_{gs}$ between its gate and source is lower than the threshold voltage $V_{th}$, and the off state of a p-channel transistor refers to a state where the voltage $V_{gs}$ between its gate and source is higher than the threshold voltage $V_{th}$. For example, the off-state current of an n-channel transistor sometimes refers to drain current that flows when the voltage $V_{gs}$ between its gate and source is lower than the threshold voltage $V_{th}$.

The off-state current of a transistor depends on $V_{gs}$ in some cases. Thus, the off-state current of a transistor is lower than or equal to I may mean that there is $V_{gs}$ with which the off-state current of the transistor becomes lower than or equal to I. The off-state current of a transistor may mean the off-state current in an off state at predetermined $V_{gs}$, the off-state current in an off state at $V_{gs}$ in a predetermined range, the off-state current in an off state at $V_{gs}$ with which sufficiently reduced off-state current is obtained, or the like in some cases.

As an example, the assumption is made of an n-channel transistor where the threshold voltage $V_{th}$ is 0.5 V and the drain current is $1\times10^{-9}$ A at $V_{gs}$ of 0.5 V, $1\times10^{-13}$ A at $V_{gs}$ of 0.1 V, $1\times10^{-19}$ A at $V_{gs}$ of −0.5 V, and $1\times10^{-22}$ A at $V_{gs}$ of −0.8 V. The drain current of the transistor is $1\times10^{-19}$ A or lower at $V_{gs}$ of −0.5 V or at $V_{gs}$ in the range of −0.8 V to −0.5 V; therefore, the off-state current of the transistor may be described as $1\times10^{-19}$ A or lower. Since there is $V_{gs}$ at which the drain current of the transistor is $1\times10^{-22}$ A or lower, the off-state current of the transistor may be described as $1\times10^{-22}$ A or lower.

In this specification and the like, the off-state current of a transistor with a channel width W is sometimes represented by a current value per channel width W. Alternatively, it is sometimes represented by the value of flowing current per given channel width (e.g., 1 μm). In the latter case, the off-state current may be represented in the unit with the dimension of current per length (e.g., A/μm).

The off-state current of a transistor depends on temperature in some cases. Unless otherwise specified, the off-state current in this specification may be off-state current at room temperature, 60° C., 85° C., 95° C., or 125° C. Alternatively, the off-state current may be off-state current at a temperature at which the reliability of a semiconductor device or the like including the transistor is ensured or a temperature at which the semiconductor device or the like including the transistor is used (e.g., any one of the temperatures in the range of 5° C. to 35° C.). The description "the off-state current of a transistor is lower than or equal to I" may refer to a situation where there is $V_{gs}$ at which the off-state current of a transistor is lower than or equal to I at room temperature, 60° C., 85° C., 95° C., 125° C., a temperature at which the reliability of a semiconductor device including the transistor is ensured, or a temperature at which the semiconductor device or the like including the transistor is used (e.g., any one of the temperatures in the range of 5° C. to 35° C.).

The off-state current of a transistor depends on voltage Vas between its drain and source in some cases. Unless otherwise specified, the off-state current in this specification may be off-state current at $V_{ds}$ of 0.1 V, 0.8 V, 1 V, 1.2 V, 1.8 V, 2.5 V, 3 V, 3.3 V, 10 V, 12 V, 16 V, or 20 V. Alternatively, the off-state current may be off-state current at $V_{ds}$ at which the reliability of a semiconductor device or the like including the transistor is ensured or $V_{ds}$ at which the semiconductor device or the like including the transistor is used. The description "the off-state current of a transistor is lower than or equal to I" may refer to a situation where there is $V_{gs}$ at which the off-state current of the transistor is lower than or equal to I at Vas of 0.1 V, 0.8 V, 1 V, 1.2 V, 1.8 V, 2.5 V, 3 V, 3.3 V, 10 V, 12 V, 16 V, 20 V, $V_{ds}$ at which the reliability of a semiconductor device including the transistor is ensured, or $V_{ds}$ at which the semiconductor device or the like including the transistor is used.

In the above description of off-state current, a drain may be replaced with a source. That is, the off-state current sometimes refers to current that flows through a source of a transistor in an off state.

Furthermore, in this specification and the like, leakage current sometimes expresses the same meaning as off-state current. In this specification and the like, the off-state current sometimes refers to current that flows between a source and a drain of a transistor in an off state.

In this specification and the like, the threshold voltage of a transistor refers to a gate voltage ($V_g$) at which a channel is formed in the transistor. Specifically, in a curve ($V_g$-$\sqrt{I_d}$ characteristics) plotted with the horizontal axis representing the gate voltage ($V_g$) and the vertical axis representing the square root of drain current ($I_d$), the threshold voltage of a transistor may refer to a gate voltage ($V_g$) at the intersection of the square root of drain current ($I_d$) of 0 ($I_d$=0 A) and an extrapolated straight line that is tangent with the highest inclination. Alternatively, the threshold voltage of a transistor may refer to a gate voltage ($V_g$) at which the value of $I_d$[A]×L [μm]/W [μm] is $1\times10^{-9}$ [A] where L is channel length and W is channel width.

In this specification and the like, a "semiconductor" has characteristics of an "insulator" in some cases when the conductivity is sufficiently low, for example. Furthermore, a "semiconductor" and an "insulator" cannot be strictly distinguished from each other in some cases because a border therebetween is unclear. Therefore, a "semiconductor" in this specification and the like can be called an "insulator" in some cases. Similarly, an "insulator" in this specification and the like can be called a "semiconductor" in some cases. An "insulator" in this specification and the like can be called a "semi-insulator" in some cases.

Furthermore, in this specification and the like, a "semiconductor" has characteristics of a "conductor" in some cases when the conductivity is sufficiently high, for example. Furthermore, a "semiconductor" and a "conductor" cannot be strictly distinguished from each other in some cases because a border therebetween is unclear. Accordingly, a "semiconductor" in this specification and the like can be called a "conductor" in some cases. Similarly, a "conductor" in this specification and the like can be called a "semiconductor" in some cases.

Furthermore, in this specification and the like, a metal oxide means an oxide of metal in a broad sense. Metal oxides are classified into an oxide insulator, an oxide conductor (including a transparent oxide conductor), an oxide semiconductor (or simply referred to as OS), and the like. For example, a metal oxide used in an active layer of a transistor is called an oxide semiconductor in some cases. An OS FET can be referred to as a transistor including a metal oxide or an oxide semiconductor.

Furthermore, in this specification and the like, a metal oxide containing nitrogen is also called a metal oxide in some cases. Moreover, a metal oxide containing nitrogen may be called a metal oxynitride.

Embodiment 1

In this embodiment, a semiconductor device of one embodiment of the present invention and a method for manufacturing the semiconductor device are described with reference to FIG. 1 to FIG. 13.

<1-1. Structure Example 1 of Semiconductor Device>

Figure 1B:
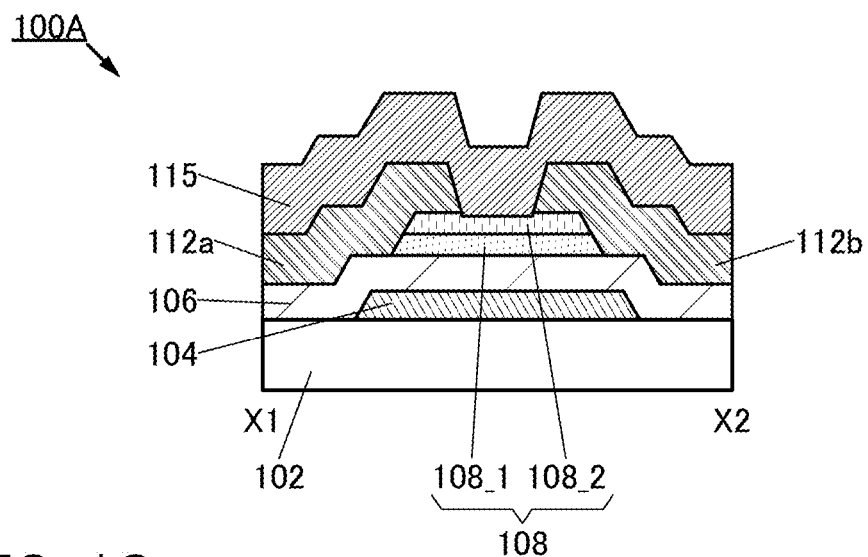
Figure 1C:
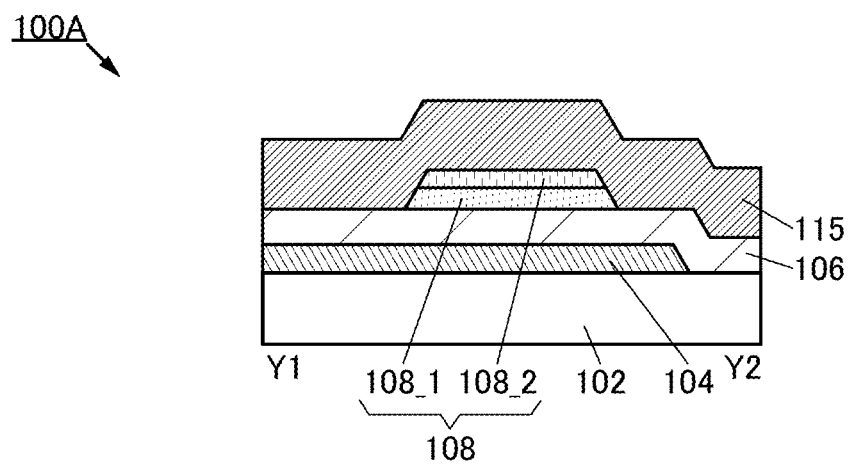

FIG. 1(A) is a top view of a transistor 100A that is a semiconductor device of one embodiment of the present invention, FIG. 1(B) is a cross-sectional view taken along the dashed-dotted line X1-X2 in FIG. 1(A), and FIG. 1(C) is a cross-sectional view taken along the dashed-dotted line Y1-Y2 in FIG. 1(A). Note that in FIG. 1(A), some components of the transistor 100A (e.g., an insulating film functioning as a gate insulating film) are not illustrated to avoid complexity. The direction of the dashed-dotted line X1-X2 may be referred to as a channel length direction, and the direction of the dashed-dotted line Y1-Y2 may be referred to as a channel width direction. Note that some components are not illustrated in some cases in top views of transistors in the following drawings, as in FIG. 1(A).

The transistor 100A includes a conductive film 104 over a substrate 102, an insulating film 106 over the substrate 102 and the conductive film 104, a metal oxide 108 over the insulating film 106, a conductive film 112a over the metal oxide 108, and a conductive film 112b over the metal oxide 108. Furthermore, an insulating film 115 is formed over the transistor 100A, specifically, over the metal oxide 108, the conductive film 112a, and the conductive film 112b.

Note that the transistor 100A is what is called a channel-etched transistor.

Furthermore, the insulating film 115 preferably contains silicon and one or both of nitrogen and oxygen.

The insulating film 115 contains excess oxygen and can supply oxygen to the metal oxide 108.

The metal oxide 108 contains a metal oxide 108_1 over the insulating film 106 and a metal oxide 108_2 in contact with a top surface of the metal oxide 108_1.

Note that the metal oxide 108_1 and the metal oxide 108_2 each contain In, an element M (M is gallium, aluminum, silicon, boron, yttrium, tin, copper, vanadium, beryllium, titanium, iron, nickel, germanium, zirconium, molybdenum, lanthanum, cerium, neodymium, hafnium, tantalum, tungsten, or magnesium), and Zn. In particular, gallium is preferable as the element M.

In the transistor 100A illustrated in FIGS. 1(A), 1(B), and 1(C), the insulating film 106 functions as a gate insulating film of the transistor 100A, and the insulating film 115 functions as a protective insulating film of the transistor 100A. Furthermore, in the transistor 100A, the conductive film 104 functions as a gate electrode, the conductive film 112a functions as a source electrode, and the conductive film 112b functions as a drain electrode. Note that in this specification and the like, the insulating film 106 may be referred to as a first insulating film, and the insulating film 115 may be referred to as a second insulating film.

Figure 2A:
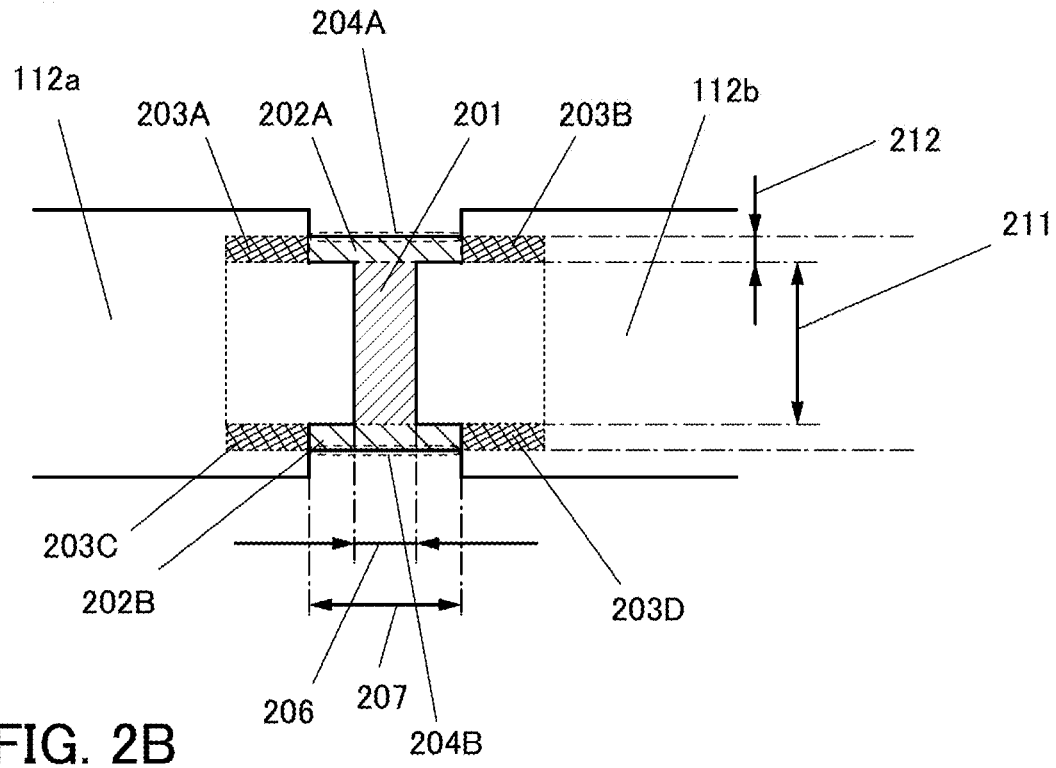
FIGS. 2A and 2B are top views illustrating a semiconductor device.
Figure 2B:
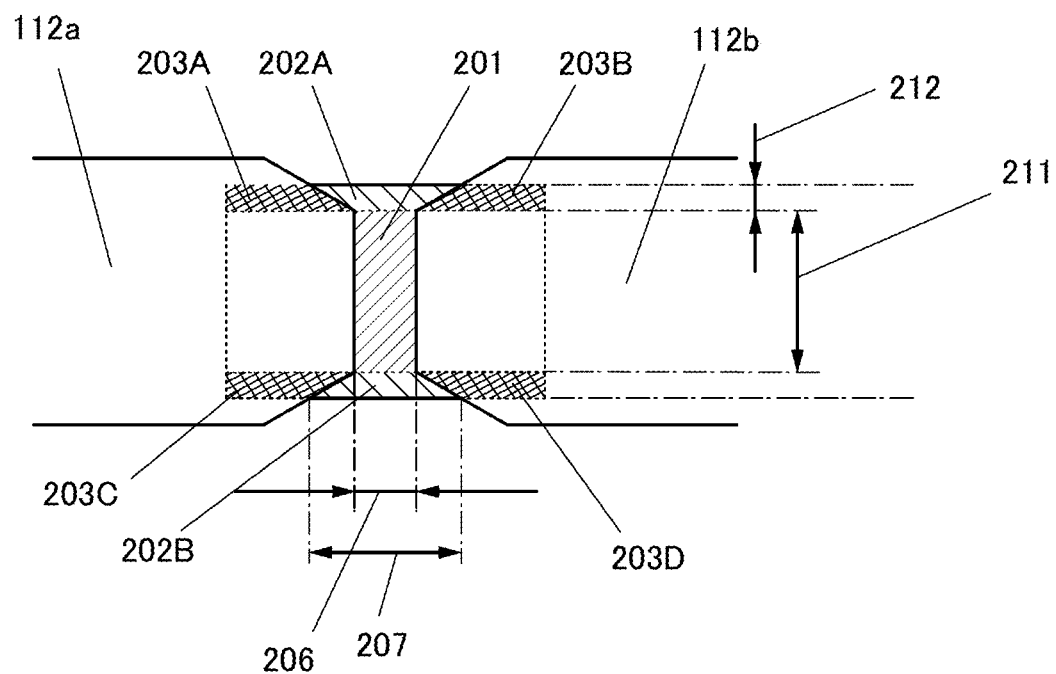

FIG. 2(A) is a top view illustrating only the metal oxide 108, the conductive film 112a, and the conductive film 112b of the transistor 100A. Seen from the top surface side, the conductive film 112a and the conductive film 112b are arranged in front of the metal oxide 108. A region of the metal oxide 108 which is in contact with the conductive film 112a can be referred to as a source region, and a region of the metal oxide 108 which is in contact with the conductive film 112b can be referred to as a drain region. Note that the source region and the drain region can be interchanged with each other.

Seen from the top surface side, the distance in the channel length direction between the conductive film 112a and the conductive film 112b can be divided into two kinds, that is, a distance 206 and a distance 207. A region in which the metal oxide 108 is formed and which is placed between the conductive film 112a and the conductive film 112b, with the distance 206 between the conductive film 112a and the conductive film 112b is a channel formation region 201, and a region with the distance 207 between the conductive film 112a and the conductive film 112b is an end region 202A or an end region 202B.

The end region 202A and the end region 202B include an end portion 204A and an end portion 204B of the metal oxide 108, respectively. An element may diffuse into the end portion 204A and the end portion 204B from an adjacent layer or the end portion 204A and the end portion 204B may have an unstable bond; therefore, the end region 202A or the end region 202B may have a conductivity σ higher than that of the channel formation region 201. Alternatively, a trap state which influences the transistor characteristics may be formed in the end region 202A or the end region 202B. Note that the end region 202A, the end region 202B, and the channel formation region 201 are positioned between the source region and the drain region along the channel length direction.

The length in the channel width direction of the channel formation region 201 is a channel width 211 and the length in the channel width direction of the end region 202A or the end region 202B is an end portion width 212. The end portion width 212 is larger than 0 and smaller than half of the length in the channel width direction of the metal oxide 108.

The end region 202A or the end region 202B includes an end portion of the metal oxide 108. In the region where the conductive film 112a or the conductive film 112b, and the metal oxide 108 do not overlap, all the region of the metal oxide 108, which has a conductivity σ higher than the channel formation region 201, is preferably included in the end region 202A or the end region 202B. That is, the end portion width 212 in which all the metal oxide having a conductivity σ higher than the channel formation region 201 is included is preferably chosen for the end region 202A or the end region 202B. Alternatively, the end portion width 212 in which all the metal oxide in the vicinity of the end portion where a trap state influencing the transistor characteristics is formed is included is preferably chosen. The preferable end portion width 212 differs depending on a process condition. For example, in the case where the maximum process temperature is high, the end portion width 212 becomes wide.

Since the end region 202A or the end region 202B has little influence on the transistor characteristics, the transistor characteristics can be calculated on the basis of the channel width 211.

In the case where the distance 207 becomes small, the series resistance among the conductive film 112a, the end region 202A or the end region 202B, and the conductive film 112b becomes small, which highly influences the transistor characteristics.

Therefore, in the transistor in which the distance 206 is larger than 0 μm and smaller than 4 μm, preferably larger than 0 μm and smaller than 2.5 μm, the distance 207 is determined as follows. That is, the distance 207 is larger than the distance 206 and smaller than the length of the metal oxide 108 in the channel length direction. The distance 207 is preferably greater than three times the length of the distance 206, and is less than the length of the metal oxide 108 in the channel length direction.

By making the distance 207 larger than the distance 206, the series resistance among the conductive film 112a, the end region 202A or the end region 202B, and the conductive film 112b is increased, so that the semiconductor device with small transistor characteristics variation using the metal oxide can be provided. Furthermore, a semiconductor device with excellent normally-off switching characteristics using the metal oxide can be provided.

The transistor of one embodiment of the present invention includes regions 203A, 203B, 203C, and 203D, which include the end portion of the metal oxide 108 and overlap with the conductive film 112a or the conductive film 112b.

By including the regions 203A, 203B, 203C, and 203D, the contact resistance between the metal oxide 108 and the conductive film 112a or the conductive film 112b can be reduced. Furthermore, in the case where the transistor is used in a display device, stray light which arrives at the channel formation region 201 along the parallel direction with the film surface can be reduced by including the regions 203A, 203B, 203C, and 203D.

In addition, due to the material of interlayer films included in the semiconductor device, the condition of heat treatment in the process, and a use environment, the amount of the hydrogen diffusion to the direction of the channel formation region 201 may be large. In the case where the conductive film 112a and the conductive film 112b have an effect of absorbing hydrogen in and around the channel formation region 201, the increase of the conductivity σ of the transistor can be prevented. When the conductive film 112a and the conductive film 112b will be formed in a larger area, it is effective for the transistor to include the regions 203A, 203B, 203C, and 203D.

As an example of the material for the conductive film 112a and the conductive film 112b, which have an effect of absorbing hydrogen in and around the channel formation region 201, a conductive oxide such as indium tin oxide, indium oxide containing tungsten oxide, indium zinc oxide containing tungsten oxide, indium oxide containing titanium oxide, indium tin oxide containing titanium oxide, indium zinc oxide, indium tin oxide to which silicon is added, or indium gallium zinc oxide containing nitrogen is deposited, and a material containing one or more kinds of metal elements selected from aluminum, chromium, copper, silver, gold, platinum, tantalum, nickel, titanium, molybdenum, tungsten, hafnium, vanadium, niobium, manganese, magnesium, zirconium, beryllium, indium, and the like, a semiconductor with high electric conductivity, typified by polycrystalline silicon containing an impurity element such as phosphorus, or a silicide such as a nickel silicide may be deposited over the oxide. Moreover, titanium instead of the oxide may have a similar function.

In addition, the channel formation region 201 is positioned between the region 203A and the region 203B along the channel length direction. Similarly, the channel formation region 201 is positioned between the region 203C and the region 203D along the channel length direction. With this arrangement, the shortest distance between the conductive film 112a and the conductive film 112b is the distance 206, which is the channel length. In other words, the shortest path from the source region to the drain region is included in the channel formation region 201.

The boundary between the end region 202A and the region 203A is not necessarily parallel to the channel width direction. For example, a shape in which the distance between the conductive film 112a and the conductive film 112b becomes smaller toward the far direction of the end portion of the metal oxide 108 may be employed (see FIG. 2(B)). This shape arrangement is effective when the influence of the end portion on the metal oxide is small and thus the end portion width 212 is made to be as small as possible but there is a limit of minimization in terms of exposure or etching.

<1-2. Components of Semiconductor Device>

Next, components of the semiconductor device in this embodiment will be described in detail.

[Substrate]

Although a material and the like of the substrate 102 is not limited in particular, the material needs to have at least heat resistance high enough to withstand heat treatment to be performed later. For example, a glass substrate, a ceramic substrate, a quartz substrate, a sapphire substrate, or the like may be used as the substrate 102. Alternatively, a single crystal semiconductor substrate or a polycrystalline semiconductor substrate using a material such as silicon or silicon carbide, a compound semiconductor substrate of silicon germanium or the like, an SOI substrate, or the like can be used, or any of these substrates provided with a semiconductor element may be used as the substrate 102. Note that in the case where a glass substrate is used as the substrate 102, a large-sized substrate having any of the following sizes is used: the 6th generation (1500 mm×1850 mm), the 7th generation (1870 mm×2200 mm), the 8th generation (2200 mm×2400 mm), the 9th generation (2400 mm×2800 mm), and the 10th generation (2950 mm×3400 mm); thus, a large-sized display device can be fabricated.

Alternatively, a flexible substrate may be used as the substrate 102, in which case the transistor 100A may be provided directly on the flexible substrate. Alternatively, a separation layer may be provided between the substrate 102 and the transistor 100A. The separation layer can be used when part or the whole of a semiconductor device formed thereover is separated from the substrate 102 and transferred to another substrate. In that case, the transistor 100A can be transferred to a substrate having low heat resistance or a flexible substrate.

[Conductive Film]

The conductive film 104 functioning as a gate electrode, the conductive film 112a functioning as a source electrode, and the conductive film 112b functioning as a drain electrode can each be formed using a metal element selected from chromium (Cr), copper (Cu), aluminum (Al), gold (Au), silver (Ag), zinc (Zn), molybdenum (Mo), tantalum (Ta), titanium (Ti), tungsten (W), manganese (Mn), nickel (Ni), iron (Fe), and cobalt (Co); an alloy containing any of these metal elements as its component; an alloy containing a combination of these metal elements; or the like.

Furthermore, the conductive films 104, 112a, and 112b can be formed using an oxide conductor or an oxide semiconductor, such as an oxide containing indium and tin (In—Sn oxide), an oxide containing indium and tungsten (In—W oxide), an oxide containing indium, tungsten, and zinc (In—W—Zn oxide), an oxide containing indium and titanium (In—Ti oxide), an oxide containing indium, titanium, and tin (In—Ti—Sn oxide), an oxide containing indium and zinc (In—Zn oxide), an oxide containing indium, tin, and silicon (In—Sn—Si oxide), or an oxide containing indium, gallium, and zinc (In—Ga—Zn oxide).

Here, an oxide conductor is described. In this specification and the like, an oxide conductor may be referred to as OC. As the oxide conductor, for example, oxygen vacancies are formed in an oxide semiconductor, and then hydrogen is added to the oxygen vacancies, so that a donor level is formed in the vicinity of the conduction band. As a result, the oxide semiconductor has increased conductivity to be a conductor. The oxide semiconductor having become a conductor can be referred to as an oxide conductor. An oxide semiconductor generally has a visible light transmitting property because of its large energy gap. On the other hand, an oxide conductor is an oxide semiconductor having a donor level in the vicinity of the conduction band. Therefore, the influence of absorption due to the donor level is small in an oxide conductor, and it has a visible light transmitting property almost equivalent to that of an oxide semiconductor.

A Cu—X alloy film (X is Mn, Ni, Cr, Fe, Co, Mo, Ta, or Ti) may be used for the conductive films 104, 112a, and 112b. The use of a Cu—X alloy film enables fabrication costs to be reduced because processing can be performed by a wet etching process.

Among the above-mentioned metal elements, any one or more elements selected especially from copper, titanium, tungsten, tantalum, and molybdenum are preferably contained in the conductive films 112a and 112b. In particular, a tantalum nitride film is preferably used as the conductive films 112a and 112b. The tantalum nitride film has conductivity and a high barrier property against copper or hydrogen. Furthermore, since a tantalum nitride film releases little hydrogen from itself, it can be most favorably used as the conductive film in contact with the metal oxide 108 or the conductive film in the vicinity of the metal oxide 108. Moreover, it is favorable to use a copper film for the conductive films 112a and 112b since the resistance of the conductive films 112a and 112b can be reduced.

The conductive films 112a and 112b can be formed by electroless plating. As a material that can be deposited by electroless plating, for example, any one or more selected from Cu, Ni, Al, Au, Sn, Co, Ag, and Pd can be used. It is particularly favorable to use Cu or Ag since the resistance of the conductive film can be reduced.

[Insulating Film Functioning as Gate Insulating Film]

As the insulating film 106 functioning as a gate insulating film of the transistor 100A, an insulating layer including one or more kinds of the following films formed by a plasma enhanced chemical vapor deposition (PECVD) method, a sputtering method, or the like can be used: a silicon oxide film, a silicon oxynitride film, a silicon nitride oxide film, a silicon nitride film, an aluminum oxide film, a hafnium oxide film, an yttrium oxide film, a zirconium oxide film, a gallium oxide film, a tantalum oxide film, a magnesium oxide film, a lanthanum oxide film, a cerium oxide film, and a neodymium oxide film. Note that the insulating film 106 may have a stacked-layer structure or a stacked-layer structure of three or more layers.

The insulating film 106 which is in contact with the metal oxide 108 functioning as a channel formation region of the transistor 100A is preferably an oxide insulating film and preferably includes a region containing oxygen in excess of the stoichiometric composition (oxygen-excess region).

Without being limited to the above structure, the insulating film that is in contact with the metal oxide 108 may be a nitride insulating film. As an example of the structure, a silicon nitride film is formed and a surface of the silicon nitride film is oxidized by oxygen plasma treatment or the like performed on the surface of the silicon nitride film. Note that in the case where oxygen plasma treatment or the like is performed on the surface of the silicon nitride film, the surface of the silicon nitride film may be oxidized at the atomic level, so that oxygen may be undetectable by cross-sectional observation or the like of the transistor. In other words, in the case of performing cross-sectional observation of the transistor, the silicon nitride film and the metal oxide may be observed to be in contact with each other.

Note that the thickness of the insulating film can be increased by including the silicon nitride film as the gate insulating film of the transistor, since the silicon nitride film has a higher dielectric constant than a silicon oxide film and needs a larger thickness to obtain capacitance equivalent to that of the silicon oxide film. Therefore, inhibiting a decrease in withstand voltage of the transistor and furthermore increasing the withstand voltage are possible, thereby reducing electrostatic discharge damage to the transistor.

[Metal Oxide]

The metal oxide 108 can be formed using the materials described above. The metal oxide 108_1 and the metal oxide 108_2 each include a region where an In content is greater than or equal to 40% and less than or equal to 50% of the total number of In, M, and Zn atoms, and a region where an M content is greater than or equal to 5% and less than or equal to 30% of the total number of In, M, and Zn atoms.

When the metal oxide 108_1 and the metal oxide 108_2 each include the above regions, the carrier density can be increased.

Specifically, the atomic ratio of In to M and Zn in each of the metal oxide 108_1 and the metal oxide 108_2 is preferably In:M:Zn=4:2:3 or a neighborhood thereof, or In:M:Zn=5:1:6 or a neighborhood thereof. Note that a neighborhood of 4:2:3 means that when In is 4 with respect to the total number of In, M, and Zn atoms, M is greater than or equal to 1.5 and less than or equal to 2.5 and Zn is greater than or equal to 2 and less than or equal to 4. Furthermore, a neighborhood of 5:1:6 means that when In is 5 with respect to the total number of In, M, and Zn atoms, M is greater than or equal to 0.5 and less than or equal to 1.5 and Zn is greater than or equal to 5 and less than or equal to 7.

The metal oxide 108_1 preferably includes a region having lower crystallinity than the metal oxide 108_2. The metal oxide 108_1 including a region having lower crystallinity than the metal oxide 108_2 can have a higher carrier density, and a semiconductor device with high reliability can be provided. For example, by making the crystallinity of the metal oxide 108_2 higher than that of the metal oxide 108_1, the metal oxide 108_2 serves as an etching stopper for the metal oxide 108_1 since the transistor 100A is a channel-etched transistor.

When the atomic ratio of In to M and Zn in the metal oxide 108_2 is in the above range, the contact resistance between the metal oxide 108_2 and the conductive films 112a and 112b can be reduced.

Note that when the metal oxide 108 has the above structure, the transistor 100A can have high field-effect mobility. Specifically, the field-effect mobility of the transistor 100A can be higher than 50 cm$^2$/Vs, and further preferably, the field-effect mobility of the transistor 100A can be higher than 100 cm$^2$/Vs.

For example, with the use of the above transistor with high field-effect mobility in a gate driver that generates a gate signal, a display device with a narrow frame width (also referred to as a narrow frame) can be provided. Furthermore, with the use of the above transistor with high field-effect mobility in a source driver (particularly in a demultiplexer connected to an output terminal of a shift register included in a source driver) that is included in a display device and supplies a signal from a signal line, a display device to which a small number of wirings are connected can be provided.

Note that crystal structures of the metal oxide 108_1 and the metal oxide 108_2 are not particularly limited. The metal oxide 108_1 and the metal oxide 108_2 may each have one or both of a single crystal structure and a non-single-crystal structure.

Examples of the non-single-crystal structure include a CAAC-OS (C Axis Aligned Crystalline Oxide Semiconductor) described later, a polycrystalline structure, a microcrystalline structure, and an amorphous structure. Examples of the crystal structure also include a bixbyite crystal structure and a layered crystal structure. A mixed crystal structure including both of a bixbyite crystal structure and a layered crystal structure may be employed.

The metal oxide 108_2 preferably has a layered crystal structure, in particular, a crystal structure having c-axis alignment. In other words, the metal oxide 108_2 is preferably a CAAC-OS.

It is preferable that the metal oxide 108_1 have a microcrystalline structure and the metal oxide 108_2 have a crystal structure having c-axis alignment, for example. In other words, the metal oxide 108_1 includes a region having lower crystallinity than the metal oxide 108_2. Note that the crystallinity of the metal oxide 108 can be analyzed by X-ray diffraction (XRD) or analyzed with a transmission electron microscope (TEM), for example.

For example, when the metal oxide 108 is measured by XRD analysis, a peak at around 2θ=31° is hardly observed in the metal oxide 108_1 but a peak at around 2θ=31° is observed in the metal oxide 108_2.

In the case where the metal oxide 108_1 includes a region having low crystallinity, the following advantageous effects can be achieved.

First, oxygen vacancies that might be formed in the metal oxide 108_1 are described.

Oxygen vacancies formed in the metal oxide 108_1 affect the transistor characteristics and therefore cause a problem. For example, when oxygen vacancies are formed in the metal oxide 108_1, the oxygen vacancies are bonded to hydrogen to serve as a carrier supply source. When the carrier supply source is generated in the metal oxide 108_1, variation in the electrical characteristics, typically, a shift in the threshold voltage, of the transistor 100A containing the metal oxide 108_1 is caused. Therefore, it is preferable that the amount of oxygen vacancies in the metal oxide 108_1 be as small as possible.

Thus, in one embodiment of the present invention, the metal oxide 108_2 is formed over the metal oxide 108_1. The metal oxide 108_2 contains a larger amount of oxygen than the metal oxide 108_1. Oxygen or excess oxygen is transferred from the metal oxide 108_2 to the metal oxide 108_1 at the time of the formation of the metal oxide 108_2 or after the formation of the metal oxide 108_2, whereby oxygen vacancies in the metal oxide 108_1 can be reduced.

When the metal oxide 108_2 is formed in an atmosphere containing a large amount of oxygen, the metal oxide 108_2 can have high crystallinity.

Increasing crystallinity of the metal oxide 108_2 can inhibit possible entry of impurities into the metal oxide 108_1. In particular, increasing crystallinity of the metal oxide 108_2 can inhibit damage to the metal oxide 108_1 at the time of processing the conductive films 112a and 112b. The surface of the metal oxide 108, that is, the surface of the metal oxide 108_2 is exposed to an etchant or an etching gas at the time of processing the conductive films 112a and 112b. However, the metal oxide 108_2 having the region with high crystallinity has etching resistance superior to the metal oxide 108_1 with low crystallinity. Therefore, the metal oxide 108_2 serves as an etching stopper.

Note that it is preferable to use, as the metal oxide 108, a metal oxide in which the impurity concentration is low and the density of defect states is low, in which case the transistor having excellent electrical characteristics can be fabricated. Here, the state in which the impurity concentration is low and the density of defect states is low (the amount of oxygen vacancies is small) is referred to as highly purified intrinsic or substantially highly purified intrinsic. Note that impurities in a metal oxide are typically water, hydrogen, and the like. In this specification and the like, reducing or removing water and hydrogen from a metal oxide may be referred to as dehydration or dehydrogenation. Moreover, adding oxygen to a metal oxide may be referred to as oxygen addition and a state in which oxygen in excess of the stoichiometric composition is contained due to the oxygen addition may be referred to as an oxygen-excess state.

A highly purified intrinsic or substantially highly purified intrinsic metal oxide has few carrier generation sources, and thus can have a low carrier density. Thus, a transistor in which a channel formation region is formed in the metal oxide rarely has electrical characteristics of a negative threshold voltage (also referred to as normally-on). Moreover, a highly purified intrinsic or substantially highly purified intrinsic metal oxide has a low density of defect states and accordingly may have a low density of trap states. Furthermore, a highly purified intrinsic or substantially highly purified intrinsic metal oxide has an extremely low off-state current; even an element having a channel width of $1\times10^6$ μm and a channel length L of 10 μm can have the off-state current lower than or equal to the measurement limit of a semiconductor parameter analyzer, that is, lower than or equal to $1\times10^{13}$ μA, at a voltage (drain voltage) between a source electrode and a drain electrode ranging from 1 V to 10 V.

The metal oxide 108_1 including a region having lower crystallinity than the metal oxide 108_2 may have a high carrier density. When the metal oxide 108_1 has a high carrier density, the Fermi level may be high relative to the conduction band of the metal oxide 108_1. This lowers the conduction band minimum of the metal oxide 108_1, so that the energy difference between the conduction band minimum of the metal oxide 108_1 and the trap state, which might be formed in a gate insulating film (here, the insulating film 106), may be increased. The increase in the energy difference can reduce the amount of charge trapped in the gate insulating film and reduce variation in the threshold voltage of the transistor, in some cases. In addition, when the metal oxide 108_1 has a high carrier density, the metal oxide 108 can have high field-effect mobility.

In the case where the metal oxide 108_1 and the metal oxide 108_2 are each an In-M-Zn oxide, it is preferable that the atomic ratio of metal elements of a sputtering target used for forming the In-M-Zn oxide satisfy In>M. The atomic ratio of metal elements in such a sputtering target is, for example, In:M:Zn=2:1:3, In:M:Zn=3:1:2, In:M:Zn=4:2:4.1, In:M:Zn=5:1:6, In:M:Zn=5:1:7, In:M:Zn=5:1:8, In:M:Zn=6:1:6, or In:M:Zn=5:2:5.

Note that the atomic ratio in each of the formed metal oxide 108_1 and metal oxide 108_2 varies from the above atomic ratio of metal elements of the sputtering target in a range of ±40%. For example, when the composition of a sputtering target used for the metal oxide 108_1 and the metal oxide 108_2 is In:Ga:Zn=4:2:4.1 [atomic ratio], the composition of the formed metal oxide 108_1 and metal oxide 108_2 may be each In:Ga:Zn=4:2:3 [atomic ratio] or a neighborhood thereof.

The energy gap of each of the metal oxide 108_1 and the metal oxide 108_2 is 2.5 eV or more, preferably 3.0 eV or more. With the use of a metal oxide having such a wide energy gap, the off-state current of the transistor 100A can be reduced.

[Insulating Film Functioning as Protective Insulating Film]

The insulating film 115 functions as a protective insulating film of the transistor 100A. In addition, the insulating film 115 has a function of supplying oxygen to the metal oxide 108.

For example, the insulating film 115 preferably contains silicon and one or both of nitrogen and oxygen. The insulating film 115 preferably includes a first layer containing silicon and oxygen and a second layer containing silicon and nitrogen.

As the insulating film 115, an insulating film having a low density of states due to nitrogen oxide ($NO_x$, x is greater than 0 and less than or equal to 2, preferably greater than or equal to 1 and less than or equal to 2; typically NO or $NO_2$) is preferably used.

Nitrogen oxide forms a state in the insulating film 115 and the like. The state is positioned in the energy gap of the metal oxide 108. For example, the density of states due to the nitrogen oxide may be formed between the energy of the valence band maximum (Ev_os) and the energy of the conduction band minimum (Ec_os) of the metal oxide 108. Therefore, when nitrogen oxide is diffused into the interface between the insulating film 115 and the metal oxide 108, an electron may be trapped by the state on the insulating film 115 side. As a result, the trapped electron remains in the vicinity of the interface between the insulating film 115 and the metal oxide 108; thus, the threshold voltage of the transistor is shifted in the positive direction.

The use of the insulating film having a low density of states due to nitrogen oxide as the insulating film 115 can reduce the shift in the threshold voltage of the transistor, reducing variation in the electrical characteristics of the transistor.

Although various films such as the conductive films, the insulating films, and the metal oxides which are described above can be formed by a sputtering method or a PECVD method, such films may be formed by another method, e.g., a thermal CVD (Chemical Vapor Deposition) method. Examples of a thermal CVD method include an MOCVD (Metal Organic Chemical Vapor Deposition) method and an ALD (Atomic Layer Deposition) method.

A thermal CVD method, which is a deposition method not using plasma, has an advantage that no defect due to plasma damage is generated. In a thermal CVD method, a source gas is introduced into a chamber, the chamber is set at an atmospheric pressure or a reduced pressure, and a film is deposited on a substrate.

In an ALD method, a source gas is introduced into a chamber, the chamber is set at an atmospheric pressure or a reduced pressure, and a film is deposited on a substrate.

<1-3. Structure Example 2 of Semiconductor Device>

Next, modification examples of the transistor 100A illustrated in FIGS. 1(A), 1(B), and 1(C) are described with reference to FIG. 3.

Figure 3A:
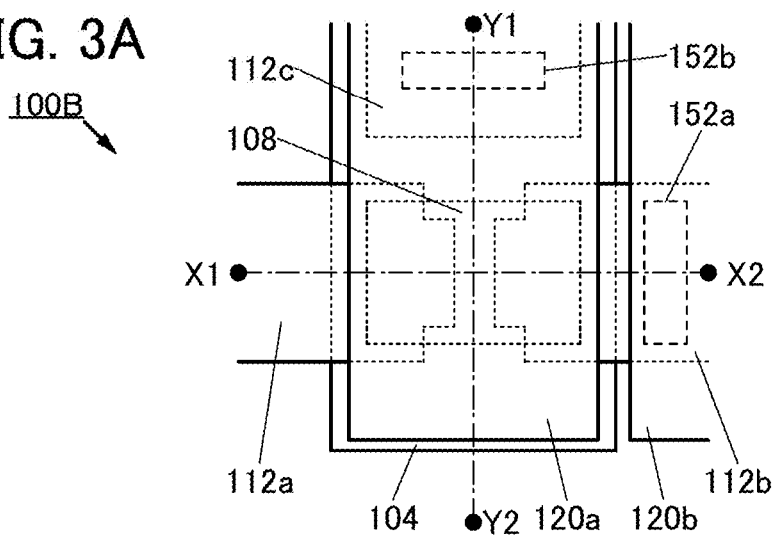
FIGS. 3A-3C are a top view and cross-sectional views illustrating a semiconductor device.
Figure 3B:
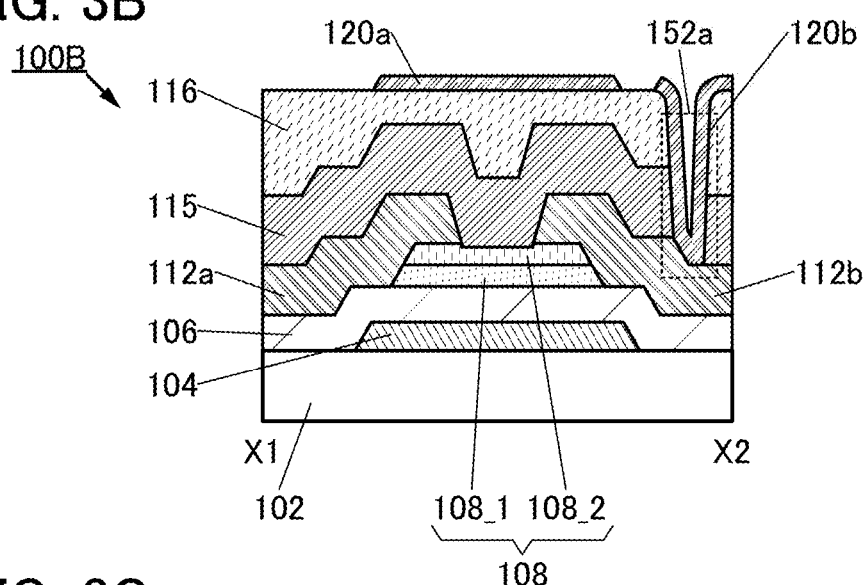
Figure 3C:
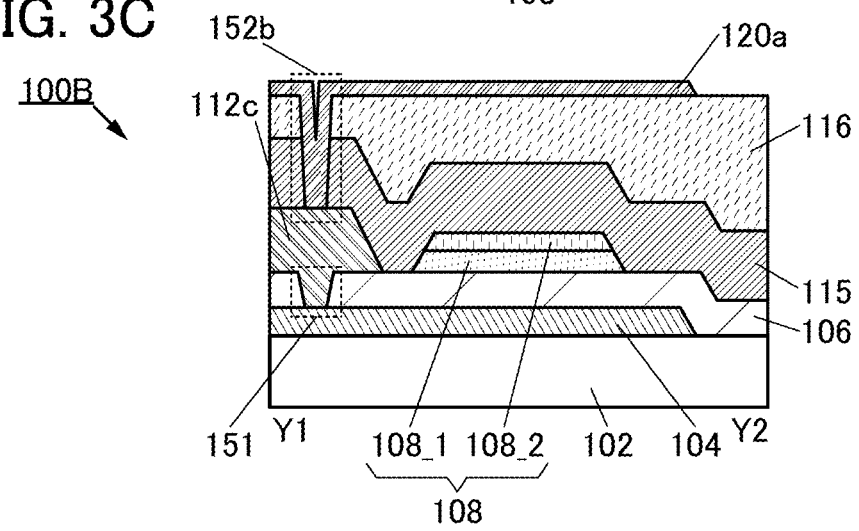

FIG. 3(A) is a top view of a transistor 100B that is a semiconductor device of one embodiment of the present invention, FIG. 3(B) corresponds to a cross-sectional view taken along the dashed-dotted line X1-X2 in FIG. 3(A), and FIG. 3(C) corresponds to a cross-sectional view taken along the dashed-dotted line Y1-Y2 in FIG. 3(A).

The transistor 100B includes the conductive film 104 over the substrate 102, the insulating film 106 over the substrate 102 and the conductive film 104, the metal oxide 108 over the insulating film 106, the conductive film 112a over the metal oxide 108, the conductive film 112b over the metal oxide 108, the insulating film 115 over the metal oxide 108, the conductive film 112a, and the conductive film 112b, an insulating film 116 over the insulating film 115, a conductive film 120a over the insulating film 116, and a conductive film 120b over the insulating film 116.

The insulating film 106 includes an opening 151, and a conductive film 112c that is electrically connected to the conductive film 104 through the opening 151 is formed over the insulating film 106. The insulating film 115 and the insulating film 116 include an opening 152a which reaches the conductive film 112b and an opening 152b which reaches the conductive film 112c.

Note that in the transistor 100B, the insulating film 106 functions as a first gate insulating film of the transistor 100B, and the insulating films 115 and 116 function as a second gate insulating film of the transistor 100B. Moreover, in the transistor 100B, the conductive film 104 functions as a first gate electrode, the conductive film 112a functions as a source electrode, and the conductive film 112b functions as a drain electrode. Furthermore, in the transistor 100B, the conductive film 120a functions as a second gate electrode, and the conductive film 120b functions as a pixel electrode of a display device.

Note that as illustrated in FIG. 3(C), the conductive film 120a is electrically connected to the conductive film 104 through the openings 152b and 151. Thus, the conductive film 104 and the conductive film 120a are supplied with the same potential.

As illustrated in FIG. 3(C), the metal oxide 108 is positioned to face the conductive film 104 and the conductive film 120a, and is positioned between the two conductive films functioning as the gate electrodes. The length in the channel length direction of the conductive film 120a and the length in the channel width direction of the conductive film 120a are longer than the length in the channel length direction of the metal oxide 108 and the length in the channel width direction of the metal oxide 108, respectively, and the whole metal oxide 108 is covered with the conductive film 120a with the insulating films 115 and 116 positioned therebetween.

In other words, the conductive film 104 and the conductive film 120a are connected to each other through the openings provided in the insulating films 106, 115, and 116, and each include a region positioned outside a side edge portion of the metal oxide 108.

With this structure, the metal oxide 108 included in the transistor 100B can be electrically surrounded by electric fields of the conductive film 104 and the conductive film 120a. A device structure of a transistor, like that of the transistor 100B, in which electric fields of a first gate electrode and a second gate electrode electrically surround a metal oxide where a channel formation region is formed can be referred to as a Surrounded Channel (S-Channel) structure.

Since the transistor 100B has the S-Channel structure, an electric field for inducing a channel can be effectively applied to the metal oxide 108 by the conductive film 104 functioning as the first gate electrode; therefore, the current drive capability of the transistor 100B can be improved and high on-state current characteristics can be obtained. Since the on-state current can be increased, the transistor 100B can be miniaturized. In addition, since the transistor 100B has a structure in which the metal oxide 108 is surrounded by the conductive film 104 functioning as the first gate electrode and the conductive film 120a functioning as the second gate electrode, the mechanical strength of the transistor 100B can be increased.

<Insulating Film Functioning as Second Gate Insulating Film>

Here, materials that can be used for the insulating film 116 functioning as the second gate insulating film are described. The insulating film 116 is formed using an insulating material, and one or both of an inorganic material and an organic material can be used. As an inorganic material, silicon oxide, silicon oxynitride, silicon nitride oxide, silicon nitride, aluminum oxide, or the like can be used. As an organic material, a heat-resistant resin material such as a polyimide resin, an acrylic resin, a polyimide amide resin, a benzocyclobutene resin, a polyamide resin, or an epoxy resin can be used. The insulating film 116 is preferably formed using the organic material such as an acrylic resin because the planarity can be increased and the productivity can be high.

For the conductive films 120a and 120b, materials similar to the materials of the above-described conductive films 104, 112a, and 112b can be used. In particular, oxide conductive films (OC) are preferable as the conductive films

120a and 120b. When oxide conductive films are used as the conductive films 120a and 120b, oxygen can be added to the insulating films 115 and 116.

Note that the other components of the transistor 100B are similar to those of the transistor 100A described above and have similar effects.

<1-4. Structure Example 3 of Semiconductor Device>

Next, modification examples of the transistor 100B illustrated in FIGS. 3(A), 3(B), and 3(C) are described with reference to FIG. 4.

Figure 4A:
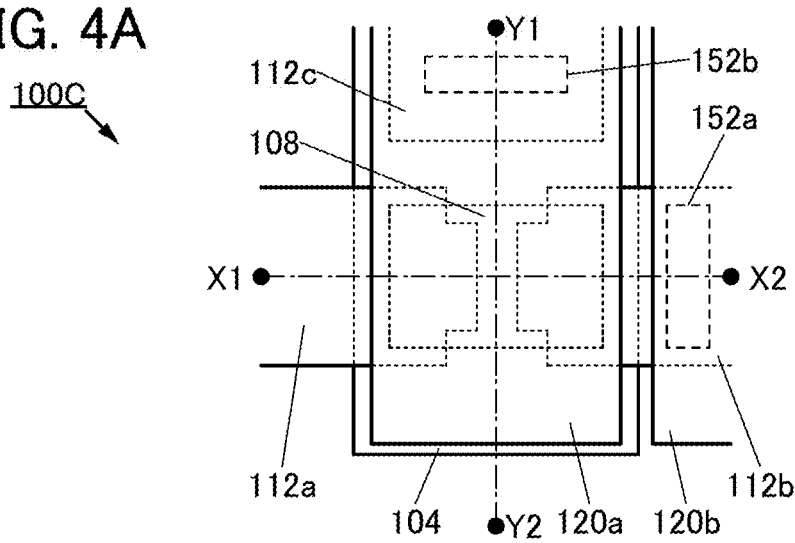
FIGS. 4A-4C are a top view and cross-sectional views illustrating a semiconductor device.
Figure 4B:
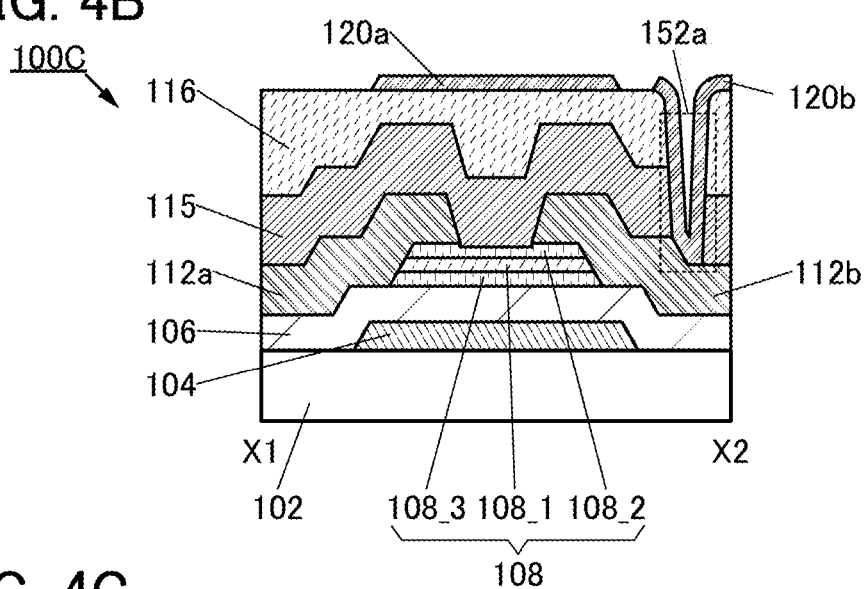
Figure 4C:
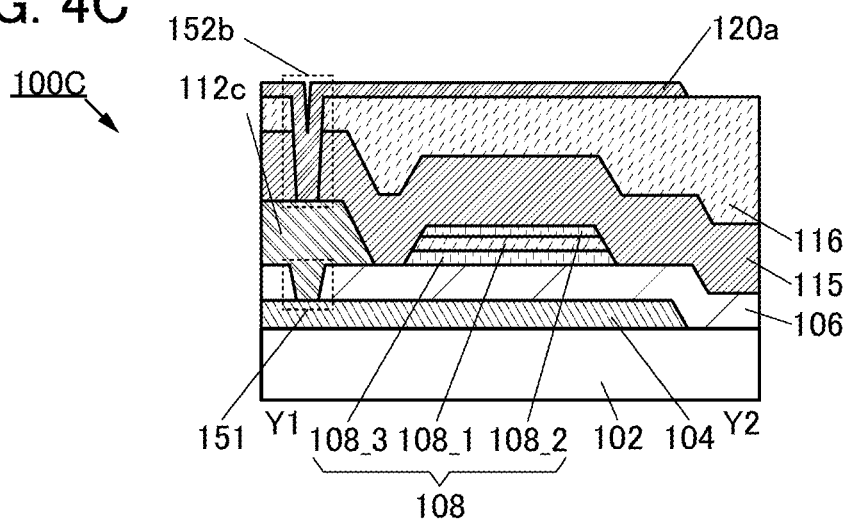

FIG. 4(A) is a top view of a transistor 100C that is a semiconductor device of one embodiment of the present invention, FIG. 4(B) is a cross-sectional view taken along the dashed-dotted line X1-X2 in FIG. 4(A), and FIG. 4(C) is a cross-sectional view taken along the dashed-dotted line Y1-Y2 in FIG. 4(A).

The transistor 100C has a structure in which the metal oxide 108 of the above-described transistor 100B has a stacked-layer structure of three layers. The metal oxide 108 contained in the transistor 100C contains a metal oxide 108_3 over the insulating film 106, the metal oxide 108_1 over the metal oxide 108_3, and the metal oxide 108_2 over the metal oxide 108_1.

<1-5. Band Structure>

Here, a band structure of the metal oxide 108 which has a stacked-layer structure is described with reference to FIG. 13.

Figure 13A:
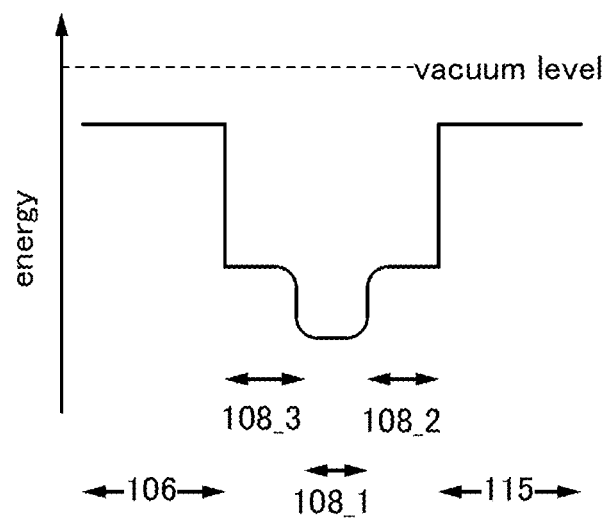
FIGS. 13A and 13B are diagrams illustrating energy bands.
Figure 13B:
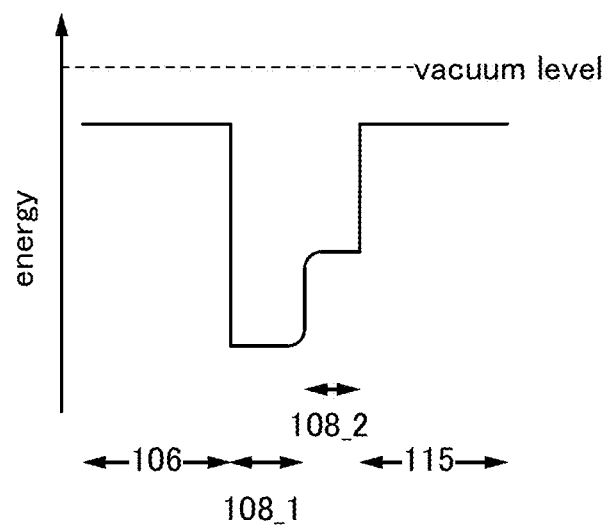

FIG. 13(A) shows an example of a band structure in the thickness direction of a stacked-layer structure including the insulating film 106, the metal oxides 108_1, 108_2, and 108_3, and the insulating film 115. FIG. 13(B) shows an example of a band structure in the thickness direction of a stacked-layer structure including the insulating film 106, the metal oxides 108_1 and 108_2, and the insulating film 115. For easy understanding, the energy level of the conduction band minimum (Ec) of each of the insulating film 106, the metal oxides 108_1, 108_2, and 108_3, and the insulating film 115 is shown in the band structure.

As shown in FIG. 13(A), the energy level of the conduction band minimum gradually changes between the metal oxides 108_1, 108_2, and 108_3. As shown in FIG. 13(B), the energy level of the conduction band minimum gradually changes between the metal oxides 108_1 and 108_2. In other words, a continuous change or continuous connection occurs. To obtain such band structures, there exists no impurity, which forms a defect state such as a trap center or a recombination center, at the interface between the metal oxide 108_1 and the metal oxide 108_2 or the interface between the metal oxide 108_1 and the metal oxide 108_3.

To form a continuous connection between the metal oxides 108_1, 108_2, and 108_3, it is necessary to form each film successively without exposure to the air by a multi-chamber deposition apparatus (sputtering apparatus) provided with a load lock chamber.

With the band structure of FIGS. 13(A) and 13(B), the metal oxide 108_1 serves as a well, and a channel formation region is formed in the metal oxide 108_1 in the transistor with the stacked-layer structure.

The metal oxides 108_2 and 108_3 are provided, whereby trap states which might be formed in the metal oxide 108_1 can be formed in the metal oxide 108_2 or the metal oxide 108_3. Thus, trap states are not likely formed in the metal oxide 108_1.

The trap states might be more distant from the vacuum level than the energy level of the conduction band minimum (Ec) of the metal oxide 108_1 functioning as a channel formation region, so that electrons are likely to be accumulated in the trap states. The electrons accumulated in the trap states become negative fixed electric charge, so that the threshold voltage of the transistor shifts in the positive direction. Therefore, it is preferable that the trap states be closer to the vacuum level than the energy level of the conduction band minimum (Ec) of the metal oxide 108_1. Such a structure inhibits accumulation of electrons in the trap states, thereby increasing the on-state current and the field-effect mobility of the transistor.

The energy level of the conduction band minimum of each of the metal oxides 108_2 and 108_3 is closer to the vacuum level than that of the metal oxide 108_1; typically, a difference between the energy level of the conduction band minimum of the metal oxide 108_1 and the energy level of the conduction band minimum of each of the metal oxides 108_2 and 108_3 is 0.15 eV or more or 0.5 eV or more and 2 eV or less or 1 eV or less. That is, the difference between the electron affinity of each of the metal oxides 108_2 and 108_3 and the electron affinity of the metal oxide 108_1 is 0.15 eV or more or 0.5 eV or more and 2 eV or less or 1 eV or less.

With such a structure, the metal oxide 108_1 serves as a main path of a current. In other words, the metal oxide 108_1 has a function of a channel formation region. It is preferable that the metal oxides 108_2 and 108_3 be a metal oxide containing one or more kinds of metal elements constituting the metal oxide 108_1 in which a channel formation region is formed. With such a structure, interface scattering hardly occurs at the interface between the metal oxide 108_1 and the metal oxide 108_2 or at the interface between the metal oxide 108_1 and the metal oxide 108_3. Thus, the transistor can have high field-effect mobility because the movement of carriers is not hindered at the interface.

It is preferable that the metal oxides 108_2 and 108_3 not have a spinel crystal structure in the films. In the case where the metal oxides 108_2 and 108_3 have a spinel crystal structure in the films, constituent elements of the conductive films 120a and 120b may be diffused into the metal oxide 108_1 at the interface between the spinel crystal structure and another region. In the case where the metal oxides 108_2 and 108_3 are CAAC-OS, a high blocking property against constituent elements of the conductive films 120a and 120b, for example, copper elements, can be preferably obtained.

The metal oxides 108_2 and 108_3 can be formed using a metal oxide target of In:Ga:Zn=1:1:1 [atomic ratio], a metal oxide target of In:Ga:Zn=1:3:4 [atomic ratio], a metal oxide target of In:Ga:Zn=1:3:6 [atomic ratio], or the like. For the metal oxides 108_2 and 108_3, the metal oxide target is not limited to the above target, and a metal oxide target having composition similar to that of the metal oxide 108_1 may be used.

<1-6. Structure Example 4 of Semiconductor Device>

Next, modification examples of the transistor 100B illustrated in FIGS. 3(A), 3(B), and 3(C) are described with reference to FIG. 5 to FIG. 7.

Figure 5A:
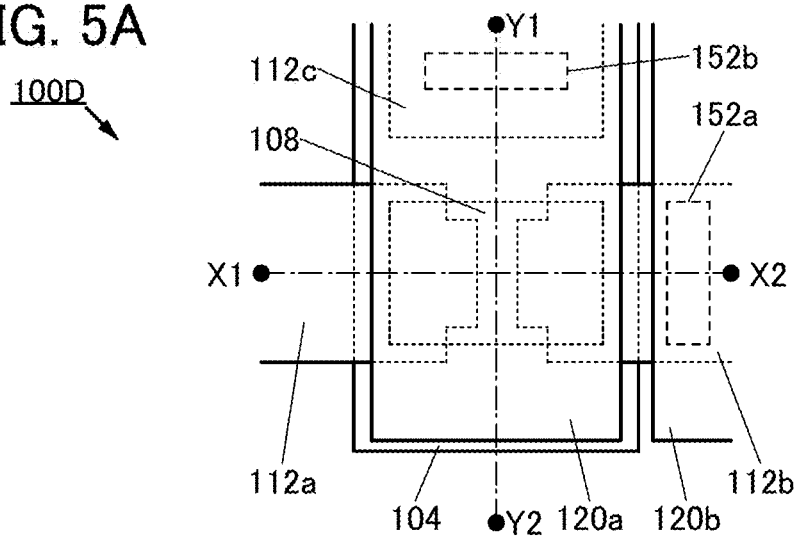
FIGS. 5A-5C are a top view and cross-sectional views illustrating a semiconductor device.
Figure 5B:
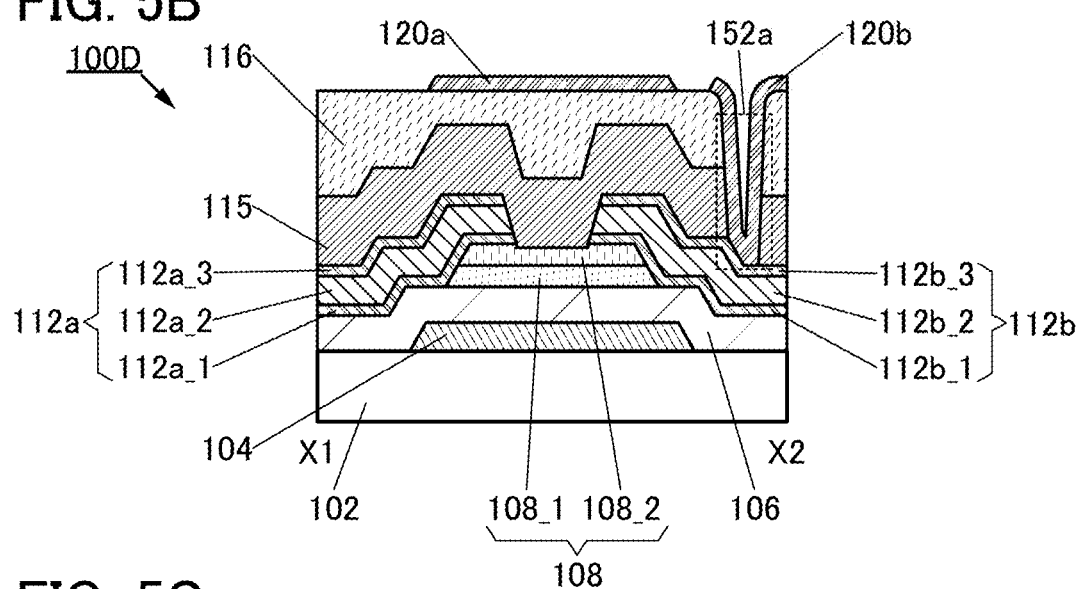
Figure 5C:
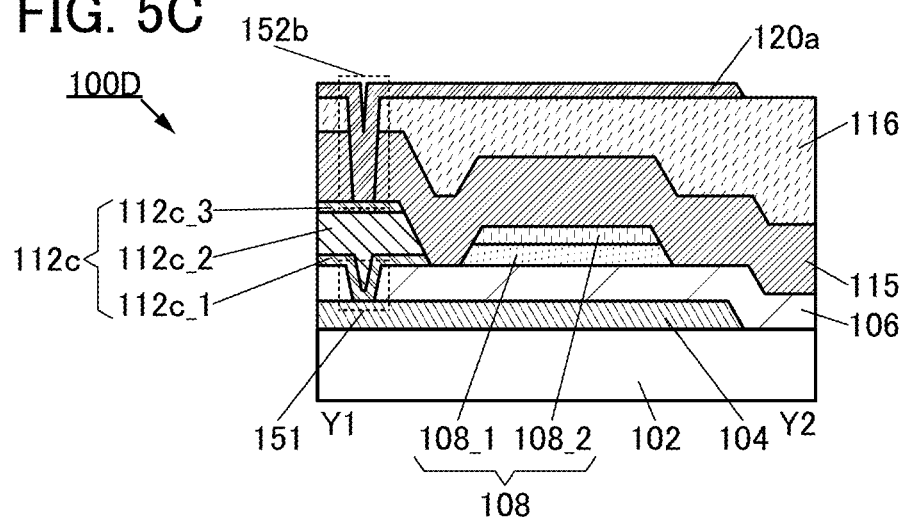

FIG. 5(A) is a top view of a transistor 100D that is a semiconductor device of one embodiment of the present invention, FIG. 5(B) is a cross-sectional view taken along the dashed-dotted line X1-X2 in FIG. 5(A), and FIG. 5(C) is a cross-sectional view taken along the dashed-dotted line Y1-Y2 in FIG. 5(A).

The transistor 100D has a structure in which the conductive films 112a and 112b of the above-described transistor 100B have a stacked-layer structure of three layers.

The conductive film 112a of the transistor 100D includes a conductive film 112a_1, a conductive film 112a_2 over the conductive film 112a_1, and a conductive film 112a_3 over the conductive film 112a_2. The conductive film 112b of the transistor 100D includes a conductive film 112b_1, a conductive film 112b_2 over the conductive film 112b_1, and a conductive film 112b_3 over the conductive film 112b_2.

For example, it is preferable that the conductive film 112a_1, the conductive film 112b_1, the conductive film 112a_3, and the conductive film 112b_3 contain one or more selected from titanium, tungsten, tantalum, molybdenum, indium, gallium, tin, and zinc. Furthermore, it is preferable that the conductive film 112a_2 and the conductive film 112b_2 contain one or more selected from copper, aluminum, and silver.

More specifically, for the conductive film 112a_1, the conductive film 112b_1, the conductive film 112a_3, and the conductive film 112b_3, titanium can be used, and for the conductive film 112a_2 and the conductive film 112b_2, copper can be used.

The above structure is preferable because the wiring resistance of the conductive films 112a and 112b can be reduced and diffusion of copper into the metal oxide 108 can be inhibited. Additionally, the above structure is favorable because the contact resistance between the conductive film 112b and the conductive film 120b can be reduced. The other components of the transistor 100D are similar to those of the transistor 100B described above and have similar effects.

Figure 6A:
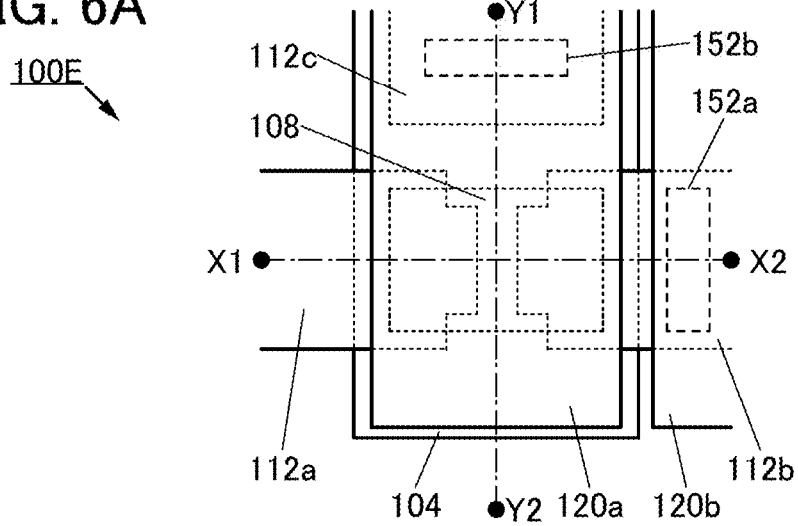
FIGS. 6A-6C are a top view and cross-sectional views illustrating a semiconductor device.
Figure 6B:
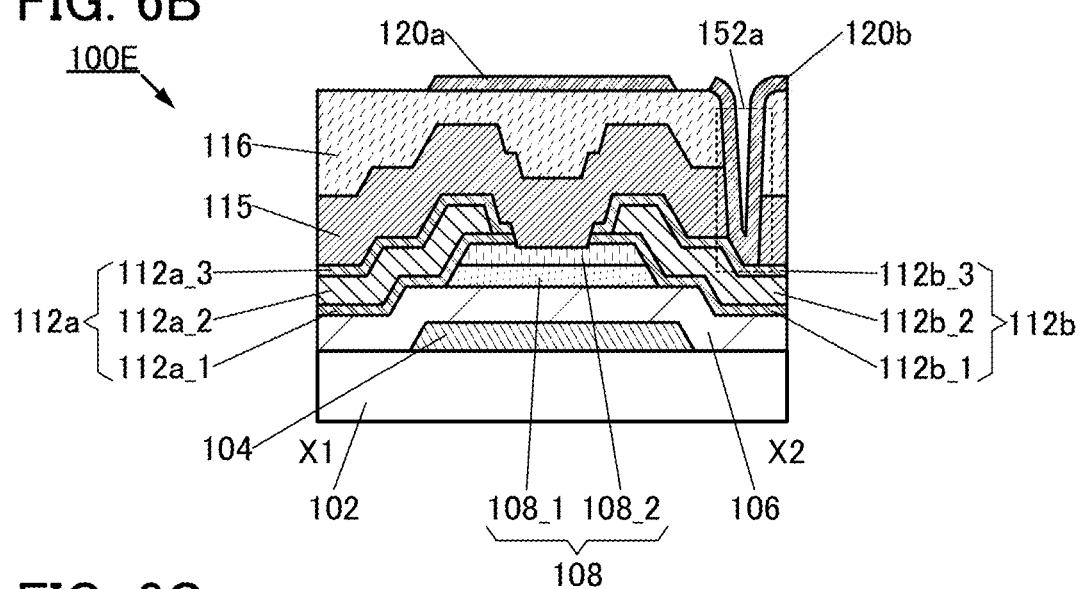
Figure 6C:
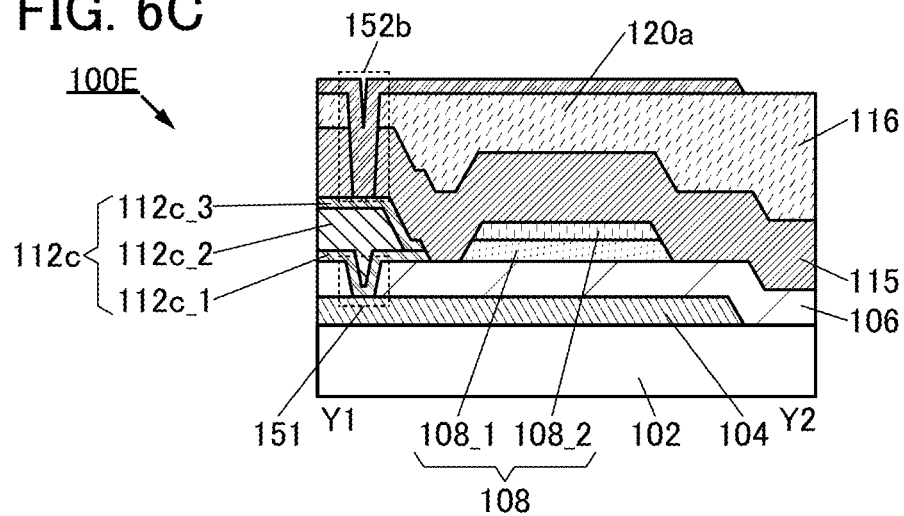

FIG. 6(A) is a top view of a transistor 100E that is a semiconductor device of one embodiment of the present invention, FIG. 6(B) is a cross-sectional view taken along the dashed-dotted line X1-X2 in FIG. 6(A), and FIG. 6(C) is a cross-sectional view taken along the dashed-dotted line Y1-Y2 in FIG. 6(A).

The transistor 100E has a structure in which the conductive films 112a and 112b of the above-described transistor 100B have a stacked-layer structure of three layers. In addition, the transistor 100E is different from the above-described transistor 100D in the shapes of the conductive film 112a and the conductive film 112b.

The conductive film 112a of the transistor 100E includes the conductive film 112a_1, the conductive film 112a_2 over the conductive film 112a_1, and the conductive film 112a_3 over the conductive film 112a_2. The conductive film 112b of the transistor 100E includes the conductive film 112b_1, the conductive film 112b_2 over the conductive film 112b_1, and the conductive film 112b_3 over the conductive film 112b_2. For the conductive film 112a_1, the conductive film 112a_2, the conductive film 112a_3, the conductive film 112b_1, the conductive film 112b_2, and the conductive film 112b_3, any of the above-described materials can be used.

An end portion of the conductive film 112a_1 has a region located outward from an end portion of the conductive film 112a_2; the conductive film 112a_3 covers a top surface and a side surface of the conductive film 112a_2 and has a region that is in contact with the conductive film 112a_1. An end portion of the conductive film 112b_1 has a region located outward from an end portion of the conductive film 112b_2; the conductive film 112b_3 covers a top surface and a side surface of the conductive film 112b_2 and has a region that is in contact with the conductive film 112b_1.

The above structure is preferable because the wiring resistance of the conductive films 112a and 112b can be reduced and diffusion of copper into the metal oxide 108 can be inhibited. Note that diffusion of copper can be more effectively inhibited in the transistor 100E than in the above-described transistor 100D. Additionally, the above structure is favorable because the contact resistance between the conductive film 112b and the conductive film 120b can be reduced. The other components of the transistor 100E are similar to those of the transistor 100B described above and have similar effects.

Figure 7A:
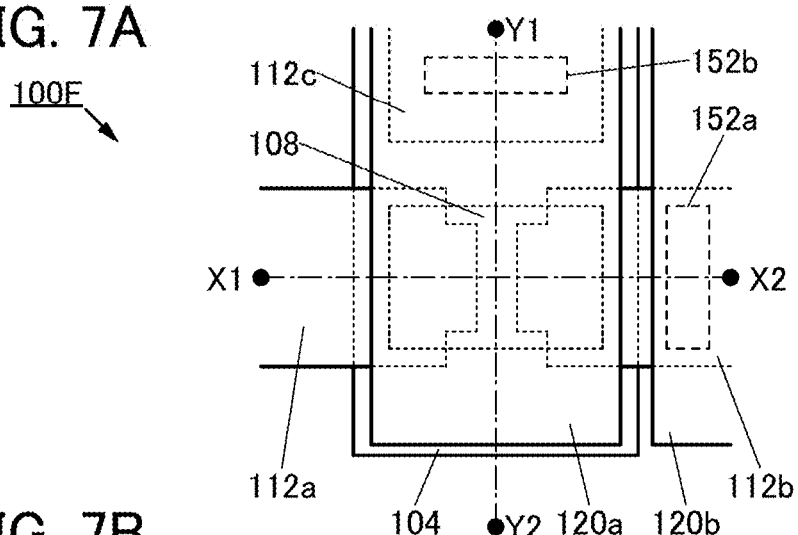
FIGS. 7A-7C are a top view and cross-sectional views illustrating a semiconductor device.
Figure 7B:
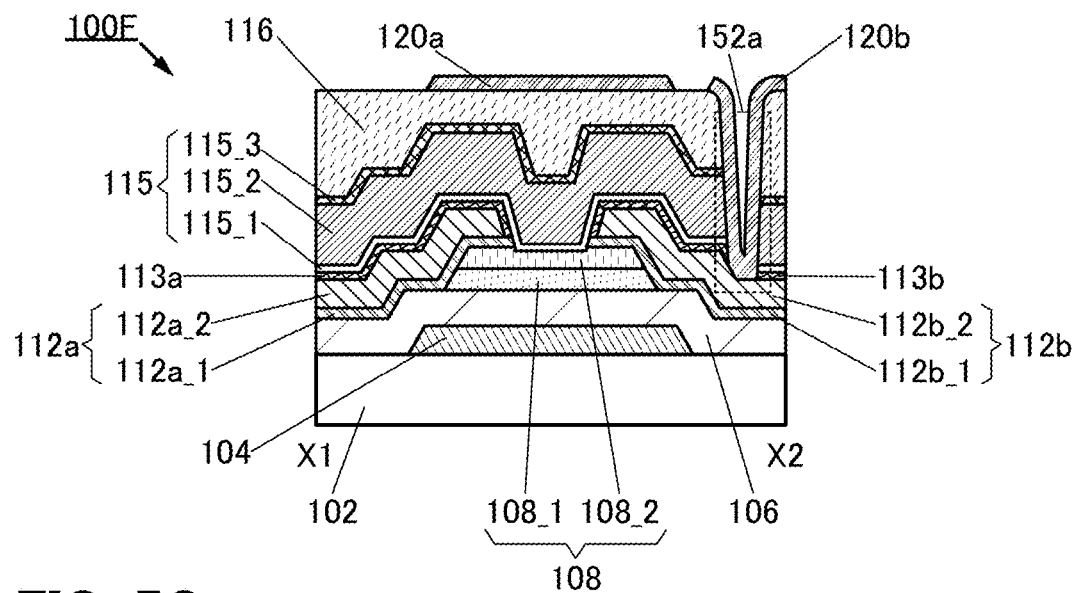
Figure 7C:
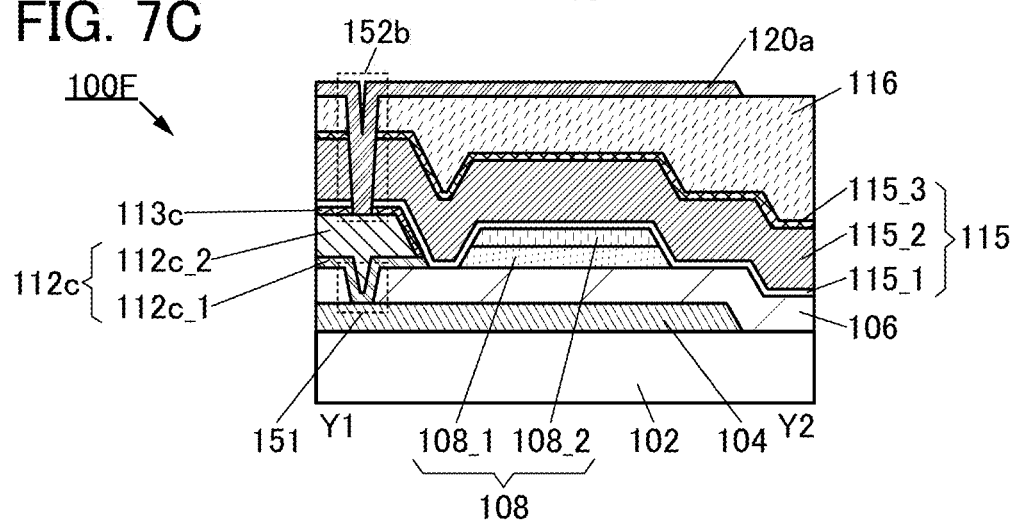

FIG. 7(A) is a top view of a transistor 100F that is a semiconductor device of one embodiment of the present invention, FIG. 7(B) is a cross-sectional view taken along the dashed-dotted line X1-X2 in FIG. 7(A), and FIG. 7(C) is a cross-sectional view taken along the dashed-dotted line Y1-Y2 in FIG. 7(A).

The transistor 100F is different from the above-described transistor 100B in the structures of the conductive films 112a and 112b and the insulating film 115, and in including insulating films 113a and 113b.

The conductive film 112a of the transistor 100F includes the conductive film 112a_1 and the conductive film 112a_2 over the conductive film 112a_1. The conductive film 112a_2 is covered with the insulating film 113a. The conductive film 112b of the transistor 100F includes the conductive film 112b_1 and the conductive film 112b_2 over the conductive film 112b_1. The conductive film 112b_2 is covered with the insulating film 113b.

The insulating films 113a and 113b can be formed using a PA ALD (Plasma Assisted Atomic Layer Deposition) method, for example. Specifically, the insulating films 113a and 113b can be formed in the following manner: the conductive film 112a_2 and the conductive film 112b_2 are formed, and a silane gas or the like is attached to the top surface and the side surface of each of the conductive film 112a_2 and the conductive film 112b_2 by a PA ALD method. Note that the insulating films 113a and 113b each may include part of constituent elements of the conductive film 112a_2 and the conductive film 112b_2. For example, when the conductive film 112a_2 and the conductive film 112b_2 contain copper, silicide containing copper may be formed as the insulating films 113a and 113b.

The insulating film 115 of the transistor 100F includes an insulating film 115_1, an insulating film 115_2 over the insulating film 115_1, and an insulating film 115_3 over the insulating film 115_2. The insulating film 115_1 and the insulating film 115_2 can be layers containing silicon and oxygen, and the insulating film 115_3 can be a layer containing silicon and nitrogen. With such a stacked-layer structure, an effect of reducing defects in the metal oxide 108 and an effect of reducing the diffusion of hydrogen into the metal oxide 108 are added, thereby a reduction in variation of the electrical characteristics of the transistor can be expected.

The other components of the transistor 100F are similar to those of the transistor 100B described above and have similar effects. The structures of the above transistors can be freely combined with each other for the transistor of this embodiment.

<1-7. Method for Manufacturing Semiconductor Device>

Next, a manufacturing method of the transistor 100B that is a semiconductor device of one embodiment of the present invention will be described with reference to FIG. 8 to FIG. 12.

Each figure in FIG. 8 to FIG. 12 are cross-sectional views illustrating the method for manufacturing the semiconductor device. In each figure of FIG. 8 to FIG. 12, the left side figures show the cross-sectional views along the channel length direction, and the right side figures show the cross-sectional views along the channel width direction.

First, a conductive film is formed over the substrate 102 and the conductive film is processed through a lithography process and an etching process, whereby the conductive film 104 functioning as the first gate electrode is formed. Then, the insulating film 106 functioning as the first gate insulating film is formed over the conductive film 104 (see FIG. 8(A)).

In this embodiment, a glass substrate is used as the substrate 102, and as the conductive film 104 functioning as the first gate electrode, a 50-nm-thick titanium film and a 200-nm-thick copper film are each formed by a sputtering method. A 400-nm-thick silicon nitride film as the insulating film 106 is formed by a PECVD method. Then, a 50-nm-thick silicon oxynitride film is formed by a PECVD method.

The above-described silicon nitride film has a stacked-layer structure of three layers of a first silicon nitride film, a second silicon nitride film, and a third silicon nitride film. The stacked-layer structure of three layers can be formed as follows, for example.

The first silicon nitride film can be formed to have a thickness of 50 nm under the conditions where silane at a flow rate of 200 sccm, nitrogen at a flow rate of 2000 sccm, and an ammonia gas at a flow rate of 100 sccm are supplied as source gases to a reaction chamber of a PECVD apparatus, the pressure in the reaction chamber is adjusted to 100 Pa, and a power of 2000 W is supplied using a 27.12 MHz high-frequency power source, for example.

The second silicon nitride film can be formed to have a thickness of 300 nm under the conditions where silane at a flow rate of 200 sccm, nitrogen at a flow rate of 2000 sccm, and an ammonia gas at a flow rate of 2000 sccm are supplied as a source gas to the reaction chamber of the PECVD apparatus, the pressure in the reaction chamber is adjusted to 100 Pa, and the power of 2000 W is supplied using a 27.12 MHz high-frequency power source.

The third silicon nitride film is formed to have a thickness of 50 nm under the conditions where silane at a flow rate of 200 sccm and nitrogen at a flow rate of 5000 sccm are supplied as source gases to the reaction chamber of the PECVD apparatus, the pressure in the reaction chamber is adjusted to 100 Pa, and the power of 2000 W is supplied using a 27.12 MHz high-frequency power source.

The first silicon nitride film, the second silicon nitride film, and the third silicon nitride film can each be formed at a substrate temperature of 350° C. or lower.

When the silicon nitride film has the above-described stacked-layer structure of three layers, in the case where a conductive film containing copper is used for the conductive film 104, the following effects can be obtained, for example.

The first silicon nitride film can inhibit diffusion of copper elements from the conductive film 104. The second silicon nitride film has a function of releasing hydrogen and can improve withstand voltage of the insulating film functioning as a gate insulating film. The third silicon nitride film releases a small amount of hydrogen and the third silicon nitride film can inhibit diffusion of hydrogen released from the second silicon nitride film.

The formation process of the first silicon nitride film and the third silicon nitride film may be omitted by performing treatment with a PA ALD method, in which a silane gas is supplied and evacuated and then plasma is generated with a nitrogen gas, for example, before and after the formation of the second silicon nitride film.

Forming the 50-nm-thick silicon oxynitride film may be omitted. At this time, oxygen plasma treatment is performed on the 400-nm-thick silicon nitride film.

Figure 8A:
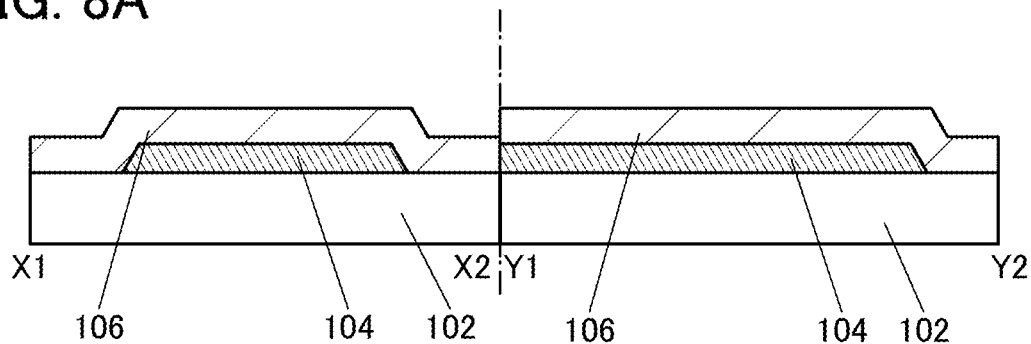
FIGS. 8A-8C are cross-sectional views illustrating a method for manufacturing a semiconductor device.
Figure 8B:
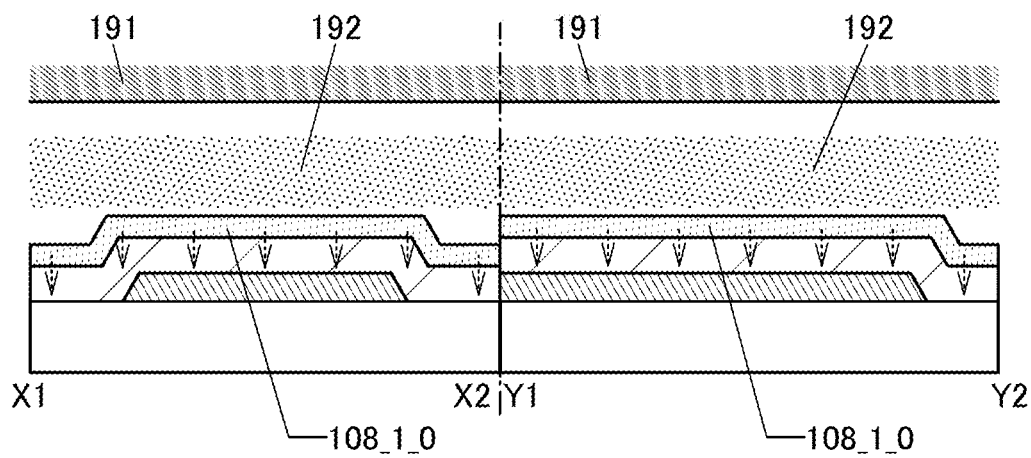

Then, a metal oxide 108_1_0 is formed over the insulating film 106 (see FIG. 8(B)).

FIG. 8(B) is a schematic cross-sectional view illustrating the inside of a deposition apparatus when the metal oxide 108_1_0 is formed over the insulating film 106. In FIG. 8(B), a sputtering apparatus is used as the deposition apparatus, and a target 191 placed inside the sputtering apparatus and plasma 192 formed under the target 191 are schematically illustrated.

In FIG. 8(B), oxygen or excess oxygen added to the insulating film 106 is schematically shown by arrows of broken lines. For example, when an oxygen gas is used in forming the metal oxide 108_1_0, oxygen can be added to the insulating film 106.

The thickness of the metal oxide 108_1_0 is greater than or equal to 1 nm and less than or equal to 50 nm, preferably greater than or equal to 5 nm and less than or equal to 30 nm. The metal oxide 108_1_0 is formed using one or both of an inert gas (typically, an Ar gas) and an oxygen gas. The proportion of the oxygen gas in the whole deposition gas for forming the metal oxide 108_1_0 (hereinafter, also referred to as an oxygen flow rate) is higher than or equal to 0% and lower than 30%, preferably higher than or equal to 5% and lower than or equal to 15%.

When the oxygen flow rate for forming the metal oxide 108_1_0 is set in the above range, the metal oxide 108_1_0 can have lower crystallinity.

In this embodiment, the metal oxide 108_1_0 is formed by a sputtering method using an In—Ga—Zn metal oxide target (In:Ga:Zn=4:2:4.1 [atomic ratio]). The substrate temperature during the formation of the metal oxide 108_1_0 is room temperature, and an argon gas at a flow rate of 180 sccm and an oxygen gas at a flow rate of 20 sccm are used as deposition gases (oxygen flow rate: 10%).

Figure 8C:
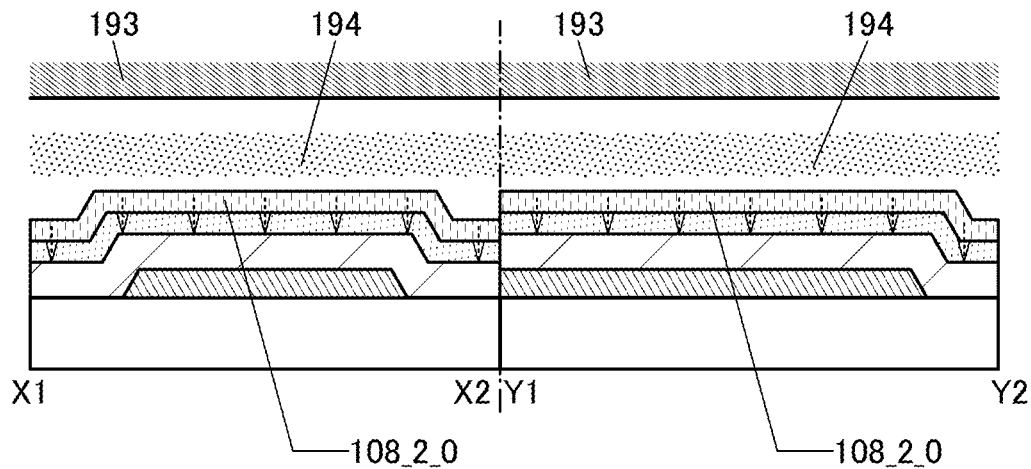

Next, a metal oxide 108_2_0 is formed over the metal oxide 108_1_0 (see FIG. 8(C)).

FIG. 8(C) is a schematic cross-sectional view illustrating the inside of a deposition apparatus when the metal oxide 108_2_0 is formed over the metal oxide 108_1_0. In FIG. 8(C), a sputtering apparatus is used as the deposition apparatus, and a target 193 placed inside the sputtering apparatus and plasma 194 formed under the target 193 are schematically illustrated.

In FIG. 8(C), oxygen or excess oxygen added to the metal oxide 108_1_0 is schematically shown by arrows of broken lines. When an oxygen gas is used in forming the metal oxide 108_2_0, oxygen can be added to the metal oxide 108_1_0.

The thickness of the metal oxide 108_2_0 is greater than 10 nm and less than or equal to 100 nm, preferably greater than or equal to 20 nm and less than or equal to 50 nm. When the metal oxide 108_2_0 is formed, plasma discharge is preferably performed in an atmosphere containing an oxygen gas. When plasma discharge is performed in an atmosphere containing an oxygen gas, oxygen is added to the metal oxide 108_1_0 over which the metal oxide 108_2_0 is to be formed. The oxygen flow rate in forming the metal oxide 108_2_0 is higher than or equal to 30% and lower than or equal to 100%, preferably higher than or equal to 50% and lower than or equal to 100%, further preferably higher than or equal to 70% and lower than or equal to 100%.

By forming the metal oxide 108_2_0 in the above range of the oxygen flow rate, the metal oxide 108_2_0 can have higher crystallinity.

In this embodiment, the metal oxide 108_2_0 is formed by a sputtering method using an In—Ga—Zn metal oxide target (In:Ga:Zn=4:2:4.1 [atomic ratio]). The substrate temperature during the formation of the metal oxide 108_2_0 is room temperature, and an oxygen gas at a flow rate of 200 sccm is used as a deposition gas (oxygen flow rate: 100%).

As described above, the oxygen flow rate for forming the metal oxide 108_2_0 is preferably higher than the oxygen flow rate for forming the metal oxide 108_1_0. In other words, the metal oxide 108_1_0 is preferably formed under a lower oxygen partial pressure than the metal oxide 108_2_0.

When the oxygen flow rate in forming the metal oxide 108_1_0 is different from that in forming the metal oxide 108_2_0, a stacked film having a different crystallinity can be formed.

The metal oxide 108_1_0 and the metal oxide 108_2_0 can each be formed at a substrate temperature of higher than or equal to room temperature (25° C.) and lower than or equal to 200° C., preferably higher than or equal to room temperature and lower than or equal to 130° C. Setting the substrate temperature in the above range is favorable when large glass substrates (e.g., the above-described 8th- or 10th-generation glass substrate) are used. Specifically, when the substrate temperature for forming the metal oxide 108_1_0 and the metal oxide 108_2_0 is set at room temperature, bending or distortion of the substrate can be inhibited. Note that in this specification and the like, room temperature also refers to a temperature of the time when heating is not performed intentionally.

In order to increase the crystallinity of the metal oxide 108_2_0, the substrate temperature in forming the metal oxide 108_2_0 is preferably increased (for example, higher than or equal to 100° C. and lower than or equal to 200° C., preferably 130° C.).

In addition, it is more favorable to successively form the metal oxide 108_1_0 and the metal oxide 108_2_0 in a vacuum because impurities are not caught at each interface.

In addition, increasing the purity of a sputtering gas is necessary. For example, when a gas which is highly purified to have a dew point of −40° C. or lower, preferably −80° C. or lower, further preferably −100° C. or lower, still further preferably −120° C. or lower, is used as the oxygen gas or the argon gas used as the sputtering gas, entry of moisture or the like into the metal oxide can be prevented as much as possible.

In the case where the metal oxide is deposited by a sputtering method, a chamber in a sputtering apparatus is preferably evacuated to be a high vacuum (to the degree of about $5\times10^{-7}$ Pa to $1\times10^{-4}$ Pa) with an adsorption vacuum evacuation pump such as a cryopump in order to remove water or the like, which serves as an impurity for the metal oxide, as much as possible. In particular, the partial pressure of gas molecules corresponding to $H_2O$ (gas molecules corresponding to m/z=18) in the chamber in the standby mode of the sputtering apparatus is preferably lower than or equal to $1\times10^{-4}$ Pa, further preferably lower than or equal to $5\times10^{-5}$ Pa.

Next, the metal oxide 108_1_0 and the metal oxide 108_2_0 are processed into desired shapes, so that the island-shaped metal oxide 108_1 and the island-shaped metal oxide 108_2 are formed. In this embodiment, the metal oxide 108_1 and the metal oxide 108_2 constitute the island-shaped metal oxide 108 (see FIG. 9(A)).

Heat treatment (hereinafter, referred to as first heat treatment) is preferably performed after the metal oxide 108 is formed. By the first heat treatment, hydrogen, water, and the like contained in the metal oxide 108 can be reduced. The heat treatment for reducing hydrogen, water, and the like may be performed before the metal oxide 108 is processed into an island shape. The first heat treatment is one kind of treatment for increasing the purity of the metal oxide.

The first heat treatment can be performed at a temperature of, for example, higher than or equal to 150° C. and lower than the strain point of the substrate, preferably higher than or equal to 200° C. and lower than or equal to 450° C., further preferably higher than or equal to 250° C. and lower than or equal to 350° C.

An electric furnace, an RTA (Rapid Thermal Annealing) apparatus, or the like can be used for the first heat treatment. With the use of an RTA apparatus, the heat treatment can be performed at a temperature higher than or equal to the strain point of the substrate only for a short time. Therefore, the heat treatment time can be shortened. The first heat treatment is performed under an atmosphere of nitrogen, oxygen, ultra-dry air (air with a water content of 20 ppm or less, preferably 1 ppm or less, further preferably 10 ppb or less), or a rare gas (e.g., argon or helium). It is preferable that hydrogen, water, and the like not be contained in nitrogen, oxygen, the ultra-dry air, or the rare gas. After heat treatment performed under a nitrogen or rare gas atmosphere, heating may be additionally performed in an oxygen or ultra-dry air atmosphere. As a result, hydrogen, water, and the like can be released from the metal oxide and oxygen can be supplied to the metal oxide at the same time. Consequently, the amount of oxygen vacancies in the metal oxide can be reduced.

Figure 9A:
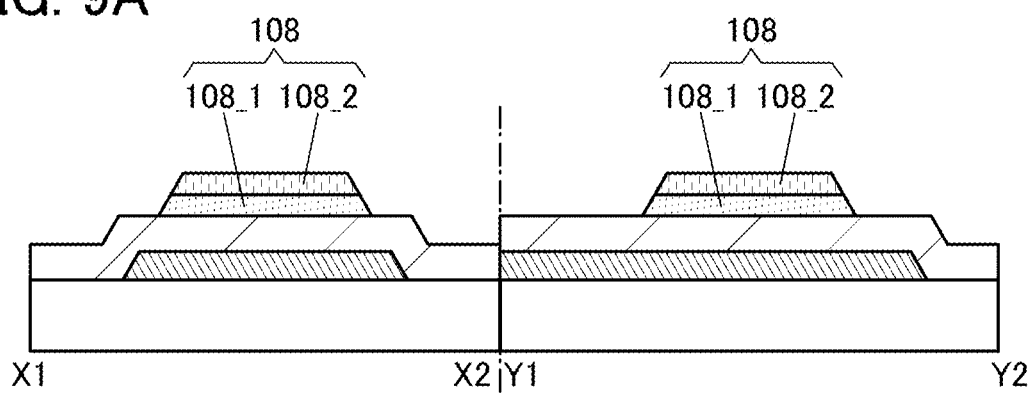
FIGS. 9A-9C are cross-sectional views illustrating a method for manufacturing a semiconductor device.
Figure 9B:
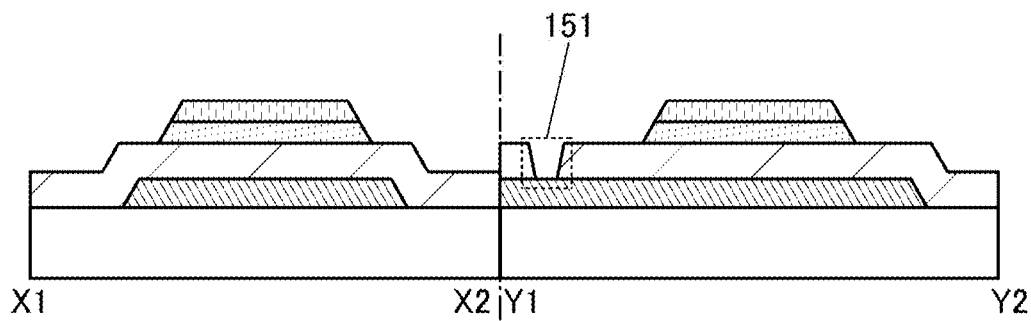

Next, the opening 151 is formed in the insulating film 106 (see FIG. 9(B)).

The opening 151 can be formed by one or both of a wet etching method and a dry etching method. The opening 151 is formed to reach the conductive film 104.

Figure 9C:
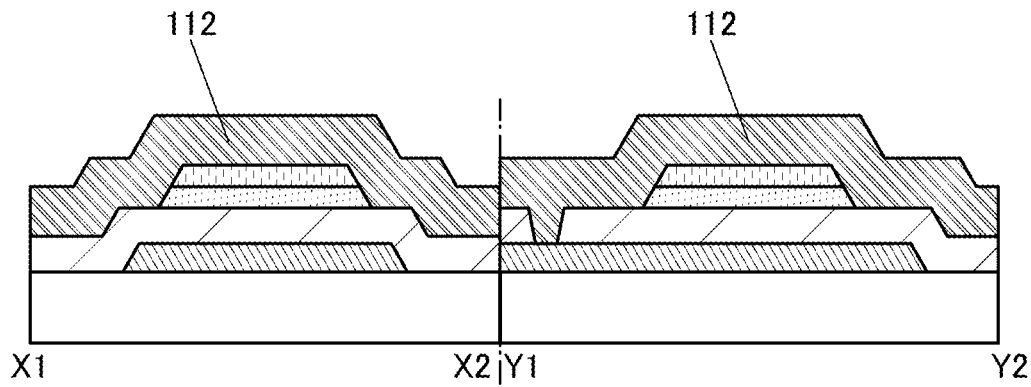

Next, a conductive film 112 is formed over the conductive film 104, the insulating film 106, and the metal oxide 108 (see FIG. 9(C)).

In this embodiment, as the conductive film 112, a 30-nm-thick titanium film and a 200-nm-thick copper film are formed in this order by a sputtering method.

Figure 10A:
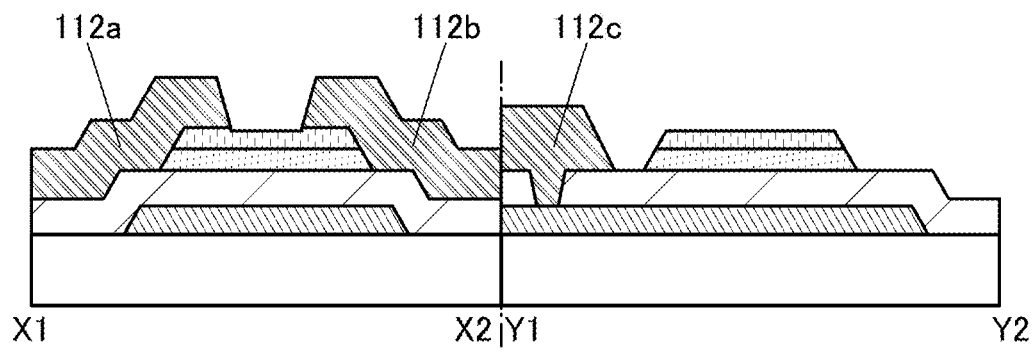
FIGS. 10A-10C are cross-sectional views illustrating a method for manufacturing a semiconductor device.

Next, the conductive film 112 is processed into a desired shape, so that the island-shaped conductive film 112a, the island-shaped conductive film 112b, and the island-shaped conductive film 112c are formed (see FIG. 10(A)).

In this embodiment, the conductive film 112 is processed with a wet etching apparatus. Note that the method of processing the conductive film 112 is not limited to the above-described method, and a dry etching apparatus may be used, for example.

After the conductive films 112a, 112b, and 112c are formed, a surface (on the back channel side) of the metal oxide 108 (specifically, the metal oxide 108_2) may be cleaned. An example of the cleaning method includes cleaning using a chemical solution such as a phosphoric acid. The cleaning using a chemical solution such as a phosphoric acid can remove impurities (e.g., an element included in the conductive films 112a, 112b, and 112c) attached to the surface of the metal oxide 108_2. The cleaning is not necessarily performed, and the cleaning may be omitted depending on the case.

In the step of forming the conductive films 112a, 112b, and 112c and/or the cleaning step, the thickness of a region of the metal oxide 108 which is not covered with the conductive films 112a and 112b might be reduced.

In the semiconductor device of one embodiment of the present invention, the region not covered with the conductive films 112a and 112b, i.e., the metal oxide 108_2, is a metal oxide with increased crystallinity. Impurities, in particular, constituent elements used in the conductive films 112a and 112b, are not easily diffused into a metal oxide with high crystallinity. Accordingly, a highly reliable semiconductor device can be provided.

Although FIG. 10(A) illustrates an example in which the surface of the metal oxide 108 not covered with the conductive films 112a and 112b, that is, the surface of the metal oxide 108_2, has a depression, one embodiment of the present invention is not limited to this and the surface of the metal oxide 108 not covered with the conductive films 112a and 112b does not necessarily have a depression.

Next, the insulating film 115 is formed over the metal oxide 108 and the conductive films 112a and 112b. The insulating film 115 preferably has a stacked-layer structure including a layer containing silicon and oxygen in contact with the metal oxide 108 and a layer containing silicon and nitrogen. A method for manufacturing the insulating film 115 is described below.

Figure 10B:
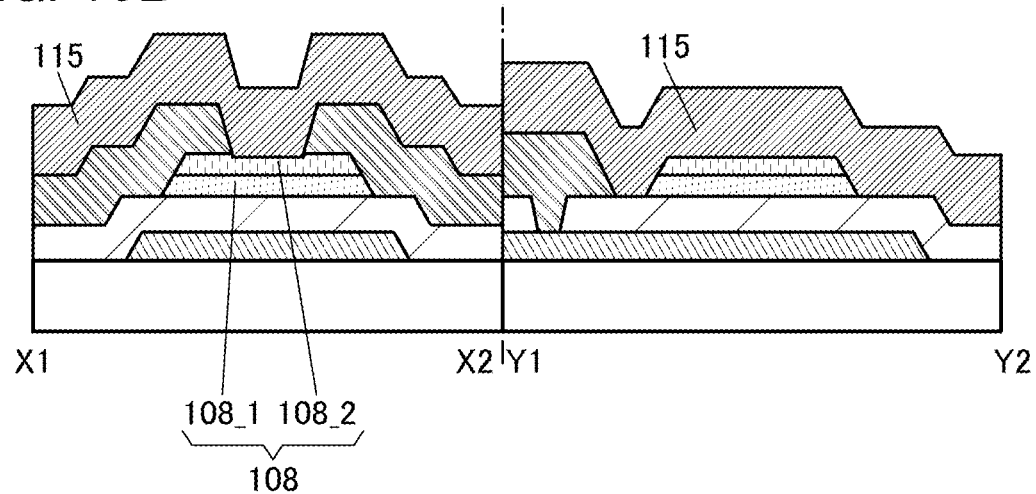

In the case of the transistor 100B, the insulating film 115_2 described later is formed as the insulating film 115 (FIG. 10(B)).

Figure 10C:
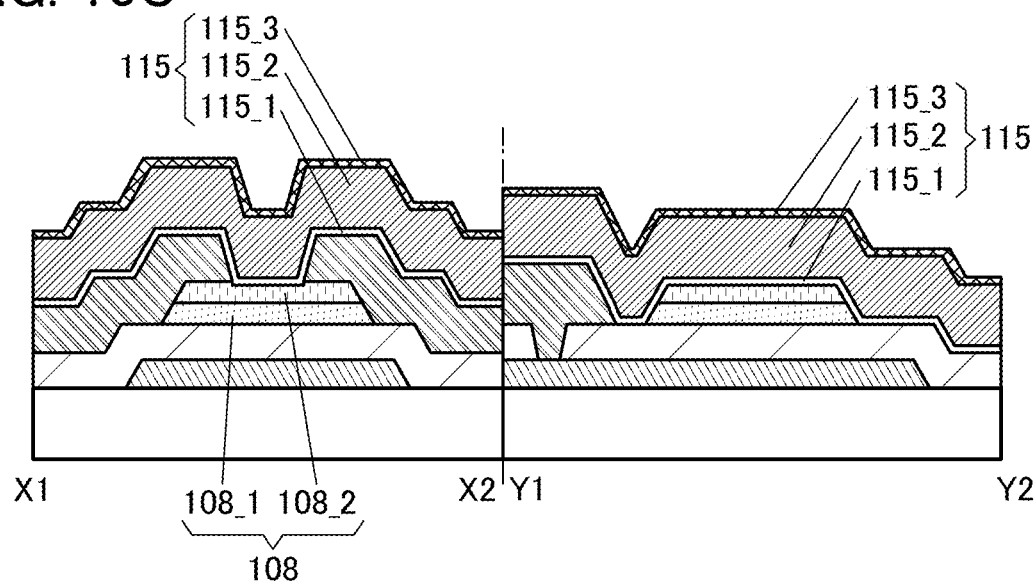

In the case of the transistor 100F, the insulating film 115_1, the insulating film 115_2, and the insulating film 115_3 are formed (see FIG. 10(C)).

[Insulating Film 1 Functioning as Protective Insulating Film]

The insulating films 115_1 and 115_2 have one or both of a function as a protective insulating film for the transistor and a function of supplying oxygen to the metal oxide 108. That is, the insulating films 115_1 and 115_2 contain oxygen. Furthermore, the insulating film 115_1 is an insulating film which can transmit oxygen. The insulating film 115_1 also functions as a film that softens damage to the metal oxide 108 at the time of forming the insulating film 115_2 to be formed later.

A silicon oxide, a silicon oxynitride, or the like with a thickness greater than or equal to 5 nm and less than or equal to 150 nm, preferably greater than or equal to 5 nm and less than or equal to 50 nm can be used as the insulating film 115_1.

It is preferable that the number of defects in the insulating film 115_1 be small, and typically, in an ESR measurement, the spin density of a signal that appears at g=2.001 due to a dangling bond of silicon be lower than or equal to $3 \times 10^{17}$ spins/cm$^3$. This is because if the density of defects in the insulating film 115_1 is high, oxygen is bonded to the defects and the property of transmitting oxygen of the insulating film 115_1 is lowered.

In the insulating film 115_1, not all oxygen entering the insulating film 115_1 from the outside moves to the outside of the insulating film 115_1 and some oxygen remains in the insulating film 115_1. Furthermore, movement of oxygen may occur in the insulating film 115_1 in such a manner that oxygen enters the insulating film 115_1 and oxygen contained in the insulating film 115_1 moves to the outside of the insulating film 115_1. When an oxide insulating film that can transmit oxygen is formed as the insulating film 115_1, oxygen released from the insulating film 115_2 provided over the insulating film 115_1 can be moved to the metal oxide 108 through the insulating film 115_1.

The insulating film 115_1 can be formed with an oxide insulating film having a low density of states due to nitrogen oxide. The density of states due to the nitrogen oxide can be formed between the energy of the valence band maximum of the metal oxide film (Ev_os) and the energy of the conduction band minimum of the metal oxide film (Ec_os). A silicon oxynitride film that releases less nitrogen oxide, an aluminum oxynitride film that releases less nitrogen oxide, or the like can be used as the above oxide insulating film.

A silicon oxynitride film that releases less nitrogen oxide is a film which releases ammonia more than nitrogen oxide in thermal desorption spectroscopy (TDS); the amount of released ammonia is typically greater than or equal to $1 \times 10^{18}$/cm$^3$ and less than or equal to $5 \times 10^{19}$/cm$^3$. Note that the amount of released ammonia is the amount of ammonia released by heat treatment by which the surface temperature of a film becomes higher than or equal to 50° C. and lower than or equal to 650° C., preferably higher than or equal to 50° C. and lower than or equal to 550° C.

Nitrogen oxide (NO$_x$; x is greater than 0 and less than or equal to 2, preferably greater than or equal to 1 and less than or equal to 2), typically NO$_2$ or NO, forms states in the insulating film 115_1 or the like. The states are positioned in the energy gap of the metal oxide 108. Therefore, when nitrogen oxide is diffused into the interface between the insulating film 115_1 and the metal oxide 108, electrons may be trapped by the state on the insulating film 115_1 side. As a result, the trapped electrons remain in the vicinity of the interface between the insulating film 115_1 and the metal oxide 108; thus, the threshold voltage of the transistor is shifted in the positive direction.

Nitrogen oxide reacts with ammonia and oxygen in heat treatment. Since nitrogen oxide contained in the insulating film 115_1 reacts with ammonia contained in the insulating film 115_2 in heat treatment, the amount of nitrogen oxide contained in the insulating film 115_1 is reduced. Therefore, electrons are hardly trapped at the interface between the insulating film 115_1 and the metal oxide 108.

The use of the above oxide insulating film as the insulating film 115_1 can reduce the shift in the threshold voltage of the transistor, which reduces change in the electrical characteristics of the transistor.

Furthermore, the nitrogen concentration of the above oxide insulating film measured by SIMS is lower than or equal to $6 \times 10^{20}$ atoms/cm$^3$.

The above oxide insulating film is formed by a PECVD method with the use of silane and dinitrogen monoxide at a substrate temperature higher than or equal to 220° C. and lower than or equal to 350° C., whereby a dense and hard film can be formed.

The insulating film 115_2 is an oxide insulating film which contains oxygen at a proportion higher than the stoichiometric composition. Part of oxygen is released from the above oxide insulating film by heating. The above oxide insulating film includes a region in which the amount of oxygen released from the oxide insulating film is more than or equal to $1.0 \times 10^{19}$ atoms/cm$^3$, preferably more than or equal to $3.0 \times 10^{20}$ atoms/cm$^3$ in TDS. The amount of released oxygen described above is the total amount of oxygen released by heat treatment in TDS at a temperature higher than or equal to 50° C. and lower than or equal to 650° C., or higher than or equal to 50° C. and lower than or equal to 550° C. In addition, the amount of released oxygen is the total amount of released oxygen converted into oxygen atoms in TDS.

A silicon oxide, a silicon oxynitride, or the like with a thickness greater than or equal to 30 nm and less than or equal to 500 nm, preferably greater than or equal to 50 nm and less than or equal to 400 nm can be used as the insulating film 115_2.

It is preferable that the number of defects in the insulating film 115_2 be small, and typically, in the ESR measurement, the spin density of a signal that appears at g=2.001 due to a dangling bond of silicon be lower than $1.5 \times 10^{18}$ spins/cm$^3$, further preferably lower than or equal to $1 \times 10^{18}$ spins/cm$^3$. Note that the insulating film 115_2 is provided more apart from the metal oxide 108 than the insulating film 115_1 is;

thus, the insulating film 115_2 may have higher density of defects than the insulating film 115_1.

The insulating films 115_1 and 115_2 can be formed from insulating films of the same kinds of materials; thus, a boundary between the insulating film 115_1 and the insulating film 115_2 cannot be clearly observed in some cases. Therefore, in this embodiment, the boundary between the insulating film 115_1 and the insulating film 115_2 is shown by a dashed line.

[Insulating Film 2 Functioning as Protective Insulating Film]

The insulating film 115_3 functions as a protective insulating film for the transistor.

The insulating film 115_3 contains one or both of hydrogen and nitrogen. Alternatively, the insulating film 115_3 contains nitrogen and silicon. The insulating film 115_3 has a function of blocking oxygen, hydrogen, water, alkali metal, alkaline earth metal, or the like. It is possible to prevent outward diffusion of oxygen from the metal oxide 108, outward diffusion of oxygen contained in the insulating films 115_1 and 115_2, and entry of hydrogen, water, or the like into the metal oxide 108 from the outside by providing the insulating film 115_3.

A nitride insulating film can be used as the insulating film 115_3, for example. The nitride insulating film is formed from silicon nitride, silicon nitride oxide, aluminum nitride, aluminum nitride oxide, or the like.

Although the above-described variety of films such as the conductive films, the insulating films, the metal oxide film, and the metal film can be formed by a sputtering method or a PECVD method, they may be formed by another method, e.g., a thermal CVD (Chemical Vapor Deposition) method. Examples of a thermal CVD method include an MOCVD (Metal Organic Chemical Vapor Deposition) method and an ALD (Atomic Layer Deposition) method.

A thermal CVD method, which is a deposition method not using plasma, has an advantage that no defect due to plasma damage is generated. In a thermal CVD method, a source gas is introduced into a chamber, the chamber is set at an atmospheric pressure or a reduced pressure, and a film is deposited on a substrate.

Furthermore, in an ALD method, a source gas is introduced into a chamber, the chamber is set at an atmospheric pressure or a reduced pressure, and a film is deposited on a substrate.

Although the insulating films 115_1, 115_2, and 115_3 are described as the insulating film 115 in this embodiment, the insulating film 115 is not limited to them, and may have a stacked-layer structure including an insulating film having a different composition or formed by a different depositing method.

Figure 11A:
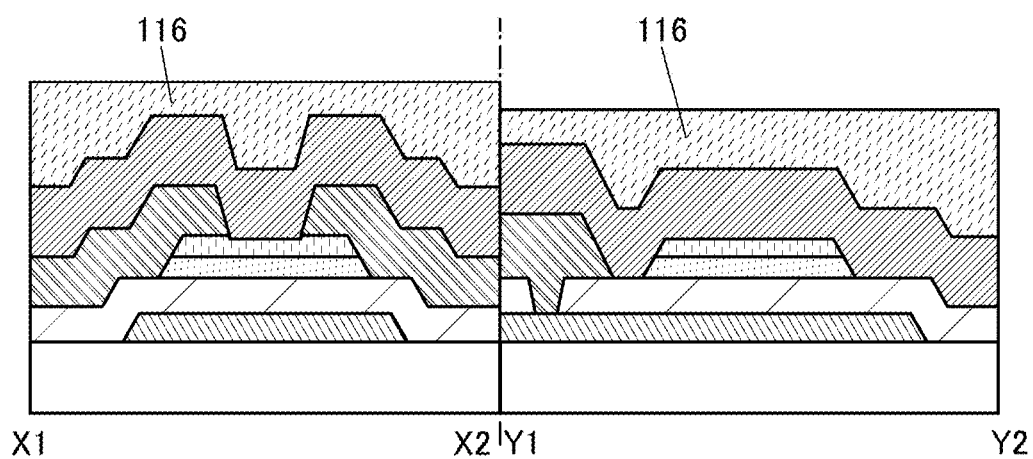
FIGS. 11A and 11B are cross-sectional views illustrating a method for manufacturing a semiconductor device.

Next, the insulating film 116 is formed over the insulating film 115 (see FIG. 11(A)).

For example, as the insulating film 116, a planarization insulating film of an acrylic resin or the like is formed by a spin coater, a slit coater, or the like.

Heat treatment (hereinafter, referred to as second heat treatment) is preferably performed after the insulating film 116 is formed. By the second heat treatment, part of oxygen contained in the insulating film 115 can be transferred to the metal oxide 108, so that the amount of oxygen vacancies included in the metal oxide 108 can be reduced.

The temperature of the second heat treatment is typically lower than 400° C., preferably lower than 375° C., further preferably higher than or equal to 150° C. and lower than or equal to 350° C. The second heat treatment is performed under an atmosphere of nitrogen, oxygen, ultra-dry air (air with a water content of 20 ppm or less, preferably 1 ppm or less, further preferably 10 ppb or less), or a rare gas (e.g., argon or helium). Note that an electric furnace, an RTA apparatus, or the like can be used for the heat treatment, in which it is preferable that hydrogen, water, and the like not be contained in nitrogen, oxygen, the ultra-dry air, or the rare gas.

Figure 11B:
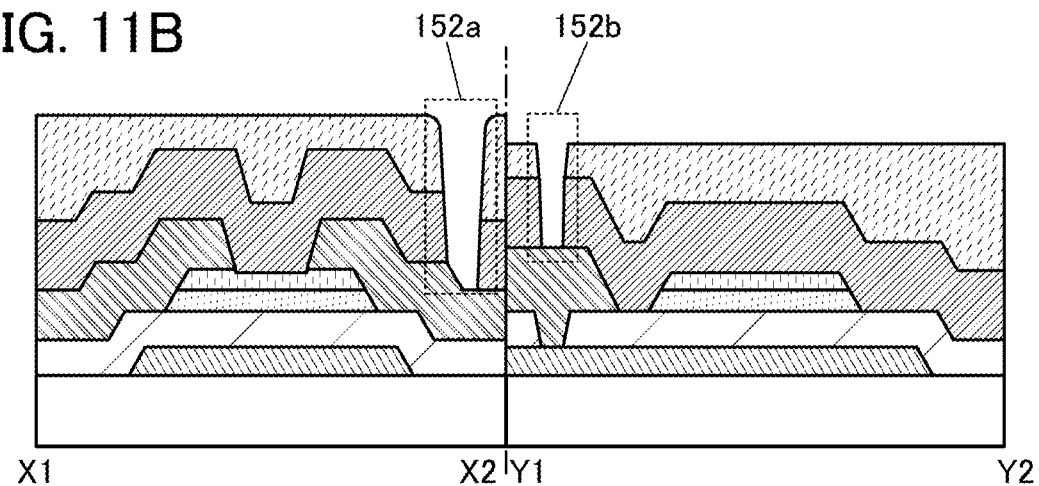

Next, the openings 152a and 152b are formed in desired regions in the insulating film 115 and the insulating film 116 (see FIG. 11(B)).

The openings 152a and 152b can be formed by one or both of a wet etching method and a dry etching method. The opening 152a is formed to reach the conductive film 112b, and the opening 152b is formed to reach the conductive film 112c.

Figure 12A:
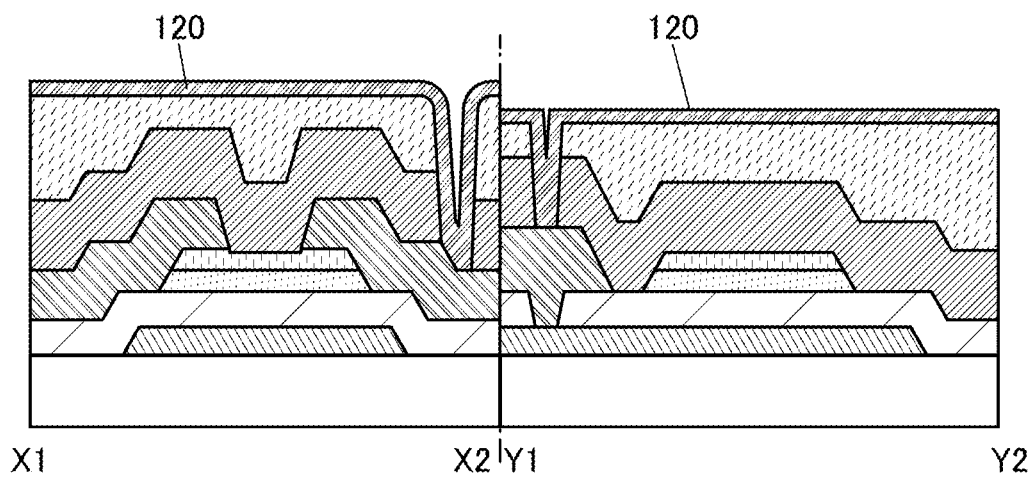
FIGS. 12A and 12B are cross-sectional views illustrating a method for manufacturing a semiconductor device.

Next, a conductive film 120 is formed over the insulating film 116 to cover the openings 152a and 152b (see FIG. 12(A)).

As the conductive film 120, an oxide conductive film or the like is formed by a sputtering method. For the oxide conductive film, In—Sn oxide, In—Sn—Si oxide, In—Zn oxide, In—Ga—Zn oxide, or the like can be used.

Figure 12B:
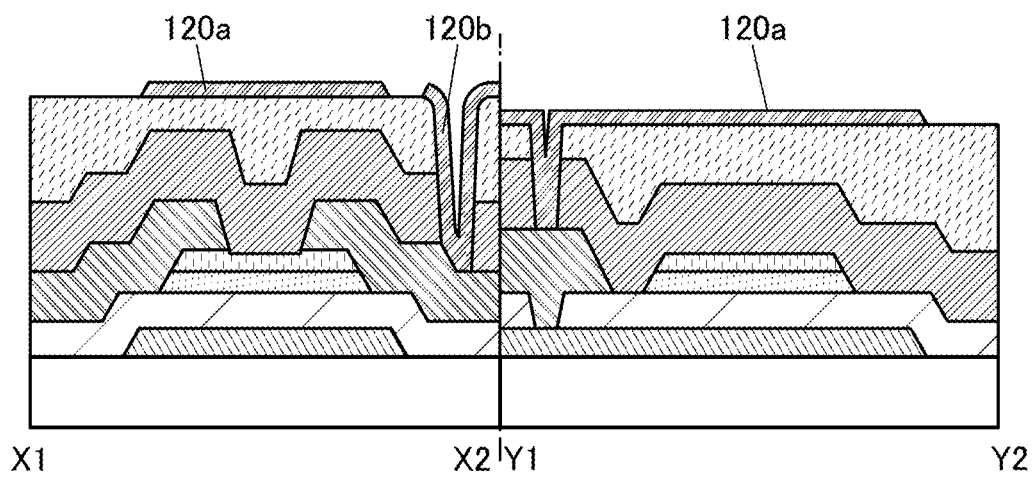

Next, the conductive film 120 is processed into a desired shape, so that an island-shaped conductive film 120a and an island-shaped conductive film 120b are formed (see FIG. 12(B)).

In this embodiment, the conductive film 120 is processed with a wet etching apparatus.

After the conductive films 120a and 120b are formed, heat treatment similar to the first heat treatment or the second heat treatment (hereinafter, referred to as third heat treatment) may be performed.

By the third heat treatment, oxygen contained in the insulating film 115 moves into the metal oxide 108 to fill the oxygen vacancies in the metal oxide 108.

Through the above process, the transistor 100B illustrated in FIGS. 3(A), 3(B), and 3(C) can be manufactured. That is, a semiconductor device which has the transistor characteristics with little variation using a metal oxide can be provided. Alternatively, a semiconductor device having excellent normally-off switching characteristics using a metal oxide can be provided. Alternatively, a semiconductor device which has high field-effect mobility using a metal oxide can be provided. Alternatively, a semiconductor device which is formed using a minute island-shaped pattern using a metal oxide material can be provided.

At least part of this embodiment can be implemented in combination with the other embodiments described in this specification as appropriate.

Embodiment 2

In this embodiment, a metal oxide that can be used for a semiconductor film of one embodiment of the present invention is described.

<2-1. Metal Oxide>

Among metal oxides, an oxide semiconductor is described below.

Oxide semiconductors are classified into a single-crystal oxide semiconductor and a non-single-crystal oxide semiconductor. Examples of a non-single-crystal oxide semiconductor include a CAC-OS (Cloud-Aligned Composite-Oxide Semiconductor), a CAAC-OS (C-axis Aligned Crystalline-Oxide Semiconductor), a polycrystalline oxide semiconductor, an nc-OS (nanocrystalline oxide semiconductor), an amorphous-like oxide semiconductor (a-like OS), and an amorphous oxide semiconductor. Among the non-single-crystal structures, the amorphous structure has the highest density of defect states, whereas the CAAC-OS has the lowest density of defect states.

Note that CAAC refers to an example of a crystal structure, and CAC refers to an example of a function or a material composition. In this specification and the like, a CAC-OS or a CAC-metal oxide has a conducting function in a part of the material and has an insulating function in another part of the material, and has a function of a semiconductor as the whole material. Note that in the case where the CAC-OS or the CAC-metal oxide is used in an active layer of a transistor, the conducting function is a function that allows electrons (or holes) serving as carriers to flow, and the insulating function is a function that does not allow electrons serving as carriers to flow. By the complementary action of the conducting function and the insulating function, a switching function (On/Off function) can be given to the CAC-OS or the CAC-metal oxide. In the CAC-OS or the CAC-metal oxide, separation of the functions can maximize each function.

In this specification and the like, the CAC-OS or the CAC-metal oxide includes conductive regions and insulating regions. The conductive regions have the above-described conducting function, and the insulating regions have the above-described insulating function. In some cases, the conductive regions and the insulating regions in the material are separated at the nanoparticle level. In some cases, the conductive regions and the insulating regions are unevenly distributed in the material. The conductive regions are observed to be coupled in a cloud-like manner with their boundaries blurred, in some cases.

The CAC-OS or the CAC-metal oxide is composed of components having different band gaps. For example, the CAC-OS or the CAC-metal oxide is composed of a component having a wide gap due to the insulating region and a component having a narrow gap due to the conductive region. When carriers flow in such a composition, carriers mainly flow in the component having a narrow gap. The component having a narrow gap complements the component having a wide gap, and carriers also flow in the component having a wide gap in conjunction with the component having a narrow gap. Therefore, in the case where the above-described CAC-OS or CAC-metal oxide is used in a channel formation region of a transistor, high current drive capability in the on state of the transistor, that is, high on-state current and high field-effect mobility, can be obtained.

In other words, the CAC-OS or the CAC-metal oxide can be referred to as a matrix composite or a metal matrix composite.

First, a composition of the CAC-OS that is one kind of metal oxide is described with reference to FIG. 14 and FIG. 15. Note that FIG. 14 and FIG. 15 are schematic cross-sectional views each showing a concept of the CAC-OS.

<2-2. Composition of CAC-OS>

Figure 14:
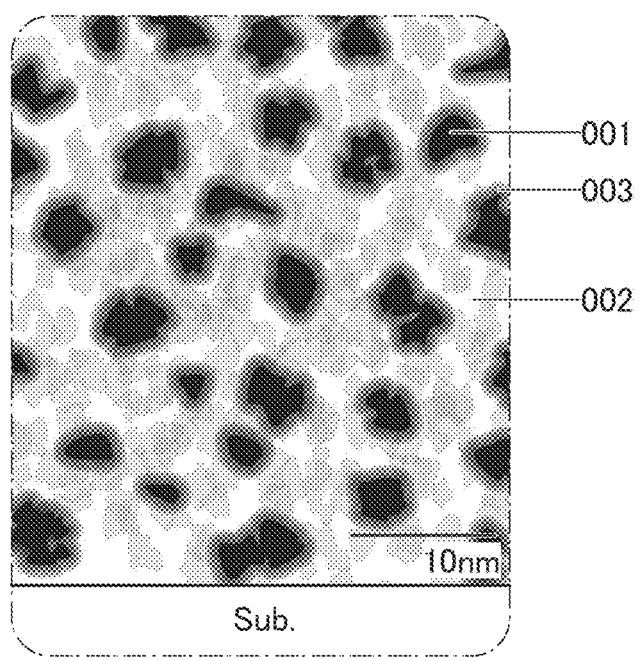
FIG. 14 is a cross-sectional view illustrating a concept of a composition of a metal oxide.
Figure 15:
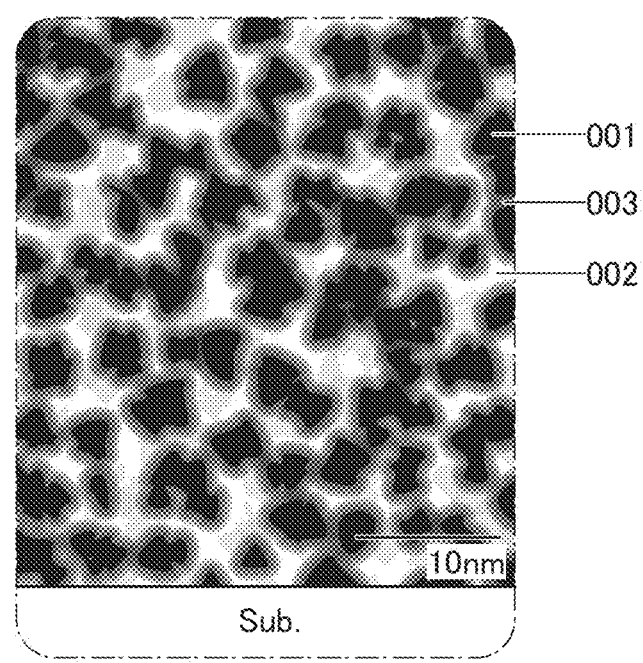
FIG. 15 is a cross-sectional view illustrating a concept of a composition of a metal oxide.

For example, in the CAC-OS, as shown in FIG. 14, elements constituting the metal oxide are unevenly distributed, regions 001, regions 002, and regions 003 containing the respective elements as their main components are formed, and the regions are mixed to form a mosaic pattern. In other words, the CAC-OS has a composition of a material in which elements constituting a metal oxide are unevenly distributed with a size greater than or equal to 0.5 nm and less than or equal to 10 nm, preferably greater than or equal to 1 nm and less than or equal to 2 nm, or a similar size. Note that in the following description of a metal oxide, a state in which one or more metal elements are unevenly distributed and regions containing the metal element(s) are mixed with a size greater than or equal to 0.5 nm and less than or equal to 10 nm, preferably greater than or equal to 1 nm and less than or equal to 2 nm, or a similar size is referred to as a mosaic pattern or a patch-like pattern.

Note that a metal oxide preferably contains at least indium. In particular, indium and zinc are preferably contained. In addition to them, an element M (M is gallium, aluminum, silicon, boron, yttrium, tin, copper, vanadium, beryllium, titanium, iron, nickel, germanium, zirconium, molybdenum, lanthanum, cerium, neodymium, hafnium, tantalum, tungsten, or magnesium) may be contained.

For example, an In-M-Zn oxide with the CAC-OS composition has a composition in which materials are separated into indium oxide (hereinafter, referred to as $InO_{X1}$ ($X1$ is a real number greater than 0)) or indium zinc oxide (hereinafter, referred to as $In_{X2}Zn_{Y2}O_{Z2}$ ($X2$, $Y2$, and $Z2$ are real numbers greater than 0)), and an oxide of the element M (hereinafter, referred to as $MO_{X3}$ ($X3$ is a real number greater than 0)) or a zinc oxide of the element M (hereinafter, referred to as $M_{X4}Zn_{Y4}O_{Z4}$ ($X4$, $Y4$, and $Z4$ are real numbers greater than 0)), and thus a mosaic pattern is formed, and has a composition in which $InO_{X1}$ or $In_{X2}Zn_{Y2}O_{Z2}$ forming the mosaic pattern is distributed in the film (hereinafter, also referred to as a cloud-like pattern).

A concept shown in FIG. 14 is assumed to be an In-M-Zn oxide with the CAC-OS composition. In that case, it can be said that the region 001 is a region containing $MO_{X3}$ as a main component, the region 002 is a region containing $In_{X2}Zn_{Y2}O_{Z2}$ or $InO_{X1}$ as a main component, and the region 003 is a region containing at least Zn. At that time, surrounding portions of the region containing $MO_{X3}$ as a main component, the region containing $In_{X2}Zn_{Y2}O_{Z2}$ or $InO_{X1}$ as a main component, and the region containing at least Zn are unclear (blurred), so that the boundaries are not clearly observed in some cases.

In other words, the In-M-Zn oxide with the CAC-OS composition is a metal oxide in which the region containing $MO_{X3}$ as a main component and the region containing $In_{X2}Zn_{Y2}O_{Z2}$ or $InO_{X1}$ as a main component are mixed. Accordingly, the metal oxide is referred to as a composite metal oxide in some cases. Note that in this specification, for example, when the atomic ratio of In to the element M in the region 002 is greater than the atomic ratio of In to the element M in the region 001, the region 002 has higher In concentration than the region 001.

Note that in the metal oxide with the CAC-OS composition, a stacked-layer structure including two or more kinds of films with different compositions is not included. For example, a two-layer structure of a film containing In as a main component and a film containing Ga as a main component is not included.

Specifically, of the CAC-OS, a CAC-OS in an In—Ga—Zn oxide (an In—Ga—Zn oxide in the CAC-OS may be particularly referred to as CAC-IGZO) is described. A CAC-OS in an In—Ga—Zn oxide is a metal oxide in which materials are separated into $InO_{X1}$ or $In_{X2}Zn_{Y2}O_{Z2}$, and gallium oxide (hereinafter, referred to as $GaO_{X5}$ ($X5$ is a real number greater than 0)) or gallium zinc oxide (hereinafter, referred to as $Ga_{X6}Zn_{Y6}O_{Z6}$ ($X6$, $Y6$, and $Z6$ are real numbers greater than 0)), for example, and thus a mosaic pattern is formed, and $InO_{X1}$ or $In_{X2}Zn_{Y2}O_{Z2}$ forming the mosaic pattern has a cloud-like pattern.

In other words, the CAC-OS in an In—Ga—Zn oxide is a composite metal oxide having a composition in which a region containing $GaO_{X5}$ as a main component and a region containing $In_{X2}Zn_{Y2}O_{Z2}$ or $InO_{X1}$ as a main component are mixed. Surrounding portions of the region containing $GaO_{X5}$ as a main component and the region containing $In_{X2}Zn_{Y2}O_{Z2}$ or $InO_{X1}$ as a main component are unclear (blurred), so that boundaries are not clearly observed in some cases.

Note that the sizes of the region 001 to the region 003 can be measured by EDX mapping. For example, the diameter of the region 001 is observed to be greater than or equal to 0.5 nm and less than or equal to 10 nm, or greater than or equal to 1 nm and less than or equal to 2 nm in the EDX mapping image of a cross section in some cases. The density of an element that is a main component is gradually lowered from the central portion of the region toward the surrounding portion. For example, when the number (hereinafter, also referred to as abundance) of elements countable in the EDX mapping gradually changes from the central portion toward the surrounding portion, the surrounding portion of the region is observed to be unclear (blurred) in the EDX mapping image of the cross section. For example, from the central portion toward the surrounding portion in the region containing $GaO_{X5}$ as a main component, the number of Ga atoms gradually decreases and the number of Zn atoms gradually increases instead, so that the region gradually changes into the region containing $Ga_{X6}Zn_{Y6}O_{Z6}$ as a main component. Accordingly, the surrounding portion of the region containing $GaO_{X5}$ as a main component is observed to be unclear (blurred) in the EDX mapping.

Note that IGZO is a common name and sometimes refers to a compound containing In, Ga, Zn, and O. Typical examples include crystalline compounds represented by $InGaO_3(ZnO)_{m1}$ (m1 is a natural number) and $In_{(1+x0)}Ga_{(1-x0)}O_3(ZnO)_{m0}$ ($-1 \leq x0 \leq 1$; m0 is a given number).

The above crystalline compounds have a single-crystal structure, a polycrystalline structure, or a CAAC (c-axis aligned crystalline) structure. Note that the CAAC structure is a layered crystal structure in which a plurality of IGZO nanocrystals have c-axis alignment and are connected in the a-b plane direction without alignment.

In this specification and the like, CAC-IGZO can be defined as a metal oxide containing In, Ga, Zn, and O in the state where a plurality of regions containing Ga as a main component and a plurality of regions containing In as a main component are each dispersed randomly in a mosaic pattern.

For example, in the conceptual view shown in FIG. 14, the region 001 corresponds to the region containing Ga as a main component and the region 002 corresponds to the region containing In as a main component. Furthermore, in the conceptual view shown in FIG. 14, the region 003 corresponds to a region containing zinc. Note that the region containing Ga as a main component and the region containing In as a main component may each be referred to as a nanoparticle. The diameter of the nanoparticle is greater than or equal to 0.5 nm and less than or equal to 10 nm, typically greater than or equal to 1 nm and less than or equal to 2 nm. Surrounding portions of the nanoparticles are unclear (blurred), so that boundaries are not clearly observed in some cases.

FIG. 15 is a modification example of the conceptual view shown in FIG. 14. As shown in FIG. 15, the region 001, the region 002, and the region 003 have different shapes or densities depending on the formation conditions of the metal oxide in some cases.

Note that the crystallinity of the CAC-OS in an In—Ga—Zn oxide can be analyzed by electron diffraction. For example, a ring-like region with high luminance is observed in an electron diffraction pattern image. Furthermore, a plurality of spots are observed in the ring-like region in some cases.

As described above, the CAC-OS in the In—Ga—Zn oxide has a structure different from that of an IGZO compound in which metal elements are evenly distributed, and has characteristics different from those of the IGZO compound. That is, in the CAC-OS in the In—Ga—Zn oxide, regions containing $GaO_{X5}$ or the like as a main component and regions containing $In_{X2}Zn_{Y2}O_{Z2}$ or $InO_{X1}$ as a main component are separated from each other, and the regions containing the respective elements as their main components form a mosaic pattern.

Note that in the case where aluminum, silicon, boron, yttrium, tin, copper, vanadium, beryllium, titanium, iron, nickel, germanium, zirconium, molybdenum, lanthanum, cerium, neodymium, hafnium, tantalum, tungsten, or magnesium is contained instead of gallium, the CAC-OS refers to a composition in which some regions containing the metal element as a main component and being observed as nanoparticles and some regions containing In as a main component and being observed as nanoparticles are randomly dispersed to form a mosaic pattern.

Here, the conductivity of a region containing $In_{X2}Zn_{Y2}O_{Z2}$ or $InO_{X1}$ as a main component is higher than that of a region containing $GaO_{X5}$ or the like as a main component. Note that in other words, the region with high conductivity is a region where the proportion of In is relatively high. In the following description, the region with a relatively high proportion of In may be referred to as an In-Rich region for convenience. That is, when carriers flow through the regions containing $In_{X2}Zn_{Y2}O_{Z2}$ or $InO_{X1}$ as a main component, conductivity is exhibited. Accordingly, when the regions containing $In_{X2}Zn_{Y2}O_{Z2}$ or $InO_{X1}$ as a main component are distributed in a metal oxide like a cloud, high field-effect mobility ($\mu$) can be achieved.

In contrast, the insulating property of a region containing $GaO_{X3}$ or the like as a main component is higher than that of a region containing $In_{X2}Zn_{Y2}O_{Z2}$ or $InO_{X1}$ as a main component. Note that in other words, the region with a high insulating property is a region where the proportion of Ga is relatively high. In the following description, the region with a relatively high proportion of Ga may be referred to as a Ga-Rich region for convenience. That is, when regions containing $GaO_{X5}$ or the like as a main component are distributed in a metal oxide, leakage current can be reduced and favorable switching operation can be achieved.

Accordingly, when the CAC-OS in an In—Ga—Zn oxide is used for a semiconductor element, the insulating property derived from $GaO_{X5}$ or the like and the conductivity derived from $In_{X2}Zn_{Y2}O_{Z2}$ or $InO_{X1}$ complement each other, whereby high on-state current ($I_{on}$), high field-effect mobility ($\mu$), and low off-state current ($I_{off}$) can be achieved.

Note that a semiconductor element containing the CAC-OS in an In—Ga—Zn oxide has high reliability. Thus, the CAC-OS in an In—Ga—Zn oxide is most suitable for a variety of semiconductor devices typified by a display.

At least part of this embodiment can be implemented in combination with the other embodiments described in this specification as appropriate.

Embodiment 3

In this embodiment, an example of a display device that includes any of the transistors described in the above embodiment is described below with reference to FIG. 16 to FIG. 18.

Figure 16:
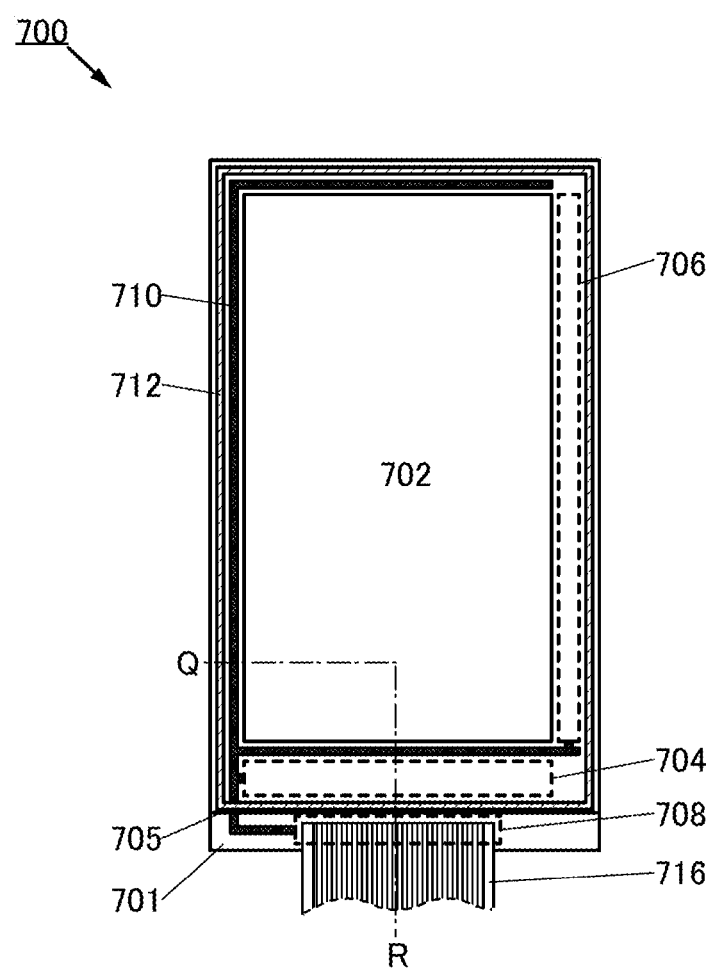
FIG. 16 is a top view illustrating one embodiment of a display device.

FIG. 16 is a top view of an example of a display device. A display device 700 shown in FIG. 16 includes a pixel portion 702 provided over a first substrate 701, a source driver circuit portion 704 and a gate driver circuit portion 706 that are provided over the first substrate 701, a sealant 712 placed to surround the pixel portion 702, the source driver circuit portion 704, and the gate driver circuit portion 706, and a second substrate 705 provided to face the first substrate 701. Note that the first substrate 701 and the second substrate 705 are sealed with the sealant 712. That is, the pixel portion 702, the source driver circuit portion 704, and the gate driver circuit portion 706 are sealed with the first substrate 701, the sealant 712, and the second substrate 705. Note that although not illustrated in FIG. 16, a display element is provided between the first substrate 701 and the second substrate 705.

In the display device 700, an FPC (Flexible printed circuit) terminal portion 708 electrically connected to the pixel portion 702, the source driver circuit portion 704, and the gate driver circuit portion 706 is provided in a region different from the region that is over the first substrate 701 and surrounded by the sealant 712. An FPC 716 is connected to the FPC terminal portion 708, and a variety of signals and the like are supplied to the pixel portion 702, the source driver circuit portion 704, and the gate driver circuit portion 706 through the FPC 716. A signal line 710 is connected to the pixel portion 702, the source driver circuit portion 704, the gate driver circuit portion 706, and the FPC terminal portion 708. Through the signal line 710, a variety of signals and the like are supplied from the FPC 716 to the pixel portion 702, the source driver circuit portion 704, the gate driver circuit portion 706, and the FPC terminal portion 708.

A plurality of gate driver circuit portions 706 may be provided in the display device 700. An example of the display device 700 in which the source driver circuit portion 704 and the gate driver circuit portion 706 are formed over the first substrate 701 where the pixel portion 702 is also formed is described; however, the structure is not limited thereto. For example, only the gate driver circuit portion 706 may be formed over the first substrate 701 or only the source driver circuit portion 704 may be formed over the first substrate 701. In that case, a substrate over which a source driver circuit, a gate driver circuit, or the like is formed (e.g., a driver circuit substrate formed using a single-crystal semiconductor film or a polycrystalline semiconductor film) may be formed on the first substrate 701. Note that there is no particular limitation on the method for connecting the separately formed driver circuit substrate, and a COG (Chip On Glass) method, a wire bonding method, or the like can be used.

The pixel portion 702, the source driver circuit portion 704, and the gate driver circuit portion 706 included in the display device 700 include a plurality of transistors, and any of the transistors that are the semiconductor devices of embodiments of the present invention can be used.

The display device 700 can include a variety of elements. Examples of the elements include electroluminescent (EL) element (an EL element containing an organic material and an inorganic material, an organic EL element, an inorganic EL element, an LED, or the like), a light-emitting transistor element (a transistor that emits light depending on current), an electron emitter, a liquid crystal element, an electronic ink element, an electrophoretic element, an electrowetting element, a plasma display panel (PDP), a MEMS (micro electro mechanical systems) display (e.g., a grating light valve (GLV), a digital micromirror device (DMD), a digital micro shutter (DMS) element, or an interferometric modulation (IMOD) element), and a piezoelectric ceramic display.

Examples of a display device using an EL element include an EL display. Examples of a display device using an electron emitter include a field emission display (FED) and an SED-type flat panel display (SED: Surface-conduction Electron-emitter Display). Examples of a display device using a liquid crystal element include a liquid crystal display (a transmissive liquid crystal display, a transflective liquid crystal display, a reflective liquid crystal display, a direct-view liquid crystal display, or a projection liquid crystal display). Examples of a display device using an electronic ink element or an electrophoretic element include electronic paper. Note that in the case of a transflective liquid crystal display or a reflective liquid crystal display, some or all of pixel electrodes function as reflective electrodes. For example, some or all of pixel electrodes contain aluminum, silver, or the like. Moreover, in such a case, a memory circuit such as SRAM can be provided under the reflective electrodes. Thus, the power consumption can be further reduced.

Note that as a display method of the display device 700, a progressive method, an interlace method, or the like can be employed. Furthermore, color elements controlled in pixels at the time of color display are not limited to three colors of R, G, and B (R represents red, G represents green, and B represents blue). For example, four pixels of the R pixel, the G pixel, the B pixel, and a W (white) pixel may be included. Alternatively, a color element may be composed of two colors among R, G, and B as in PenTile layout, and two different colors may be selected depending on the color element. Alternatively, one or more colors of yellow, cyan, magenta, and the like may be added to R, G, and B. Note that the size of a display region may differ between dots of the color elements. The disclosed invention is not limited to a display device for color display and can also be applied to a display device for monochrome display.

A coloring layer (also referred to as a color filter) may be used to make a display device to perform full-color display in which white light (W) is used for a backlight (an organic EL element, an inorganic EL element, an LED, a fluorescent lamp, or the like). For example, for a coloring layer, red (R), green (G), blue (B), yellow (Y), and the like can be used in an appropriate combination. With the use of the coloring layer, higher color reproducibility can be obtained as compared with the case without the coloring layer. In that case, by providing a region with a coloring layer and a region without a coloring layer, white light in the region without the coloring layer may be directly utilized for display. By partly providing the region without the coloring layer, a decrease in the luminance of a bright display due to the coloring layer can be suppressed, and power consumption can sometimes be reduced by approximately 20% to 30%. Note that in the case where full-color display is performed using a self-luminous element such as an organic EL element or an inorganic EL element, elements may emit light of their respective colors R, G, B, Y, and W. By using a self-luminous element, power consumption can be further reduced as compared with the case of using a coloring layer in some cases.

As a coloring method, the above-described method in which part of white light is converted into red, green, and blue through color filters (a color filter method), a method in which red light, green light, and blue light are used (a three-color method), and a method in which part of blue light is converted into red or green (a color conversion method or a quantum dot method) may be used.

In this embodiment, structures using an EL element and a liquid crystal element as display elements are described with reference to FIG. 17 and FIG. 18. Note that FIG. 17 is a cross-sectional view along the dashed-dotted line Q-R in FIG. 16 and is the structure using an EL element as a display element. FIG. 18 is a cross-sectional view along the dashed-dotted line Q-R in FIG. 16 and is the structure using a liquid crystal element as a display element.

Figure 17:
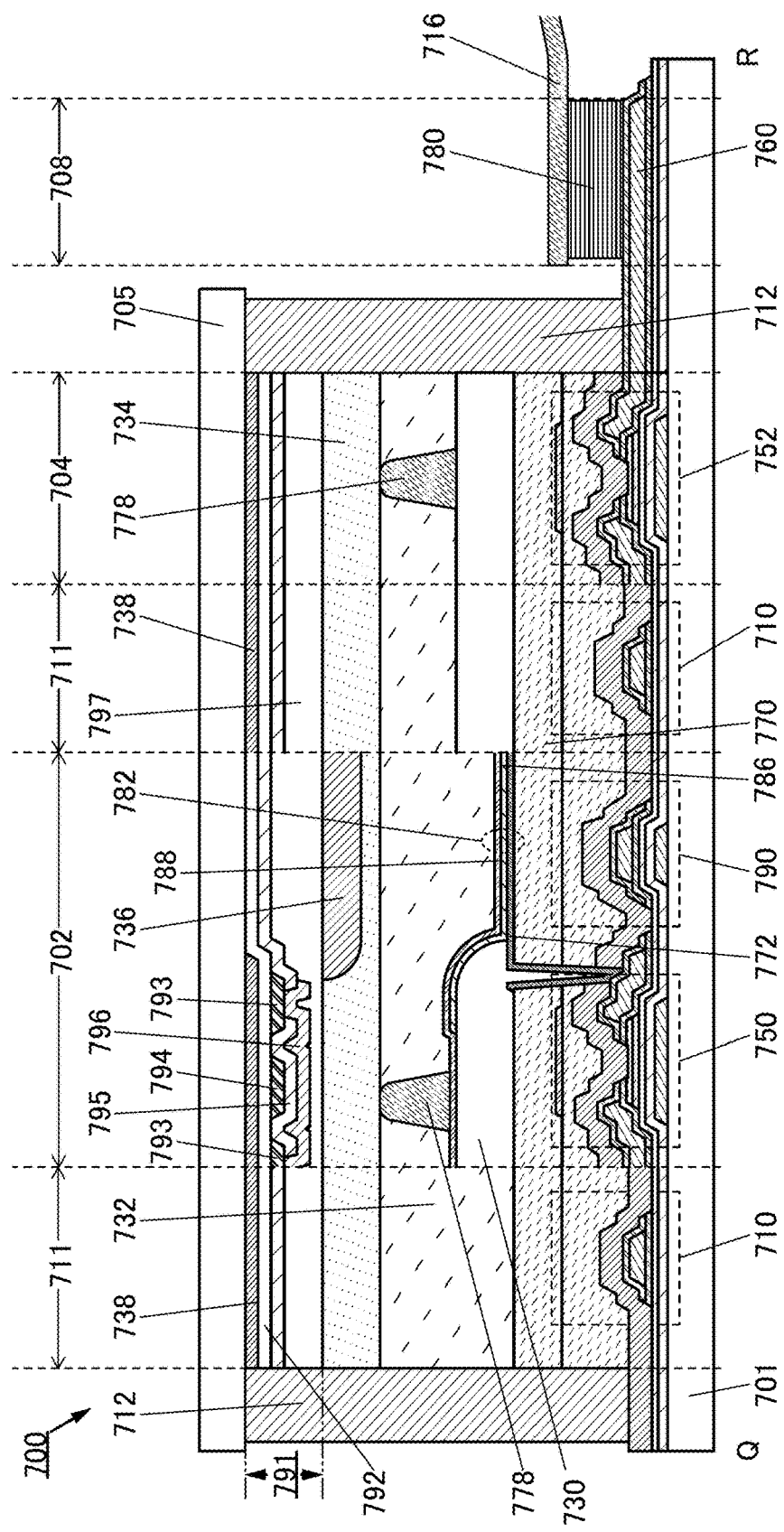
FIG. 17 is a cross-sectional view illustrating one embodiment of a display device.
Figure 18:
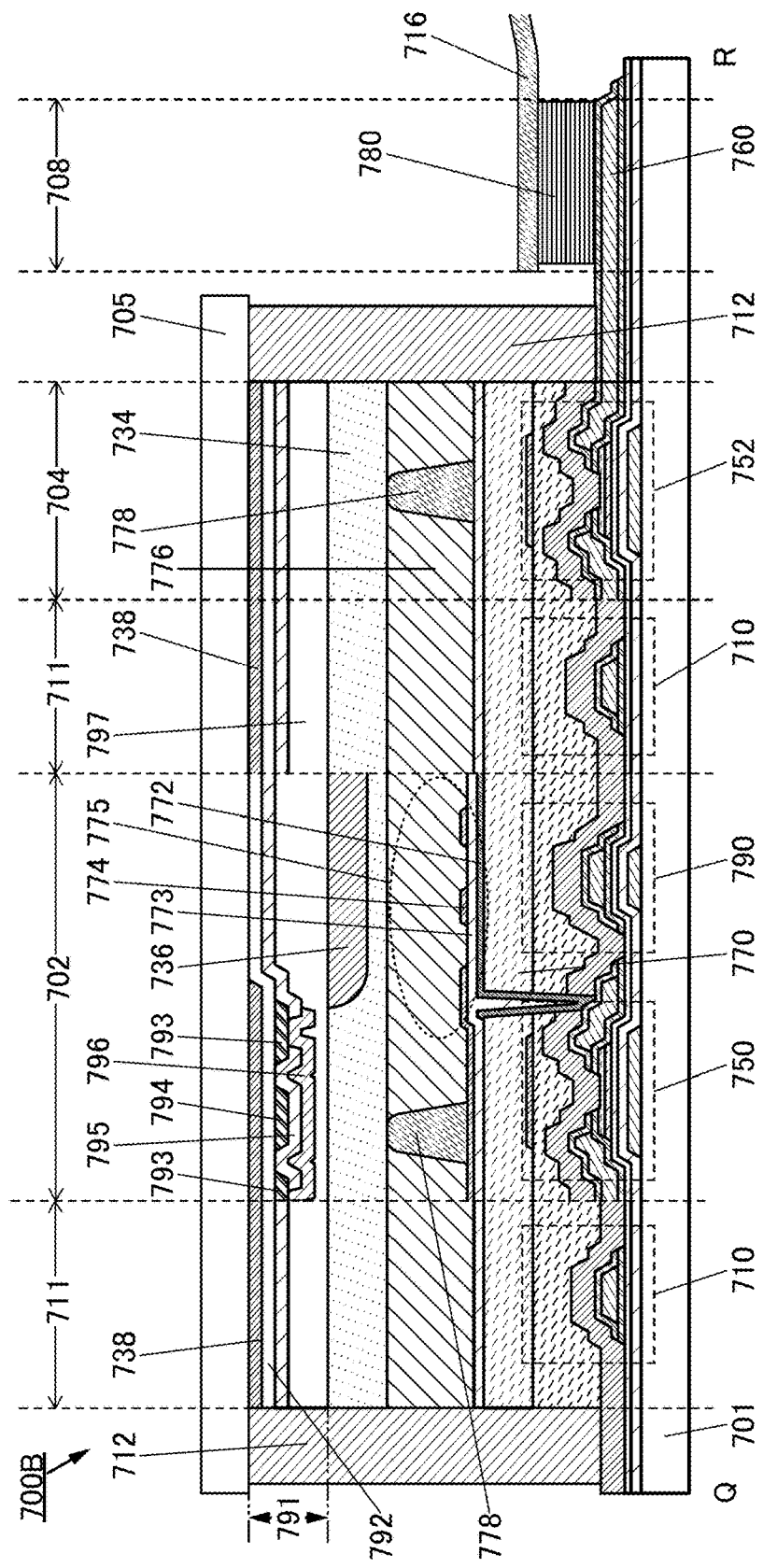
FIG. 18 is a cross-sectional view illustrating one embodiment of a display device.

First, common portions between FIG. 17 and FIG. 18 are described, and then different portions are described below.

<3-1. Description of Common Portions in Display Devices>

The display device 700 shown in FIG. 17 and FIG. 18 includes a lead wiring portion 711, the pixel portion 702, the source driver circuit portion 704, and the FPC terminal portion 708. The lead wiring portion 711 includes the signal line 710. The pixel portion 702 includes a transistor 750 and a capacitor 790. The source driver circuit portion 704 includes a transistor 752.

The transistor 750 and the transistor 752 each have a structure similar to that of the above-described transistor 100E. Note that the transistor 750 and the transistor 752 may each have the structure of any of the other transistors described in the above embodiments.

The transistor used in this embodiment contains a metal oxide which is highly purified and in which formation of oxygen vacancies is suppressed. The transistor can have low off-state current. Accordingly, the retention time of an electrical signal such as an image signal can be prolonged, and a writing interval can be set longer in a power-on state. Accordingly, the frequency of refresh operation can be reduced, which produces an effect of suppressing power consumption.

The transistor used in this embodiment can have relatively high field-effect mobility and thus is capable of high-speed operation. For example, with the use of such a transistor capable of high-speed operation in a liquid crystal display device, a switching transistor in a pixel portion and a driver transistor used in a driver circuit portion can be formed over the same substrate. That is, no additional semiconductor device formed using a silicon wafer or the like is needed as a driver circuit; therefore, the number of components of the semiconductor device can be reduced. Moreover, the use of the transistor capable of high-speed operation in the pixel portion can provide a high-quality image.

The capacitor 790 includes a lower electrode formed through a step of processing a conductive film that is the same as a conductive film functioning as a first gate electrode of the transistor 750 and an upper electrode formed through a step of processing a conductive film that is the same as a conductive film functioning as a source electrode and a drain electrode of the transistor 750. Between the lower electrode and the upper electrode, an insulating film formed through a step of forming an insulating film that is the same as an insulating film functioning as a first gate insulating film of the transistor 750 is provided. That is, the capacitor 790 has a stacked-layer structure in which an insulating film functioning as a dielectric film is positioned between the pair of electrodes.

In FIG. 17 and FIG. 18, a planarization insulating film 770 is provided over the transistor 750, the transistor 752, and the capacitor 790.

A heat-resistant organic material such as a polyimide resin, an acrylic resin, a polyimide amide resin, a benzocyclobutene resin, a polyamide resin, or an epoxy resin can be used for the planarization insulating film 770. Note that the planarization insulating film 770 may be formed by stacking a plurality of insulating films formed using these materials. A structure without the planarization insulating film 770 may also be employed.

Although FIG. 17 and FIG. 18 each show an example in which transistors with the same structure are used as the transistor 750 included in the pixel portion 702 and the transistor 752 included in the source driver circuit portion 704, one embodiment of the present invention is not limited thereto. For example, different transistors may be used in the pixel portion 702 and the source driver circuit portion 704. Specifically, a structure in which a staggered transistor is used in the pixel portion 702 and the inverted-staggered transistor described in Embodiment 1 is used in the source driver circuit portion 704, or a structure in which the inverted-staggered transistor described in Embodiment 1 is used in the pixel portion 702 and a staggered transistor is used in the source driver circuit portion 704 can be employed. Note that the source driver circuit portion 704 may be replaced with a gate driver circuit portion.

The signal line 710 is formed through the same step as the conductive films functioning as source electrodes and drain electrodes of the transistors 750 and 752. In the case where a material containing a copper element is used for the signal line 710, for example, signal delay or the like due to wiring resistance is reduced, which enables display on a large screen.

The FPC terminal portion 708 includes a connection electrode 760, an anisotropic conductive film 780, and the FPC 716. Note that the connection electrode 760 is formed through the same step as the conductive films functioning as the source electrodes and the drain electrodes of the transistors 750 and 752. The connection electrode 760 is electrically connected to a terminal included in the FPC 716 through the anisotropic conductive film 780.

For example, a glass substrate can be used as the first substrate 701 and the second substrate 705. A flexible substrate may also be used as the first substrate 701 and the second substrate 705. Examples of the flexible substrate include a plastic substrate.

A structure body 778 is provided between the first substrate 701 and the second substrate 705. The structure body 778 is a columnar spacer obtained by selective etching of an insulating film and provided to control the distance (cell gap) between the first substrate 701 and the second substrate 705. Note that a spherical spacer may be used as the structure body 778.

A light-blocking film 738 functioning as a black matrix, a coloring film 736 functioning as a color filter, and an insulating film 734 that is in contact with the light-blocking film 738 and the coloring film 736 are provided on the second substrate 705 side.

<3-2. Structure Example of Input/Output Device of Display Device>

In the display device 700 shown in FIG. 17 and FIG. 18, a touch panel 791 is provided as an input/output device. Note that a structure in which the touch panel 791 is not provided in the display device 700 may also be employed.

The touch panel 791 shown in FIG. 17 and FIG. 18 is what is called an in-cell touch panel provided between the second substrate 705 and the coloring film 736. The touch panel 791 is formed on the second substrate 705 side before the light-blocking film 738 and the coloring film 736 are formed.

Note that the touch panel 791 includes the light-blocking film 738, an insulating film 792, an electrode 793, an electrode 794, an insulating film 795, an electrode 796, and an insulating film 797. A change in the capacitance between the electrode 793 and the electrode 794 can be sensed when a sensing target such as a finger or a stylus approaches, for example.

An intersection of the electrode 793 and the electrode 794 is shown above the transistor 750 in FIG. 17 and FIG. 18. Through openings provided in the insulating film 795, the electrode 796 is electrically connected to the two electrodes 793 between which the electrode 794 is positioned. Note that a structure in which a region where the electrode 796 is provided is provided in the pixel portion 702 is shown in FIG. 17 and FIG. 18 as an example; however, one embodiment of the present invention is not limited thereto, and the region may be formed in the source driver circuit portion 704, for example.

The electrode 793 and the electrode 794 are provided in a region overlapping with the light-blocking film 738. As shown in FIG. 17, it is preferable that the electrode 793 be provided so as not to overlap with a light-emitting element 782. As shown in FIG. 18, it is preferable that the electrode 793 be provided so as not to overlap with a liquid crystal element 775. In other words, the electrode 793 has an opening in a region overlapping with the light-emitting element 782 and the liquid crystal element 775. That is, the electrode 793 has a mesh shape. With such a structure, the electrode 793 does not block light emitted from the light-emitting element 782. Alternatively, the electrode 793 does not block light transmitted through the liquid crystal element 775. Thus, since a decrease in luminance due to the placement of the touch panel 791 is extremely small, a display device with high visibility and low power consumption can be obtained. Note that the electrode 794 has a similar structure.

Since the electrode 793 and the electrode 794 do not overlap with the light-emitting element 782, a metal material with low visible light transmittance can be used for the electrode 793 and the electrode 794. Alternatively, since the electrode 793 and the electrode 794 do not overlap with the liquid crystal element 775, a metal material with low visible light transmittance can be used for the electrode 793 and the electrode 794.

Thus, the resistance of the electrode 793 and the electrode 794 can be reduced as compared with an electrode using an oxide material with high visible light transmittance, so that the sensitivity of the touch panel can be increased.

For example, a conductive nanowire may be used for the electrodes 793, 794, and 796. The nanowire has a mean diameter of greater than or equal to 1 nm and less than or equal to 100 nm, preferably greater than or equal to 5 nm and less than or equal to 50 nm, further preferably greater than or equal to 5 nm and less than or equal to 25 nm. As the nanowire, a carbon nanotube or a metal nanowire such as an Ag nanowire, a Cu nanowire, or an Al nanowire is used. For example, in the case where an Ag nanowire is used for any one or all of the electrodes 793, 794, and 796, the visible light transmittance can be greater than or equal to 89% and the sheet resistance can be greater than or equal to 40 Ω/square and less than or equal to 100 Ω/square.

Although the structure of the in-cell touch panel is shown as an example in FIG. 17 and FIG. 18, one embodiment of the present invention is not limited thereto. For example, what is called an on-cell touch panel that is formed over the display device 700, or what is called an out-cell touch panel that is attached to the display device 700 may be used. In this manner, the display device 700 of one embodiment of the present invention can be used in combination with various types of touch panels.

<3-3. Display Device Using Light-Emitting Element>

The display device 700 shown in FIG. 17 includes the light-emitting element 782. The light-emitting element 782 includes a conductive film 772, an EL layer 786, and a conductive film 788. The display device 700 shown in FIG. 17 can display an image when the EL layer 786 of the light-emitting element 782 emits light. Note that the EL layer 786 contains an organic compound or an inorganic compound such as a quantum dot.

Examples of a material that can be used for an organic compound include a fluorescent material and a phosphorescent material. Examples of a material that can be used for a quantum dot include a colloidal quantum dot material, an alloyed quantum dot material, a core-shell quantum dot material, and a core quantum dot material. A material containing elements belonging to Group 12 and Group 16, elements belonging to Group 13 and Group 15, or elements belonging to Group 14 and Group 16 may also be used. Alternatively, a quantum dot material containing an element such as cadmium (Cd), selenium (Se), zinc (Zn), sulfur (S), phosphorus (P), indium (In), tellurium (Te), lead (Pb), gallium (Ga), arsenic (As), or aluminum (Al) may be used.

In the display device 700 shown in FIG. 17, an insulating film 730 is provided over the planarization insulating film 770 and the conductive film 772. The insulating film 730 covers part of the conductive film 772. Note that the light-emitting element 782 has a top-emission structure. Thus, the conductive film 788 has a light-transmitting property and transmits light emitted from the EL layer 786. Note that although the top-emission structure is described as an example in this embodiment, the structure is not limited thereto. For example, a bottom-emission structure in which light is emitted to the conductive film 772 side or a dual-emission structure in which light is emitted to both the conductive film 772 side and the conductive film 788 side may be employed.

The coloring film 736 is provided in a position overlapping with the light-emitting element 782, and the light-blocking film 738 is provided in the lead wiring portion 711, the source driver circuit portion 704, and a position overlapping with the insulating film 730. The coloring film 736 and the light-blocking film 738 are covered with the insulating film 734. A space between the light-emitting element 782 and the insulating film 734 is filled with a sealing film 732. Note that the structure in which the coloring film 736 is provided in the display device 700 shown in FIG. 17 is described as an example; however, the structure is not limited thereto. For example, a structure without the coloring film 736 may also be employed in the case where the EL layer 786 is formed by separate coloring.

<3-4. Structure Example of Display Device Using Liquid Crystal Element>

The display device 700 shown in FIG. 18 includes the liquid crystal element 775. The liquid crystal element 775 includes the conductive film 772, an insulating film 773, a conductive film 774, and a liquid crystal layer 776. The conductive film 774 functions as a common electrode, and an electric field generated between the conductive film 772 and the conductive film 774 through the insulating film 773 can control the alignment state in the liquid crystal layer 776. The display device 700 shown in FIG. 18 can display an image in such a manner that transmission or non-transmission of light is controlled by the alignment state in the liquid crystal layer 776 that is changed with voltage applied to the conductive film 772 and the conductive film 774.

The conductive film 772 is electrically connected to the conductive film functioning as the source electrode or the drain electrode of the transistor 750. The conductive film 772 is formed over the planarization insulating film 770 and functions as a pixel electrode, that is, one electrode of the display element.

A conductive film that has a visible-light-transmitting property or a conductive film that has a visible-light-reflecting property can be used as the conductive film 772. For example, a material containing one kind selected from indium (In), zinc (Zn), and tin (Sn) is preferably used for the conductive film that has a visible-light-transmitting property. For example, a material containing aluminum or silver is preferably used for the conductive film that has a visible-light-reflecting property. In this embodiment, the conductive film that has a visible-light-reflecting property is used as the conductive film 772.

Note that although FIG. 18 shows the structure in which the conductive film 772 is connected to the conductive film functioning as the drain electrode of the transistor 750 as an example, one embodiment of the present invention is not limited thereto. For example, a structure may be employed in which the conductive film 772 is electrically connected to the conductive film functioning as the drain electrode of the transistor 750 through a conductive film functioning as a connection electrode.

Although not illustrated in FIG. 18, an alignment film may be provided in a position that is in contact with the liquid crystal layer 776. Furthermore, although not illustrated in FIG. 18, an optical component (an optical substrate) and the like, such as a polarizing component, a retardation component, or an anti-reflection component, may be provided as appropriate. For example, circular polarization may be employed by using a polarizing substrate and a retardation substrate. A backlight, a side light, or the like may be used as a light source.

In the case where a liquid crystal element is used as the display element, a thermotropic liquid crystal, a low-molecular liquid crystal, a high-molecular liquid crystal, a polymer-dispersed liquid crystal, a ferroelectric liquid crystal, an anti-ferroelectric liquid crystal, or the like can be used. Such a liquid crystal material exhibits a cholesteric phase, a smectic phase, a cubic phase, a chiral nematic phase, an isotropic phase, or the like depending on conditions.

In the case where a horizontal electric field mode is employed, a liquid crystal exhibiting a blue phase for which an alignment film is not used may be used. The blue phase is one of liquid crystal phases, which is generated just before a cholesteric phase changes into an isotropic phase while the temperature of a cholesteric liquid crystal is increased. Since the blue phase appears only in a narrow temperature range, a liquid crystal composition in which a chiral material is mixed to account for several weight percent or more is used for the liquid crystal layer in order to improve the temperature range. The liquid crystal composition containing a liquid crystal exhibiting a blue phase and a chiral material has a short response time and optical isotropy, which eliminates the need for alignment treatment. An alignment film does not need to be provided, and thus, rubbing treatment is not necessary; accordingly, electrostatic discharge damage caused by the rubbing treatment can be prevented, and defects and damage of a liquid crystal display device in the manufacturing process can be reduced. Moreover, the liquid crystal material that exhibits a blue phase has small viewing angle dependence.

In the case where a liquid crystal element is used as the display element, a TN (Twisted Nematic) mode, an IPS (In-Plane-Switching) mode, an FFS (Fringe Field Switching) mode, an ASM (Axially Symmetric aligned Micro-cell) mode, an OCB (Optical Compensated Birefringence) mode, an FLC (Ferroelectric Liquid Crystal) mode, an AFLC (AntiFerroelectric Liquid Crystal) mode, or the like can be used.

A normally black liquid crystal display device such as a transmissive liquid crystal display device that employs a vertical alignment (VA) mode may be used. There are some examples of a vertical alignment mode; for example, an MVA (Multi-Domain Vertical Alignment) mode, a PVA (Patterned Vertical Alignment) mode, or an ASV mode can be employed.

At least part of this embodiment can be implemented in combination with the other embodiments described in this specification as appropriate.

<3-5. Structure Example of Display Panel>

Figure 19:
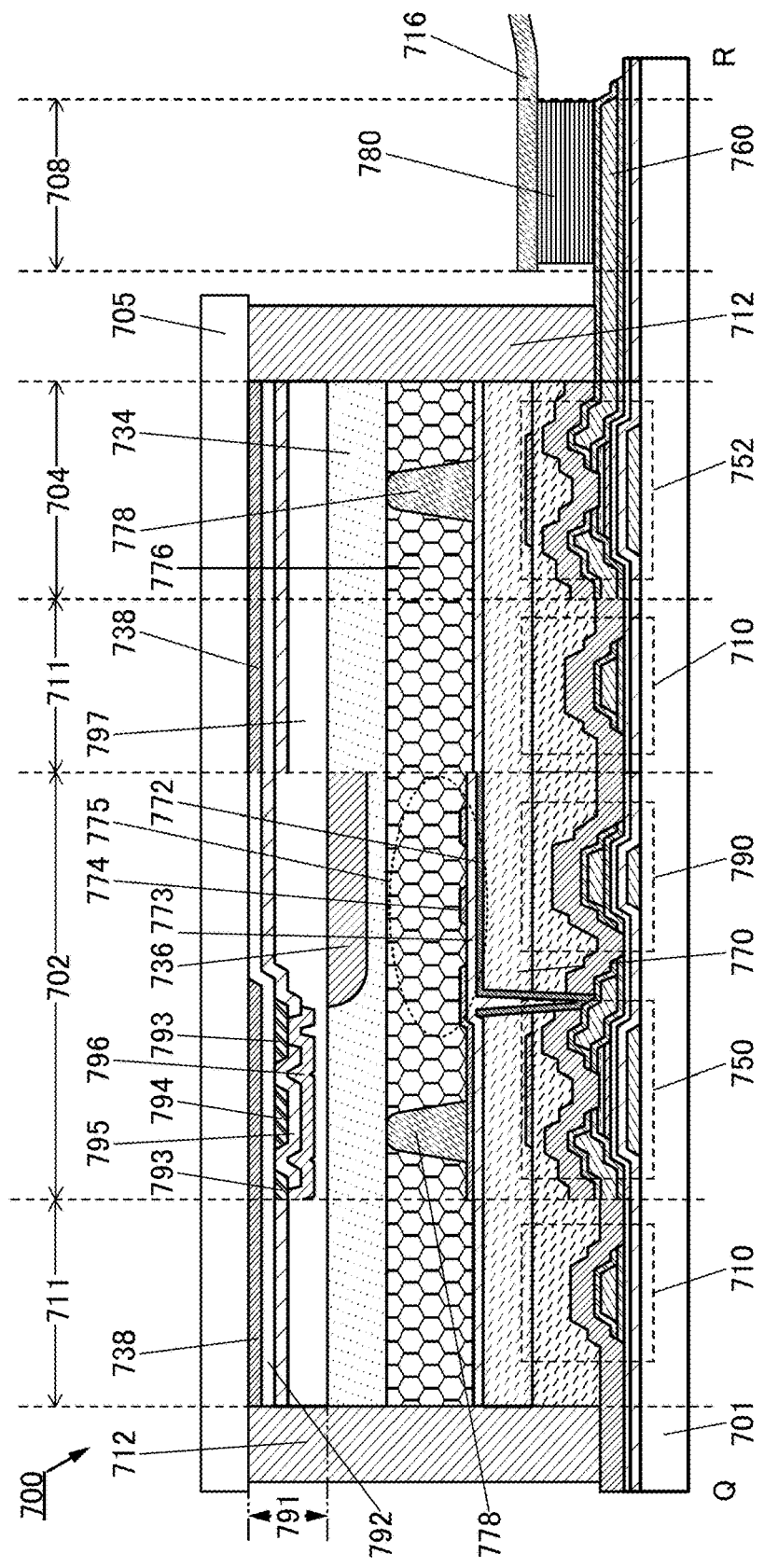
FIG. 19 is a cross-sectional view illustrating one embodiment of a display device.

When a liquid crystal material that operates in a guest-host mode is used for the liquid crystal element 775, a functional component such as a light diffusion layer or a polarizing plate can be omitted. The display device 700 shown in FIG. 19 has the same structure as that in FIG. 18, and the liquid crystal material that operates in a guest-host mode is used for the liquid crystal layer 776. In that case, a polarizing component such as a polarizing plate is not included.

The guest-host liquid crystal refers to a liquid crystal material containing a dichroic dye. Specifically, a material that has high absorbance in the major axis direction of molecules and low absorbance in the minor-axis direction orthogonal to the major axis direction can be used for the dichroic dye. A material with a dichroic ratio of 10 or higher is preferably used for the dichroic dye, and a material with a dichroic ratio of 20 or higher is further preferably used for the dichroic dye.

An azo dye, an anthraquinone dye, a dioxazine dye, or the like can be used as the dichroic dye, for example.

A structure in which two liquid crystal layers containing dichroic dyes having homogeneous alignment that are stacked such that their alignment directions are orthogonal to each other can be used for the layer containing a liquid crystal material. Accordingly, light can be easily absorbed in all directions. Alternatively, contrast can be enhanced.

A phase transition guest-host liquid crystal or a structure in which a droplet containing a guest-host liquid crystal is dispersed in a polymer can be used for the liquid crystal layer 776.

With the structure of the display device 700, the productivity of the display device can be increased. Since a functional component such as a polarizing plate is not provided, the luminance of reflected light of the liquid crystal element 775 can be increased. Accordingly, the visibility of the display device can be increased.

At least part of this embodiment can be implemented in combination with the other embodiments described in this specification as appropriate.

Embodiment 4

In this embodiment, structure examples of a pixel included in a display device will be described with reference to FIG. 20 and FIG. 21.

[Pixel]

First, a pixel will be described with reference to FIGS. 20(A1), 20(A2), and 20(B).

FIG. 20(A1) shows a schematic top view of a pixel 900 seen from the display surface side. The pixel 900 shown in FIG. 20(A1) includes three subpixels. A light-emitting element 930EL (not illustrated in FIGS. 20(A1) and 20(A2)), a transistor 910, and a transistor 912 are provided in each of the subpixels. In each of the subpixels shown in FIG. 20(A1), a light-emitting region (a light-emitting region 916R, a light-emitting region 916G, or a light-emitting region 916B) of the light-emitting element 930EL is shown. Note that the light-emitting element 930EL emits light toward the transistor 910 and the transistor 912 side; that is, it is a bottom-emission light-emitting element.

The pixel 900 includes a wiring 902, a wiring 904, a wiring 906, and the like. The wiring 902 serves as a scan line, for example. The wiring 904 serves as a signal line, for example. The wiring 906 serves as a power source line for supplying a potential to the light-emitting element, for example. The wiring 902 and the wiring 904 include a portion where they intersect with each other. The wiring 902 and the wiring 906 include a portion where they intersect with each other. Note that although the example here shows the structure in which the wiring 902 intersects with the wiring 904 and the wiring 902 intersects with the wiring 906, the structure is not limited thereto, and a structure in which the wiring 904 intersects with the wiring 906 may be employed.

The transistor 910 serves as a selection transistor. A gate of the transistor 910 is electrically connected to the wiring 902. One of a source and a drain of the transistor 910 is electrically connected to the wiring 904.

The transistor 912 is a transistor that controls current flowing to the light-emitting element. A gate of the transistor 912 is electrically connected to the other of the source and the drain of the transistor 910. One of a source and a drain of the transistor 912 is electrically connected to the wiring 906, and the other is electrically connected to one of a pair of electrodes of the light-emitting element 930EL.

In FIG. 20(A1), the light-emitting region 916R, the light-emitting region 916G, and the light-emitting region 916B each have a strip shape that is long in the vertical direction, and they are arranged in the horizontal direction to form a striped pattern.

Here, the wiring 902, the wiring 904, and the wiring 906 each have a light-blocking property. For layers other than the above, that is, layers included in the transistor 910, the transistor 912, a wiring connected to the transistor, a contact, a capacitor, and the like, a light-transmitting film is suitably used. FIG. 20(A2) shows an example in which the pixel 900 shown in FIG. 20(A1) is divided into a transmissive region 900$t$ that transmits visible light and a light-blocking region 900$s$ that blocks visible light. As described above, when the transistor is manufactured using a light-transmitting film, a portion other than the area where the wirings are provided can be the transmissive region 900$t$. The light-emitting region of the light-emitting element can overlap with the transistor, the wiring connected to the transistor, the contact, the capacitor, and the like, and thus the aperture ratio of the pixel can be increased.

Note that the higher the proportion of the area of the transmissive region to the area of the pixel is, the higher the light extraction efficiency of the light-emitting element is. The proportion of the area of the transmissive region to the area of the pixel is, for example, greater than or equal to 1% and less than or equal to 95%, preferably greater than or equal to 10% and less than or equal to 90%, further preferably greater than or equal to 20% and less than or equal to 80%. A particularly preferable proportion is greater than or equal to 40% or greater than or equal to 50%, still further preferably greater than or equal to 60% and less than or equal to 80%.

FIG. 20(B) shows a cross-sectional view corresponding to a cross section along the dashed-dotted line A-B in FIG. 20(A2). Note that FIG. 20(B) also illustrates cross sections of the light-emitting element 930EL, a capacitor 913, a driver circuit portion 901, and the like that are not illustrated in the top views. The driver circuit portion 901 can be used as a scan line driver circuit portion or a signal line driver circuit portion. The driver circuit portion 901 includes a transistor 911.

As shown in FIG. 20(B), light from the light-emitting element 930EL is emitted in the direction of a dashed arrow. The light from the light-emitting element 930EL is extracted to the outside through the transistor 910, the transistor 912, the capacitor 913, and the like. Thus, films included in the capacitor 913 and the like also preferably have light-transmitting properties. As the area of the light-transmitting region of the capacitor 913 becomes larger, the attenuation of light emitted from the light-emitting element 930EL can be suppressed more.

Note that the transistor 911 in the driver circuit portion 901 may have a light-blocking property. When the transistor 911 and the like in the driver circuit portion 901 have light-blocking properties, the reliability of a driver circuit portion and the drive capability can be heightened. That is, it is preferable to use light-blocking conductive films for a gate electrode, a source electrode, and a drain electrode of the transistor 911. Wirings connected to them are also preferably formed with light-blocking conductive films.

Next, an example of the pixel will be described with reference to FIGS. 21(A1), 21(A2), and 21(B).

FIG. 21(A1) shows a schematic top view of the pixel 900. The pixel 900 shown in FIG. 21(A1) includes four subpixels. FIG. 21(A1) shows an example in which the subpixels in the pixel 900 are arranged in two rows and two columns. A transmissive liquid crystal element 930LC (not illustrated in FIGS. 21(A1) and 21(A2)), a transistor 914, and the like are provided in each of the subpixels. In FIG. 21(A1), two wirings 902 and two wirings 904 are provided in the pixel 900. In each of the subpixels shown in FIG. 21(A1), a display region (a display region 918R, a display region 918G, a display region 918B, or a display region 918W) of the liquid crystal element is shown. Light emitted from a backlight unit (BLU) enters the liquid crystal element 930LC through the transistor 914 and the like.

The pixel 900 includes the wiring 902, the wiring 904, and the like. The wiring 902 serves as a scan line, for example. The wiring 904 serves as a signal line, for example. The wiring 902 and the wiring 904 include a portion where they intersect with each other.

The transistor 914 serves as a selection transistor. A gate of the transistor 914 is electrically connected to the wiring 902. One of a source and a drain of the transistor 914 is electrically connected to the wiring 904, and the other is electrically connected to the liquid crystal element 930LC.

Here, the wiring 902 and the wiring 904 each have a light-blocking property. For layers other than the above, that is, layers included in the transistor 914, a wiring connected to the transistor 914, a contact, a capacitor, and the like, a light-transmitting film is suitably used. FIG. 21(A2) shows an example in which the pixel 900 shown in FIG. 21(A1) is divided into the transmissive region 900$t$ that transmits visible light and the light-blocking region 900$s$ that blocks visible light. As described above, when the transistor is manufactured using a light-transmitting film, a portion other than the area where the wirings are provided can be the transmissive region 900t. The transmissive region of the liquid crystal element can overlap with the transistor, the wiring connected to the transistor, the contact, the capacitor, and the like, and thus the aperture ratio of the pixel can be increased.

Note that the higher the proportion of the area of the transmissive region to the area of the pixel is, the larger the amount of transmitted light is. The proportion of the area of the transmissive region to the area of the pixel is, for example, greater than or equal to 1% and less than or equal to 95%, preferably greater than or equal to 10% and less than or equal to 90%, further preferably greater than or equal to 20% and less than or equal to 80%. A particularly preferable proportion is greater than or equal to 40% or greater than or equal to 50%, still further preferably greater than or equal to 60% and less than or equal to 80%.

FIG. 21(B) shows a cross-sectional view corresponding to a cross section along the dashed-dotted line C-D in FIG. 21(A2). Note that FIG. 21(B) also illustrates cross sections of the liquid crystal element 930LC, a coloring film 932CF, a light-blocking film 932BM, a capacitor 915, the driver circuit portion 901, and the like that are not illustrated in the top views. The driver circuit portion 901 can be used as a scan line driver circuit portion or a signal line driver circuit portion. The driver circuit portion 901 includes the transistor 911.

As shown in FIG. 21(B), light from the backlight unit (BLU) is emitted in the direction of a dashed arrow. The light from the backlight unit (BLU) is extracted to the outside through the transistor 914, the capacitor 915, and the like. Thus, films included in the transistor 914 and the capacitor 915, and the like also preferably have light-transmitting properties. As the area of the light-transmitting region of the transistor 914, the capacitor 915, and the like becomes larger, light from the backlight unit (BLU) can be used more efficiently.

Note that the light from the backlight unit (BLU) may be extracted to the outside through the coloring film 932CF, as shown in FIG. 21(B). The light extracted through the coloring film 932CF can be colored in a desired color. The color of the coloring film 932CF can be selected from red (R), green (G), blue (B), cyan (C), magenta (M), yellow (Y), and the like.

Materials described below can be used for the transistors, wirings, capacitors, and the like shown in FIG. 20 and FIG. 21.

A semiconductor film included in the transistor can be formed using a light-transmitting semiconductor material. Examples of the light-transmitting semiconductor material include a metal oxide and an oxide semiconductor. An oxide semiconductor preferably contains at least indium. In particular, indium and zinc are preferably contained. In addition to them, one or more kinds selected from aluminum, gallium, yttrium, copper, vanadium, beryllium, boron, silicon, titanium, iron, nickel, germanium, zirconium, molybdenum, lanthanum, cerium, neodymium, hafnium, tantalum, tungsten, magnesium, and the like may be contained.

A conductive film included in the transistor can be formed using a light-transmitting conductive material. The light-transmitting conductive material preferably contains one or more kinds selected from indium, zinc, and tin. Specific examples include an In oxide, an In—Sn oxide (also referred to as ITO: Indium Tin Oxide), an In—Zn oxide, an In—W oxide, an In—W—Zn oxide, an In—Ti oxide, an In—Sn—Ti oxide, an In—Sn—Si oxide, a Zn oxide, and a Ga—Zn oxide.

An oxide semiconductor that contains an impurity element or the like to have reduced resistance may be used for the conductive film included in the transistor. The oxide semiconductor with the reduced resistance can be regarded as an oxide conductor (OC).

For example, to form an oxide conductor, oxygen vacancies are formed in an oxide semiconductor and then hydrogen is added to the oxygen vacancies, so that a donor level is formed in the vicinity of the conduction band. The oxide semiconductor in which the donor level is formed has increased conductivity and becomes a conductor.

Note that an oxide semiconductor has a large energy gap (e.g., an energy gap is 2.5 eV or more), and thus has a visible-light-transmitting property. An oxide conductor is an oxide semiconductor having a donor level in the vicinity of the conduction band, as described above. Therefore, an oxide conductor has a small influence of absorption due to the donor level and has a visible-light-transmitting property almost equivalent to that of an oxide semiconductor.

The oxide conductor preferably contains one or more kinds of metal elements contained in the semiconductor film included in the transistor. When the oxide semiconductors containing the same metal element are used for two or more layers included in the transistor, the same manufacturing apparatus (e.g., deposition apparatus or processing apparatus) can be used in two or more steps and manufacturing costs can thus be reduced.

The structures of the pixel included in the display device described in this embodiment enables efficient use of light emitted from one or both of the light-emitting element and the backlight unit. Thus, an excellent display device with reduced power consumption can be provided.

At least part of this embodiment can be implemented in combination with the other embodiments described in this specification as appropriate.

Embodiment 5

In this embodiment, a display module and electronic devices, each of which includes a semiconductor device of one embodiment of the present invention, are described with reference to FIG. 22 to FIG. 24.

<5-1. Display Module>

In this embodiment, a display module that can be manufactured using one embodiment of the present invention is described.

Figure 22A:
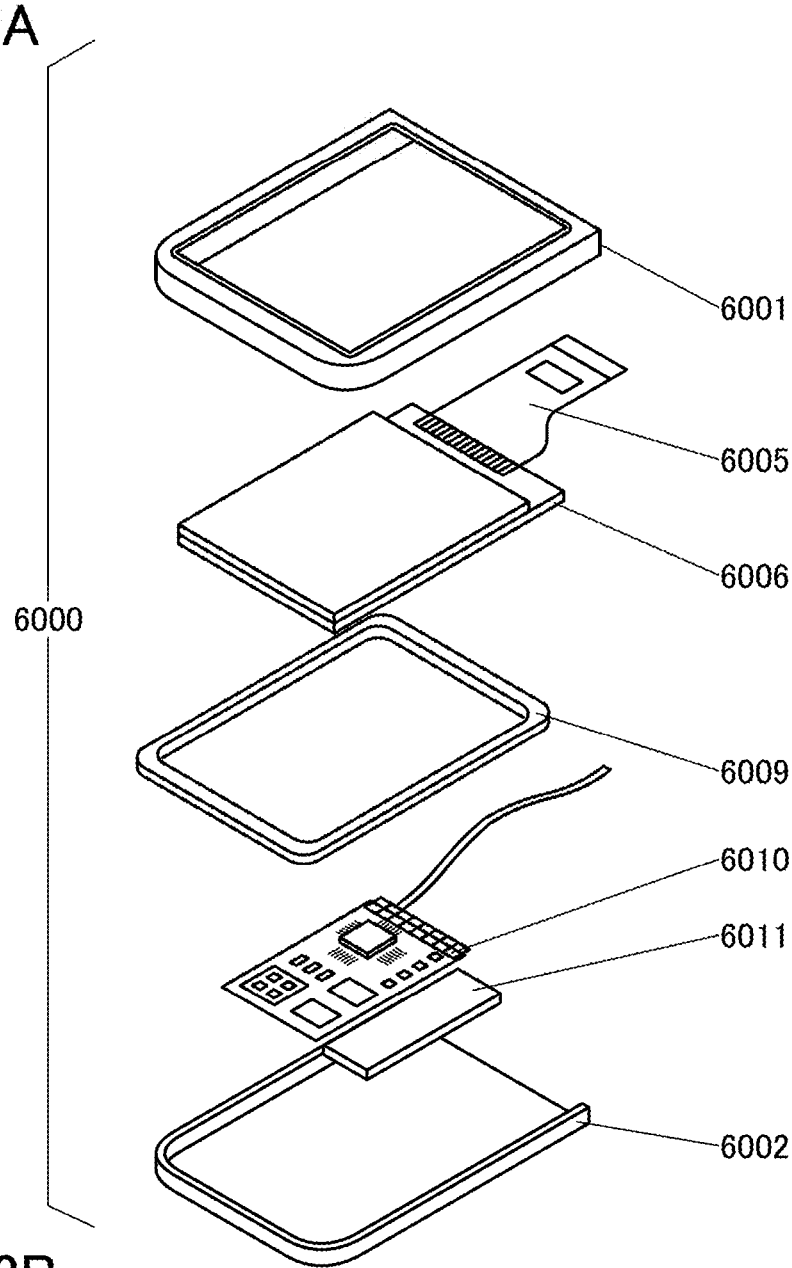
FIGS. 22A and 22B are diagrams illustrating a display module.

A display module 6000 shown in FIG. 22(A) includes a display panel 6006 connected to an FPC 6005, a frame 6009, a printed board 6010, and a battery 6011 between an upper cover 6001 and a lower cover 6002.

For example, the display device manufactured using one embodiment of the present invention can be used for the display panel 6006. Thus, the display module can be manufactured with high yield.

The shapes and sizes of the upper cover 6001 and the lower cover 6002 can be changed as appropriate in accordance with the size of the display panel 6006.

A touch panel may be provided to overlap with the display panel 6006. The touch panel can be a resistive or capacitive touch panel that overlaps with the display panel 6006. Instead of providing the touch panel, the display panel 6006 can have a touch panel function.

The frame 6009 has a function of protecting the display panel 6006 and functions as an electromagnetic shield for blocking electromagnetic waves generated by the operation of the printed board 6010. The frame 6009 may function as a radiator plate.

The printed board 6010 includes a power source circuit and a signal processing circuit for outputting a video signal and a clock signal. A power source for supplying electric power to the power source circuit may be an external commercial power source or the separately provided battery 6011. The battery 6011 can be omitted in the case where a commercial power source is used.

The display module 6000 may be additionally provided with a component such as a polarizing plate, a retardation plate, or a prism sheet.

Figure 22B:
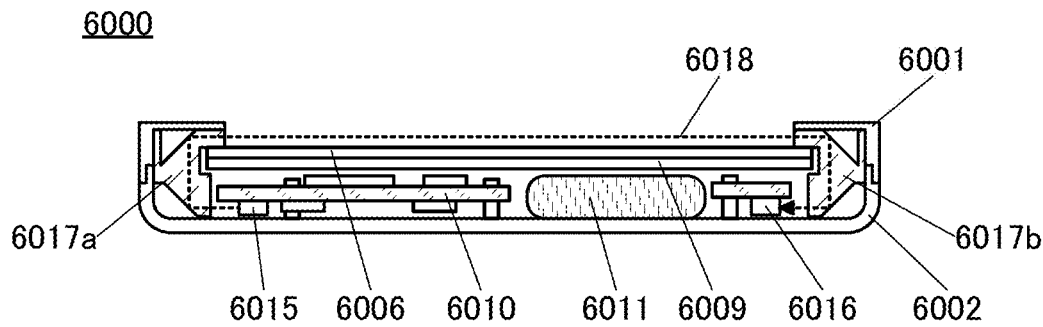

FIG. 22(B) is a schematic cross-sectional view of the display module 6000 with an optical touch sensor.

The display module 6000 includes a light-emitting portion 6015 and a light-receiving portion 6016 that are provided on the printed board 6010. A pair of light guide portions (a light guide portion 6017*a* and a light guide portion 6017*b*) are included in a region surrounded by the upper cover 6001 and the lower cover 6002.

A plastic or the like can be used for the upper cover 6001 and the lower cover 6002. The upper cover 6001 and the lower cover 6002 can each be thin (e.g., more than or equal to 0.5 mm and less than or equal to 5 mm). Therefore, the display module 6000 can be significantly lightweight. The upper cover 6001 and the lower cover 6002 can be manufactured with a small amount of material, and therefore, manufacturing costs can be reduced.

The display panel 6006 is provided to overlap with the printed board 6010 and the battery 6011 with the frame 6009 located therebetween. The display panel 6006 and the frame 6009 are fixed to the light guide portion 6017*a* and the light guide portion 6017*b*.

Light 6018 emitted from the light-emitting portion 6015 travels over the display panel 6006 through the light guide portion 6017*a* and reaches the light-receiving portion 6016 through the light guide portion 6017*b*. For example, blocking of the light 6018 by a sensing target such as a finger or a stylus can be detected as touch operation.

A plurality of light-emitting portions 6015 are provided along two adjacent sides of the display panel 6006, for example. A plurality of light-receiving portions 6016 are provided to face the light-emitting portions 6015. Accordingly, information about the position of touch operation can be obtained.

As the light-emitting portion 6015, a light source such as an LED element can be used. It is particularly preferable to use, as the light-emitting portion 6015, a light source that emits infrared light, which is not visually recognized by users and is harmless to users.

As the light-receiving portion 6016, a photoelectric element that receives light emitted from the light-emitting portion 6015 and converts it into an electrical signal can be used. A photodiode that can receive infrared light is suitably used.

For the light guide portion 6017*a* and the light guide portion 6017*b*, components that transmit at least the light 6018 can be used. With the use of the light guide portion 6017*a* and the light guide portion 6017*b*, the light-emitting portion 6015 and the light-receiving portion 6016 can be placed under the display panel 6006, and a malfunction of the touch sensor due to external light reaching the light-receiving portion 6016 can be suppressed. It is particularly preferable to use a resin that absorbs visible light and transmits infrared light. Thus, the malfunction of the touch sensor can be suppressed more effectively.

At least part of this embodiment can be implemented in combination with the other embodiments described in this specification as appropriate.

<5-2. Electronic Device 1>

Next, FIG. 23(A) to FIG. 23(E) show examples of electronic devices.

Figure 23A:
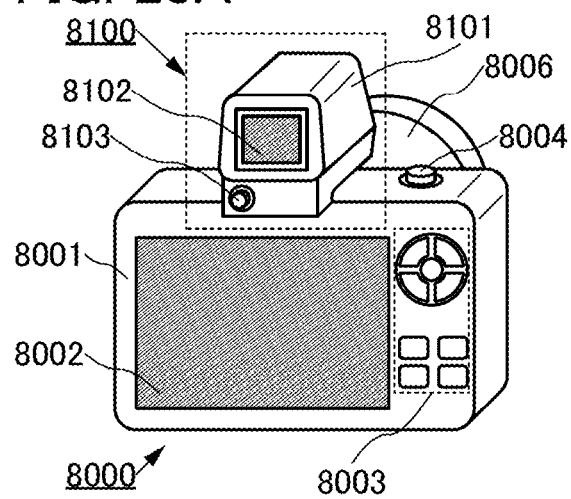
FIGS. 23A-23E are diagrams illustrating electronic devices.

FIG. 23(A) is an external view of a camera 8000 to which a finder 8100 is attached.

The camera 8000 includes a housing 8001, a display portion 8002, operation buttons 8003, a shutter button 8004, and the like. A detachable lens 8006 is attached to the camera 8000.

Although the lens 8006 of the camera 8000 here is detachable from the housing 8001 for replacement, the lens 8006 may be integrated with the housing.

The camera 8000 can take images at the press of the shutter button 8004. The display portion 8002 functions as a touch panel and images can also be taken at the touch of the display portion 8002.

The housing 8001 of the camera 8000 includes a mount including an electrode, so that the finder 8100, a stroboscope, or the like can be connected to the housing.

The finder 8100 includes a housing 8101, a display portion 8102, a button 8103, and the like.

The housing 8101 includes a mount for engagement with the mount of the camera 8000 so that the finder 8100 can be attached to the camera 8000. The mount includes an electrode, and a video or the like received from the camera 8000 through the electrode can be displayed on the display portion 8102.

The button 8103 serves as a power button. The on/off state of the display portion 8102 can be switched with the button 8103.

A display device of one embodiment of the present invention can be used in the display portion 8002 of the camera 8000 and the display portion 8102 of the finder 8100.

Note that although the camera 8000 and the finder 8100 are separate and detachable electronic devices in FIG. 23(A), a finder including a display device may be incorporated in the housing 8001 of the camera 8000.

Figure 23B:
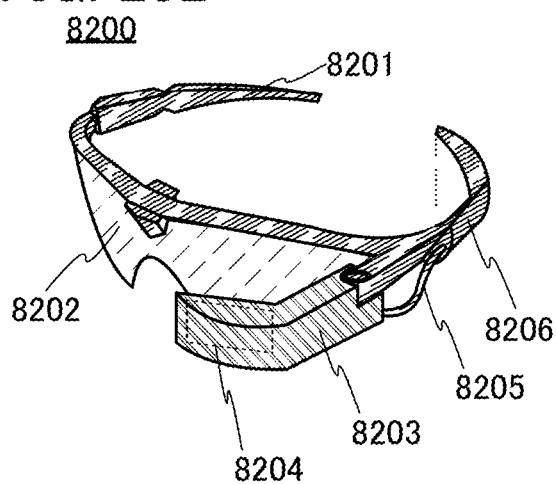

FIG. 23(B) is an external view of a head-mounted display 8200.

The head-mounted display 8200 includes a mounting portion 8201, a lens 8202, a main body 8203, a display portion 8204, a cable 8205, and the like. A battery 8206 is incorporated in the mounting portion 8201.

The cable 8205 supplies electric power from the battery 8206 to the main body 8203. The main body 8203 includes a wireless receiver or the like and can display received video information, such as image data, on the display portion 8204. The movement of the eyeball and the eyelid of a user is captured by a camera provided in the main body 8203 and then coordinates of the points the user looks at are calculated using the information to utilize the eye point of the user as an input means.

A plurality of electrodes may be provided in the mounting portion 8201 at a position in contact with the user. The main body 8203 may have a function of sensing current flowing through the electrodes with the movement of the user's eyeball to recognize the user's eye point. The main body 8203 may have a function of sensing current flowing through the electrodes to monitor the user's pulse. The mounting portion 8201 may include various sensors such as a temperature sensor, a pressure sensor, and an acceleration sensor to have a function of displaying the user's biological information on the display portion 8204. The main body 8203 may sense the movement of the user's head or the like to change a video displayed on the display portion 8204 in synchronization with the movement.

The display device of one embodiment of the present invention can be used in the display portion 8204.

Figure 23C:
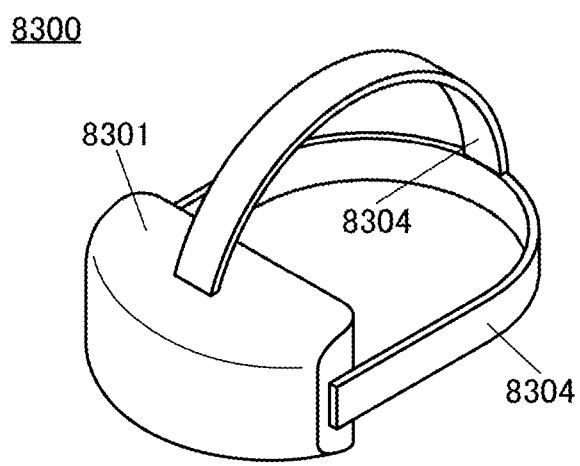
Figure 23D:
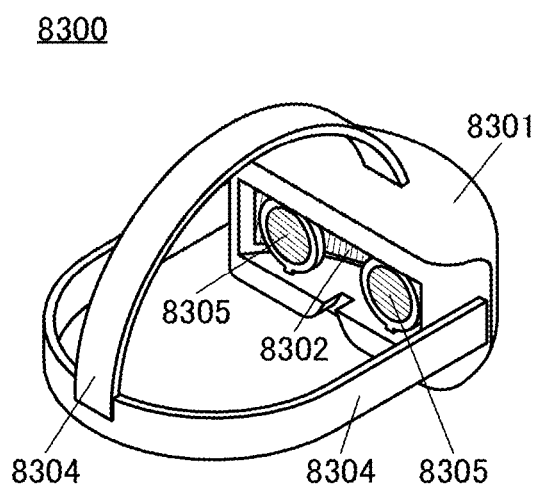
Figure 23E:
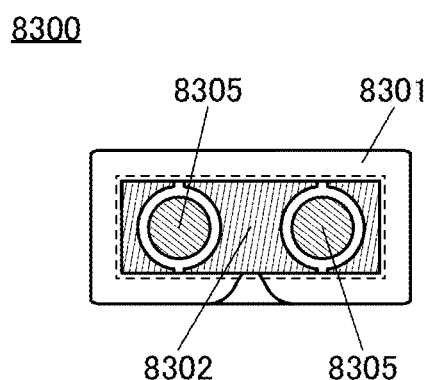

FIGS. 23(C), 23(D), and 23(E) are external views of a head-mounted display 8300. The head-mounted display 8300 includes a housing 8301, a display portion 8302, a band-shaped fixing unit 8304, and a pair of lenses 8305.

A user can see display on the display portion 8302 through the lenses 8305. Note that it is suitable that the display portion 8302 be curved and placed. When the display portion 8302 is curved and placed, a user can feel a high realistic sensation. Note that although the structure in which one display portion 8302 is provided is described in this embodiment as an example, the structure is not limited thereto, and two display portions 8302 may be provided. In that case, one display portion is placed for one eye of the user, so that three-dimensional display using parallax or the like is possible.

Note that the display device of one embodiment of the present invention can be used in the display portion 8302. The display device including the semiconductor device of one embodiment of the present invention has an extremely high resolution; thus, even when a video is magnified using the lenses 8305 as in FIG. 23(E), the user does not perceive pixels, and a more realistic video can be displayed.

<5-3. Electronic Device 2>

Next, FIG. 24(A) to FIG. 24(G) show examples of electronic devices that are different from the electronic devices shown in FIG. 23(A) to FIG. 23(E).

Electronic devices shown in FIG. 24(A) to FIG. 24(G) include a housing 9000, a display portion 9001, a speaker 9003, an operation key 9005 (including a power switch or an operation switch), a connection terminal 9006, a sensor 9007 (having a function of measuring force, displacement, position, speed, acceleration, angular velocity, rotational frequency, distance, light, liquid, magnetism, temperature, chemical substance, sound, time, hardness, electric field, current, voltage, electric power, radiation, flow rate, humidity, gradient, oscillation, odor, or infrared ray), a microphone 9008, and the like.

The electronic devices shown in FIG. 24(A) to FIG. 24(G) have a variety of functions. Examples include a function of displaying a variety of information (a still image, a moving image, a text image, and the like) on the display portion, a touch panel function, a function of displaying a calendar, date, time, and the like, a function of controlling processing with a variety of software (programs), a wireless communication function, a function of being connected to a variety of computer networks with a wireless communication function, a function of transmitting and receiving a variety of data with a wireless communication function, and a function of reading out a program or data stored in a memory medium and displaying it on the display portion. Note that functions of the electronic devices shown in FIG. 24(A) to FIG. 24(G) are not limited thereto, and the electronic devices can have a variety of functions. Although not illustrated in FIG. 24(A) to FIG. 24(G), the electronic devices may each include a plurality of display portions. The electronic devices may each include a camera and the like and have a function of taking a still image, a function of taking a moving image, a function of storing the taken image in a memory medium (external or incorporated in the camera), a function of displaying the taken image on the display portion, or the like.

The details of the electronic devices shown in FIG. 24(A) to FIG. 24(G) are described below.

Figure 24A:
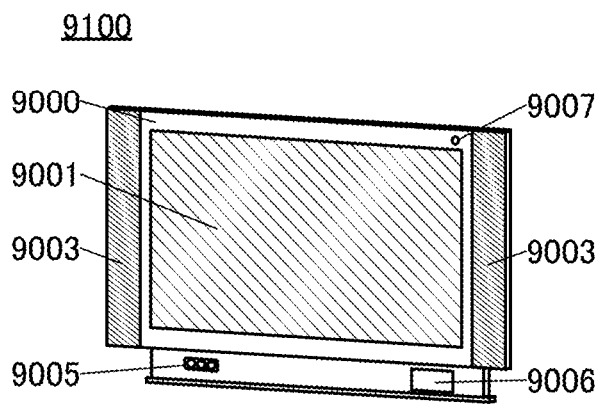
FIGS. 24A-24G are diagrams illustrating electronic devices.

FIG. 24(A) is a perspective view showing a television device 9100. The television device 9100 can include the display portion 9001 having a large screen size of, for example, 50 inches or more, or 100 inches or more.

Figure 24D:
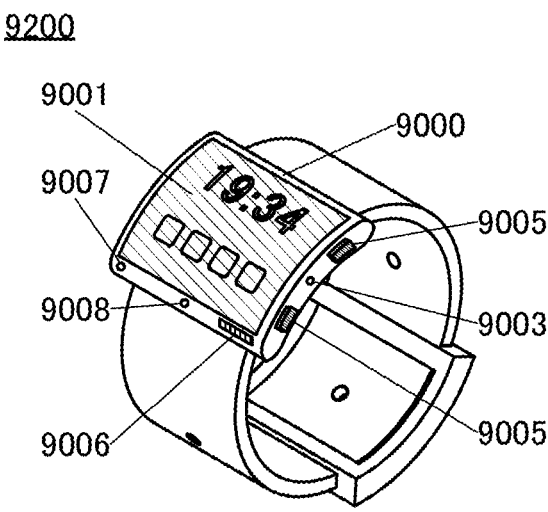
Figure 24B:
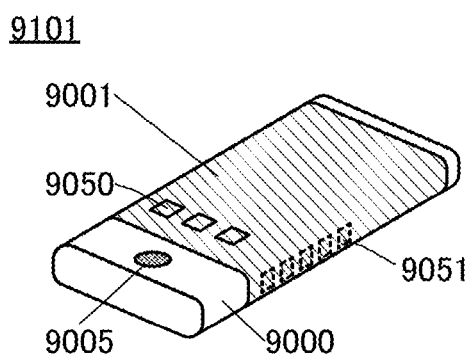

FIG. 24(B) is a perspective view showing a portable information terminal 9101. The portable information terminal 9101 functions as, for example, one or more selected from a telephone set, a notebook, an information browsing device, and the like. Specifically, the portable information terminal 9101 can be used as a smartphone. Note that the speaker, the connection terminal, the sensor, or the like may be provided in the portable information terminal 9101. The portable information terminal 9101 can display characters and image information on its plurality of surfaces. For example, three operation buttons 9050 (also referred to as operation icons, or simply as icons) can be displayed on one surface of the display portion 9001. Information 9051 indicated by dashed rectangles can be displayed on another surface of the display portion 9001. Note that examples of the information 9051 include display indicating reception of an e-mail, an SNS (social networking service), a telephone call, and the like, the title of an e-mail, an SNS, or the like, the sender of an e-mail, an SNS, or the like, date, time, remaining battery, and reception strength of an antenna. Alternatively, the operation buttons 9050 or the like may be displayed on the position where the information 9051 is displayed, in place of the information 9051.

Figure 24E:
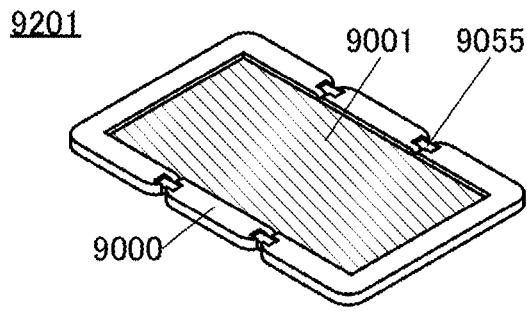
Figure 24C:
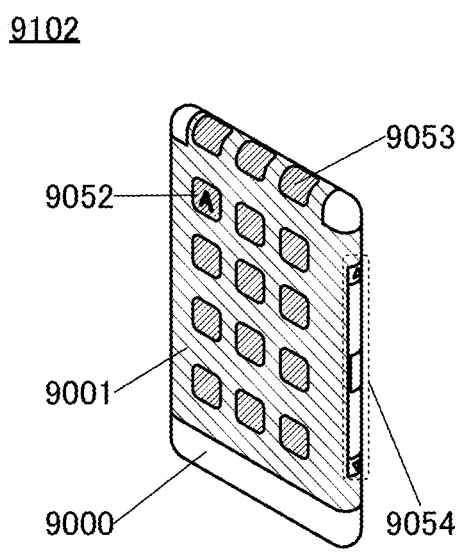

FIG. 24(C) is a perspective view showing a portable information terminal 9102. The portable information terminal 9102 has a function of displaying information on three or more surfaces of the display portion 9001. Here, an example in which information 9052, information 9053, and information 9054 are displayed on different surfaces is shown. For example, a user of the portable information terminal 9102 can see the display (here, the information 9053) with the portable information terminal 9102 put in a breast pocket of the clothes. Specifically, a caller's phone number, name, or the like of an incoming call is displayed in a position that can be seen from above the portable information terminal 9102. The user can see the display without taking out the portable information terminal 9102 from the pocket and decide whether to answer the call.

FIG. 24(D) is a perspective view showing a watch-type portable information terminal 9200. The portable information terminal 9200 is capable of executing a variety of applications such as mobile phone calls, e-mailing, reading and editing texts, music reproduction, Internet communication, and computer games. The display surface of the display portion 9001 is curved and provided, and display can be performed along the curved display surface. The portable information terminal 9200 can execute near field communication conformable to a communication standard. For example, hands-free calling can be achieved by mutual communication with a headset capable of wireless communication. The portable information terminal 9200 includes the connection terminal 9006, and data can be directly transmitted to and received from another information terminal via a connector. Power charging through the connection terminal 9006 is possible. Note that the charging operation may be performed by wireless power feeding without using the connection terminal 9006.

Figure 24F:
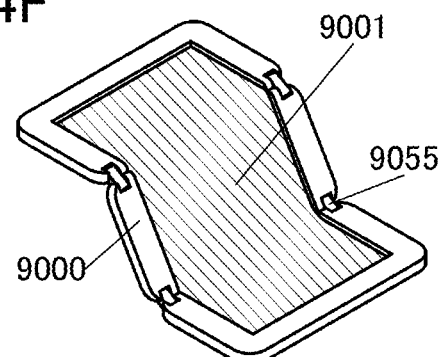
Figure 24G:
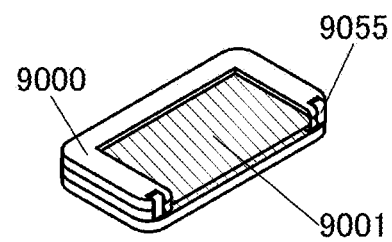

FIGS. 24(E), 24(F), and 24(G) are perspective views showing a foldable portable information terminal 9201. FIG. 24(E) is a perspective view of the portable information terminal 9201 in the opened state, FIG. 24(F) is a perspective view of the portable information terminal 9201 that is shifted from one of the opened state and the folded state to the other, and FIG. 24(G) is a perspective view of the portable information terminal 9201 in the folded state. The portable information terminal 9201 is highly portable in the folded state and is highly browsable in the opened state because of a seamless large display region. The display portion 9001 of the portable information terminal 9201 is supported by three housings 9000 joined by hinges 9055. By being folded at the hinges 9055 between two housings 9000, the portable information terminal 9201 can be reversibly changed in shape from the opened state to the folded state. For example, the portable information terminal 9201 can be bent with a radius of curvature of greater than or equal to 1 mm and less than or equal to 150 mm.

The electronic devices described in this embodiment are characterized by including the display portion for displaying some sort of information. Note that the semiconductor device of one embodiment of the present invention can also be used for an electronic device that does not include a display portion.

At least part of this embodiment can be implemented in combination with the other embodiments described in this specification as appropriate.

REFERENCE NUMERALS

001 region
002 region
003 region
100A transistor
100B transistor
100C transistor
100D transistor
100E transistor
100F transistor
102 substrate
104 conductive film
106 insulating film
108 metal oxide
108_1 metal oxide
108_1_0 metal oxide
108_2 metal oxide
108_2_0 metal oxide
108_3 metal oxide
112 conductive film
112*a* conductive film
112*a*_1 conductive film
112*a*_2 conductive film
112*a*_3 conductive film
112*b* conductive film
112*b*_1 conductive film
112*b*_2 conductive film
112*b*_3 conductive film
112*c* conductive film
113*a* insulating film
113*b* insulating film
115 insulating film
115_1 insulating film
115_2 insulating film
115_3 insulating film
116 insulating film
120 conductive film
120*a* conductive film
120*b* conductive film
151 opening
152*a* opening
152*b* opening
191 target
192 plasma
193 target
194 plasma
201 channel formation region
202A end region
202B end region
203A region
203B region
203C region
203D region
204A end portion
204B end portion
206 distance
207 distance
211 channel width
212 end portion width
700 display device
701 substrate
702 pixel portion
704 source driver circuit portion
705 substrate
706 gate driver circuit portion
708 FPC terminal portion
710 signal line
711 wiring portion
712 sealant
716 FPC
730 insulating film
732 sealing film
734 insulating film
736 coloring film
738 light-blocking film
750 transistor
752 transistor
760 connection electrode
770 planarization insulating film
772 conductive film
773 insulating film
774 conductive film
775 liquid crystal element
776 liquid crystal layer
778 structure body
780 anisotropic conductive film
782 light-emitting element
786 EL layer
788 conductive film
790 capacitor
791 touch panel
792 insulating film
793 electrode
794 electrode
795 insulating film
796 electrode
797 insulating film
900 pixel
900*s* light-blocking region
900*t* transmissive region
901 driver circuit portion
902 wiring
904 wiring
906 wiring
910 transistor
911 transistor
912 transistor
913 capacitor
914 transistor
915 capacitor
916B light-emitting region
916G light-emitting region 916R light-emitting region
918B display region
918G display region
918R display region
918W display region
930EL light-emitting element
930LC liquid crystal element
932CF coloring film
932BM light-blocking film
6000 display module
6001 upper cover
6002 lower cover
6005 FPC
6006 display panel
6009 frame
6010 printed board
6011 battery
6015 light-emitting portion
6016 light-receiving portion
6017a light guide portion
6017b light guide portion
6018 light
8000 camera
8001 housing
8002 display portion
8003 operation button
8004 shutter button
8006 lens
8100 finder
8101 housing
8102 display portion
8103 button
8200 head-mounted display
8201 mounting portion
8202 lens
8203 main body
8204 display portion
8205 cable
8206 battery
8300 head-mounted display
8301 housing
8302 display portion
8304 fixing unit
8305 lens
9000 housing
9001 display portion
9003 speaker
9005 operation key
9006 connection terminal
9007 sensor
9008 microphone
9050 operation button
9051 information
9052 information
9053 information
9054 information
9055 hinge
9100 television device
9101 portable information terminal
9102 portable information terminal
9200 portable information terminal
9201 portable information terminal

The invention claimed is:

1. A semiconductor device containing a metal oxide, the semiconductor device comprising:
a gate electrode;
a first insulating film over the gate electrode;
the metal oxide over the first insulating film;
a pair of electrodes over the metal oxide; and
a second insulating film over the metal oxide,
wherein each of the pair of electrodes comprises a narrow region and a wide region,
wherein the narrow region is narrower than the metal oxide in a channel width direction,
wherein the wide region is wider than the metal oxide in the channel width direction,
wherein both the narrow region and the wide region overlap with the metal oxide,
wherein the metal oxide comprises a source region, a drain region, a first region, a second region, and a third region,
wherein the source region is in contact with one of the pair of electrodes,
wherein the drain region is in contact with the other of the pair of electrodes,
wherein the first region, the second region, and the third region are each sandwiched between the source region and the drain region along a channel length direction,
wherein the second region is sandwiched between the first region and the third region along the channel width direction,
wherein the first region and the third region each include an end portion of the metal oxide, and
wherein the length of the second region along the channel length direction is less than the length of the first region or the length of the third region along the channel length direction.

2. The semiconductor device according to claim 1,
wherein the length of the second region along the channel length direction is greater than 0 μm and less than 4 μm, and
wherein the length of the first region or the length of the third region along the channel length direction is greater than three times the length of the second region along the channel length direction and less than the length of the metal oxide along the channel length direction.

3. The semiconductor device according to claim 1,
wherein the shortest path from the source region to the drain region is included in the second region.

4. The semiconductor device according to claim 1,
wherein the metal oxide contains a first metal oxide and a second metal oxide in contact with a top surface of the first metal oxide,
wherein the first metal oxide and the second metal oxide each contain In, an element M (M is gallium, aluminum, silicon, boron, yttrium, tin, copper, vanadium, beryllium, titanium, iron, nickel, germanium, zirconium, molybdenum, lanthanum, cerium, neodymium, hafnium, tantalum, tungsten, or magnesium), and Zn, and
wherein the first metal oxide includes a region having lower crystallinity than the second metal oxide.

5. The semiconductor device according to claim 4, wherein the first metal oxide and the second metal oxide each include a region where an In content is greater than or equal to 40% and less than or equal to 50% of the total number of In, M, and Zn atoms, and a region where an M content is greater than or equal to 5% and less than or equal to 30% of the total number of In, M, and Zn atoms.

6. The semiconductor device according to claim 4,
wherein in each of the first metal oxide and the second metal oxide, the atomic ratio of M is greater than or equal to 1.5 and less than or equal to 2.5, and the atomic ratio of Zn is greater than or equal to 2 and less than or equal to 4 in the case where the atomic ratio of In is 4.

7. The semiconductor device according to claim 4, wherein in each of the first metal oxide and the second metal oxide, the atomic ratio of M is greater than or equal to 0.5 and less than or equal to 1.5, and the atomic ratio of Zn is greater than or equal to 5 and less than or equal to 7 in the case where the atomic ratio of In is 5.

8. The semiconductor device according to claim 4, wherein a peak at around $2\theta=31°$ is not observed in the first metal oxide and a peak at around $2\theta=31°$ is observed in the second metal oxide in the case where the metal oxide is measured by XRD analysis.

* * * * *